United States Patent
Eto et al.

(10) Patent No.: US 6,512,717 B2
(45) Date of Patent: *Jan. 28, 2003

(54) SEMICONDUCTOR MEMORY DEVICE HAVING A RELAXED PITCH FOR SENSE AMPLIFIERS

(75) Inventors: Satoshi Eto, Kawasaki (JP); Masato Matsumiya, Kawasaki (JP); Shusaku Yamaguchi, Kawasaki (JP); Toshikazu Nakamura, Kawasaki (JP); Hideki Kano, Kawasaki (JP); Ayako Kitamoto, Kawasaki (JP); Mitsuhiro Higashiho, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/690,652

(22) Filed: Jul. 29, 1996

(65) Prior Publication Data

US 2002/0054525 A1 May 9, 2002

(30) Foreign Application Priority Data

Jan. 12, 1996 (JP) .............................................. 8-003502

(51) Int. Cl.[7] .................................................. G11C 8/00
(52) U.S. Cl. .................... 365/230.03; 365/201
(58) Field of Search ......................... 365/230.03, 189.05, 365/207, 208, 201

(56) References Cited

U.S. PATENT DOCUMENTS

| | | | | | |
|---|---|---|---|---|---|
| 5,280,448 A | * | 1/1994 | Watanabe | ............... | 365/230.03 |
| 5,357,478 A | * | 10/1994 | Kikuda | ................... | 365/230.03 |
| 5,428,575 A | * | 6/1995 | Fudeyasu | .................... | 365/201 |
| 5,440,523 A | * | 8/1995 | Joffe | ..................... | 365/230.05 |
| 5,506,815 A | * | 4/1996 | Hsieh | ..................... | 365/230.03 |
| 5,528,550 A | * | 6/1996 | Pawate | .................. | 365/230.03 |
| 5,553,026 A | * | 9/1996 | Nakai | .......................... | 365/201 |

FOREIGN PATENT DOCUMENTS

EP                0407173 A2 *   1/1991

* cited by examiner

Primary Examiner—Amir Zarabian
(74) Attorney, Agent, or Firm—Arent Fox Kintner Plotkin & Kahn, PLLC

(57) ABSTRACT

A semiconductor memory device includes a core area formed of memory blocks each having a relaxed sense amplifier arrangement, a data bus including data bus lines corresponding to the memory blocks, a plurality of input/output terminals provided in number corresponding to the data bus lines forming the data bus, and a data path switch circuit provided between the data bus the input/output terminals for providing interconnection paths between the input/output terminals and the data bus lines, wherein the data path switch circuit switches a part of the interconnection paths in response to a switch control signal such that the input/output terminals are connected respectively to predetermined memory cells located at respective, predetermined physical locations in any of the memory blocks.

15 Claims, 29 Drawing Sheets

US 6,512,717 B2

SEMICONDUCTOR MEMORY DEVICE HAVING A RELAXED PITCH FOR SENSE AMPLIFIERS

BACKGROUND OF THE INVENTION

The present invention generally relates to semiconductor devices and more particularly to a semiconductor memory device having a relaxed sense amplifier arrangement.

In semiconductor memory devices and integrated circuits, a typical example being a dynamic random access memory (DRAM), bit line pairs are disposed with ever decreasing mutual separation or pitch with the increase in the integration density. In relation to such a decrease in the pitch of the bit line pairs, there emerges a difficulty for laying out sense amplifiers with a pitch identical to the pitch of the bit line pairs.

In order to overcome the problem and to achieve a further increase of integration density, a so-called relaxed sense amplifier arrangement is proposed for the array of sense amplifiers.

FIG. 1 shows the overall construction of a DRAM that uses a relaxed sense amplifier arrangement.

Referring to FIG. 1, the DRAM includes a core area 1 that in turn includes arrays of memory cells referred to hereinafter as memory blocks, wherein each memory block includes an array of sense amplifiers. A part of the core area 1 is shown in detail in a plan view of FIG. 2. The memory blocks forming the core area 1 are selected by a block address signal such as block address signals BA0 and BA1.

Hereinafter, the construction of the core area 1 will be explained first with reference to FIG. 2.

Referring to FIG. 2, the core area 1 includes memory blocks A0 and A1, B0 and B1, C0 and C1, D0 and D1 each formed of a memory cell array, wherein the memory blocks A0 and A1 form together a memory block having a block address [00], the memory blocks B0 and B1 form together a memory block having a block address [01], the memory blocks C0 and C1 form together a memory block having a block address [01], and the memory blocks D0 and D1 form together a memory block having a block address [11].

Further, there is provided a sense amplifier array S00 in the core area 1, wherein the sense amplifier array S00 includes sense amplifiers corresponding to odd number bit line pairs extending in the memory block A0 such as the one formed of bit lines BL-A00 and /BL-A00.

Similarly, there is provided a sense amplifier array S01 including sense amplifiers that correspond to even number bit line pairs in the memory blocks A0 and B0, such as the bit line pair formed of bit lines BL-A01 and /BL-A01 or the bit line pair formed of bit lines BL-B01 and /BL-B01.

Further, there is provided a sense amplifier array S10 including sense amplifiers that correspond to odd number bit line pairs in the memory blocks B0 and C0, such as the bit line pair formed of bit lines BL-B00 and /BL-B00 or the bit line pair formed of bit lines BL-C00 and /BL-C00.

Further, there is provided a sense amplifier array S11 including sense amplifiers that correspond to even number bit line pairs in the memory blocks C0 and D0, such as the bit line pair formed of bit lines BL-C01 and /BL-C01 or the bit line pair formed of bit lines BL-D01 and /BL-D01.

Further, there is provided a sense amplifier array S20 including sense amplifiers that correspond to odd number bit line pairs in the memory blocks D0 and A1, such as the bit line pair formed of bit lines BL-D00 and /BL-D00 or the bit line pair formed of bit lines BL-A10 and /BL-A10.

Further, there is provided a sense amplifier array S21 including sense amplifiers that correspond to even number bit line pairs in the memory blocks A1 and B1, such as the bit line pair formed of bit lines BL-A11 and /BL-A11 or the bit line pair formed of bit lines BL-B11 and /BL-B11.

Further, there is provided a sense amplifier array S30 including sense amplifiers that correspond to odd number bit line pairs in the memory blocks B1 and C1, such as the bit line pair formed of bit lines BL-B10 and /BL-B10 or the bit line pair formed of bit lines BL-C10 and /BL-C10.

Further, there is provided a sense amplifier array S31 including sense amplifiers that correspond to even number bit line pairs in the memory blocks C1 and D1, such as the bit line pair formed of bit lines BL-C11 and /BL-C11, or the bit line pair formed of bit lines BL-D11 and /BL-D11.

Further, there is provided a sense amplifier array S40 including sense amplifiers that correspond to odd number bit line pairs in the memory blocks D1, such as the bit line pair formed of bit lines BL-D10 and /BL-D10.

As the sense amplifiers corresponding only to the odd number bit line pairs or only to the even number bit line pairs are thus aligned in each of the sense amplifier arrays S00, S01, S10, S11, S20, S21, S30, S31 and S40 in such a DRAM having the relaxed sense amplifier arrangement, a sufficient mutual separation is secured between adjacent sense amplifiers in each of the sense amplifier arrays.

Further, the core area 1 includes data lines LDB00 and /LDB00 referred to hereinafter as local data bus, wherein the local data bus (LDB00, /LDB00) corresponds to the sense amplifier array S00 and is connected commonly to the odd number bit line pairs included in the memory block A0 such as the bit line pair (BL-A00, /BL-A00).

Similarly, there is provided a local data bus (LDB01, /LDB01) in correspondence to the sense amplifier array Sol such that the local data bus (LDB01, /LDB01) is connected commonly to the even number bit line pairs included in the memory blocks A0 and B0 such as the bit line pair (BL-A01, /BL-A01) or (BL-B01, /BL-B01).

Further, there is provided a local data bus (LDB10, /LDB10) in correspondence to the sense amplifier array S10 such that the local data bus (LDB10, /LDB10) is connected commonly to the odd number bit line pairs included in the memory blocks B0 and C0 such as the bit line pair (BL-B00, /BL-B00) or (BL-C00, /BL-C00).

Further, there is provided a local data bus (LDB11, /LDB11) in correspondence to the sense amplifier array S11 such that the local data bus (LDB11, /LDB11) is connected commonly to the even number bit line pairs included in the memory blocks C0 and D0 such as the bit line pair (BL-C01, /BL-C01) or (BL-D01, /BL-D01).

Further, there is provided a local data bus (LDB20, /LDB20) in correspondence to the sense amplifier array S20 such that the local data bus (LDB20, /LDB20) is connected commonly to the odd number bit line pairs included in the memory blocks D0 and A10 such as the bit line pair (BL-D00, /BL-D00) or (BL-A10, /BL-A10).

Further, there is provided a local data bus (LDB21, /LDB21) in correspondence to the sense amplifier array S21 such that the local data bus (LDB21, /LDB21) is connected commonly to the even number bit line pairs included in the memory blocks A1 and B1 such as the bit line pair (BL-A11, /BL-A11) or (BL-B11, /BL-B11).

Further, there is provided a local data bus (LDB30, /LDB30) in correspondence to the sense amplifier array S30 such that the local data bus (LDB30, /LDB30) is connected commonly to the odd number bit line pairs included in the memory blocks B1 and C1 such as the bit line pair (BL-B10, /BL-B10) or (BL-C10, /BL-C10).

Further, there is provided a local data bus (LDB31, /LDB31) in correspondence to the sense amplifier array S31 such that the local data bus (LDB31, /LDB31) is connected commonly to the even number bit line pairs included in the memory blocks C1 and D1 such as the bit line pair (BL-C11, /BL-C11) or (BL-D11, /BL-D11).

Further, there is provided a local data bus (LDB40, /LDB40) in correspondence to the sense amplifier array S40 such that the local data bus (LDB40, /LDB40) is connected commonly to the odd number bit line pairs included in the memory block D1 such as the bit line pair (BL-D10, /BL-D10).

FIG. 3 shows a part of the memory blocks A0 and B0 as well as a part of the sense amplifier array S01, wherein it will be noted that the memory block A0 further includes word lines WL-A00 and WL-A01 extending perpendicularly to bit lines such as BL-A02 and /BL-A02, BL-A03 and /BL-A03, . . . , wherein the word lines are used for selecting a memory cell in the memory cell array as usual. Similarly, the memory block B0 includes word lines WL-B00 and WL-B01 extending perpendicularly to bit lines BL-B02 and /BL-B02, BL-B03 and /BL-B03, . . . . It should be noted that each of the bit lines BL-A02 and /BL-A02, BL-A03 and /BL-A03, . . or bit lines BL-B02 and /BL-B02, BL-B03 and /BL-B03, . . . are connected to a series of memory cells including memory cells 3–18 and forms a data transfer path.

FIG. 4 shows the construction of a memory cell such as the memory cell 3. As usual, the memory cell includes a cell capacitor 20 for storing information in the form of electric charges and a cell transistor for charging and discharging the cell capacitor 20, wherein a cell place voltage VCP is applied to the cell capacitor 20. The other memory cells 4–18 have the same construction.

FIG. 3 further shows bit line precharging circuits (PR) P-A02, P-A03, P-A04, P-A05, P-B02, P-B03, P-B04 and P-B05 connected respectively to the bit line pairs (BL-A02, /BL-A02), (BL-A03, /BL-A03), (BL-A04, /BL-A04), (BL-A05, /BL-A05), (BL-B02, /BL-B02), (BL-B03, /BL-B03), (BL-B04, /BL-B04) and (BL-B05, /BL-B05), wherein the detailed construction of the precharging circuit P-A02 is represented in FIG. 5. It should be noted that the other precharging circuits P-A03, P-A04, P-A05, P-B02, P-B03, P-B04 and P-B05 have the same construction.

Referring to FIG. 5, the bit line precharging circuit P-A02 includes a precharging line 23 carrying a bit line precharging voltage VPR, a signal line 24 carrying a bit line precharging signal φPR, and n-channel MOS transistors 25, 26 and 27 connected across the bit lines BL-A02 and /BL-A02, wherein the MOS transistors 25, 26 and 27 are turned ON and turned OFF in response to the bit line precharging signal φPR on the line 24.

FIG. 3 further shows a line 29 carrying a bit line transfer signal BT-A0 and transfer circuits B-A03 and B-A05 cooperating with the line 29, wherein the bit line transfer circuits B-A03 and B-A05 include n-channel MOS transistors 30–33 that are turned ON and turned OFF in response to the bit line transfer signal BT-A0 on the line 29.

Similarly, FIG. 3 further shows a line 34 carrying a bit line transfer signal BT-B0 and transfer circuits B-B03 and B-B05 cooperating with the line 34, wherein the bit line transfer circuits B-B03 and B-B05 include n-channel MOS transistors 35–38 that are turned ON and turned OFF in response to the bit line transfer signal BT-B0 on the line 34.

FIG. 3 further shows sense amplifiers 39 and 40 respectively cooperating with the transfer circuits B-A03 and B-A04 having a construction represented in detail in FIG. 6.

Referring to FIG. 6, the sense amplifier 39 or 40 includes a power line 42 for supplying a voltage Vii produced by decreasing the supply voltage Vcc of 5 volts to 3 volts, for example. The sense amplifier 39 further includes a signal line 43 for carrying a latch enable signal /LE and a p-channel MOS transistor 44 that is turned ON and turned OFF in response to the latch enable signal /LE.

Further, the sense amplifier 39 includes another power line 45 for supplying a supply voltage Vss typically of 0 volt, a signal line 46 for carrying a latch enable signal LE that is a logic inversion of the signal /LE, and a n-channel MOS transistor 47 that is turned ON and turned OFF in response to the latch enable signal LE.

Further, the sense amplifier 39 includes a flip-flop circuit 48 formed of p-channel MOS transistors 49 and 50 and n-channel MOS transistors 51 and 52, wherein the p-channel MOS transistors 49 and 50 act as a pull-up transistor while the n-channel MOS transistors 51 and 52 act as a pull-down transistor, as usual in a flip-flop circuit.

FIG. 3 further shows column gates 54 and 55 respectively cooperating with the sense amplifier 39 and 40, wherein the column gate 54 includes n-channel MOS transistors 56 and 57 that are turned ON and turned OFF in response to a column select signal CL3 supplied commonly to the gates of the transistors 56 and 57. Similarly, the column gate 55 includes n-channel MOS transistors 58 and 59 that are turned ON and OFF in response to a column select signal CL5 supplied commonly to the gates of the transistors 58 and 59.

Referring back now to FIG. 2, the core area 1 further includes data lines connected commonly to the local data buses (LDB00, /LDB00), (LDB10, /LDB10), (LDB40, /LDB40) and forming a global data bus (GDB00, /GDB00).

Similarly, the core area 1 includes data lines connected commonly to the local data buses (LDB01, /LDB01) and (LDB11, /LDB11) and forming a global data bus (GDB01, /GDB01).

Further, the core area 1 includes data lines connected commonly to the local data buses (LDB20, /LDB20) and (LDB30, /LDB30) and forming a global data bus (GDB10, /GDB10).

Further, the core area 1 includes data lines connected commonly to the local data buses (LDB21, /LDB21) and (LDB31, /LDB31) and forming a global data bus (GDB11, /GDB11).

In addition, the core area 1 of FIG. 2 shows a hierarchical data bus switch P00 connecting the local data bus LDB00 to the global data bus GDB00 and a hierarchical data bus switch Q00 connecting the local data bus /LDB00 to the global data bus /GDB00.

Further, the core area 1 includes a hierarchical data bus switch P01 connecting the local data bus LDB01 to the global data bus GDB01 and a hierarchical data bus switch Q01 connecting the local data bus /LDB01 to the global data bus /GDB01.

Further, the core area 1 includes a hierarchical data bus switch P10 connecting the local data bus LDB10 to the global data bus GDB00 and a hierarchical data bus switch Q10 connecting the local data bus /LDB10 to the global data bus /GDB00.

Further, the core area 1 includes a hierarchical data bus switch P11 connecting the local data bus LDB11 to the global data bus GDB01 and a hierarchical data bus switch Q11 connecting the local data bus /LDB11 to the global data bus /GDB01.

Further, the core area 1 includes a hierarchical data bus switch P20 connecting the local data bus LDB20 to the global data bus GDB10 and a hierarchical data bus switch Q20 connecting the local data bus /LDB20 to the global data bus /GDB10.

Further, the core area 1 includes a hierarchical data bus switch P21 connecting the local data bus LDB21 to the global data bus GDB11 and a hierarchical data bus switch Q21 connecting the local data bus /LDB21 to the global data bus /GDB11.

Further, the core area 1 includes a hierarchical data bus switch P30 connecting the local data bus LDB30 to the global data bus GDB10 and a hierarchical data bus switch Q30 connecting the local data bus /LDB30 to the global data bus /GDB10.

Further, the core area 1 includes a hierarchical data bus switch P31 connecting the local data bus LDB31 to the global data bus GDB11 and a hierarchical data bus switch Q31 connecting the local data bus /LDB31 to the global data bus /GDB11.

Further, the core area 1 includes a hierarchical data bus switch P40 connecting the local data bus LDB40 to the global data bus GDB00 and a hierarchical data bus switch Q40 connecting the local data bus /LDB40 to the global data bus /GDB00.

As represented in FIG. 7, the hierarchical data bus switches P00, Q00, P01, Q01. P10, Q10, P11, Q11, P20, Q20, P21, Q21, P30, Q30, P31, Q31, P40 and Q40 are formed of respective n-channel MOS transistors, wherein the MOS transistors forming the hierarchical bus switches P00 and Q00 are controlled by a control signal S00, the MOS transistors forming the hierarchical bus switches P01 and Q01 are controlled by a control signal S01, the MOS transistors forming the hierarchical bus switches P10 and Q10 are controlled by a control signal S10, the MOS transistors forming the hierarchical bus switches P11 and Q11 are controlled by a control signal S11, the MOS transistors forming the hierarchical bus switches P20 and Q20 are controlled by a control signal S20, the MOS transistors forming the hierarchical bus switches P21 and Q21 are controlled by a control signal S21, the MOS transistors forming the hierarchical bus switches P30 and Q30 are controlled by a control signal S30, the MOS transistors forming the hierarchical bus switches P31 and Q31 are controlled by a control signal S31, and the MOS transistors forming the hierarchical bus switches P40 and Q40 are controlled by a control signal S40.

Referring now back to FIG. 1, the DRAM further includes, in addition to the foregoing core area 1, a read/write circuit 61 that in turn includes an array of sense buffer circuits (SB) for reading the data by amplifying the voltage appearing across the data lines forming the global data bus and an array of write amplifiers (WA) for writing data by applying a voltage across the data lines forming the global data bus.

More specifically, the read/write circuit 61 includes a sense buffer 62 connected to the global data bus (GDB00, /GDB00), a sense buffer 63 connected to the global data bus (GDB01, /GDB01), a sense buffer 64 connected to the global data bus (GDB10, /GDB10), and a sense buffer 65 connected to the global data bus (GDB11, /GDB11). Further, the circuit 61 includes a write amplifier 66 connected to the global data bus (GDB00, /GDB00), a write buffer 67 connected to the global data bus (GDB01, /GDB01), a write amplifier 68 connected to the global data bus (GDB10, /GDB10), and a write buffer 69 connected to the global data bus (GDB11, /GDB11).

Further, the DRAM of FIG. 1 includes an input/output circuit 70 cooperating with the foregoing read/write circuit 61, wherein the input/output circuit 70 includes a data output buffer (DOB) 71 provided in correspondence to the sense buffer circuit 62, a data output buffer 72 provided in correspondence to the sense buffer circuit 63, a data output buffer 73 provided in correspondence to the sense buffer circuit 64, and a data output buffer 74 provided in correspondence to the sense buffer circuit 65.

Further, the input/output circuit 70 includes a data input buffer (DIB) 75 provided in correspondence to the write amplifier 66, a data input buffer 76 provided in correspondence to the write amplifier 67, a data input buffer 77 provided in correspondence to the write amplifier 68, and a data input buffer 78 provided in correspondence to the write amplifier 69.

Further, an input/output terminal 79 is provided in correspondence to the data output buffer 71 and the data input buffer 75, an input/output terminal 80 is provided in correspondence to the data output buffer 72 and the data input buffer 76, an input/output terminal 81 is provided in correspondence to the data output buffer 73 and the data input buffer 77, and an input/output terminal 82 is provided in correspondence to the data output buffer 74 and the data input buffer 78. In FIG. 1, DQ0, DQ1, DQ2 and DQ3 designate the write data or read data appearing at the foregoing terminals 79–82.

FIG. 8 shows the construction of the sense buffer 62, wherein it should be noted that the other sense buffers 63–65 have the same construction.

Referring to FIG. 8, it will be noted that the sense buffer 62 forms a differential amplifier amplifying the voltage appearing across the lines forming the global data bus (GDB00, /GDB00) and includes p-channel MOS transistors 85–96 and n-channel MOS transistors 97–106 forming together a current mirror circuit, wherein the transistors 101–106 are turned on in response to an enable signal SBE.

Further, the sense buffer 62 of FIG. 8 includes a flip-flop circuit 107 for latching the output of the differential amplifier 84, wherein the flip-flop circuit 107 includes p-channel MOS transistors 108 and 109, NAND gates 110 and 111 and an inverter 112.

Further, the sense buffer 62 cooperates with an output control circuit 113, wherein the circuit 113 in turn includes inverters 114 and 115 connected in series to a NAND gate 116, wherein the output of the sense buffer 62 is supplied to one of the input terminals of the NAND gate 116, while the other input terminal of the NAND gate 116 is supplied with a CAS (column address strobe) enable signal /CE. Thereby, the output of the sense buffer 62 is obtained at the output terminal of the inverter 115 as a signal D62.

When the circuits related to the CAS signal, or CAS system, is to be deactivated, the CAS enable signal /CE is set high (referred to hereinafter as "H"). Thereby, the output of the inverter 114 goes low (referred to hereinafter as "L"), and the output of the NAND circuit 116 is held at the level H. Thereby, the output data D62 of the sense buffer 62 is set to the level L.

When the CAS system is to be activated, on the other hand, the CAS enable signal /CE is set to the level L and the output of the inverter 114 goes high to the level H. Thereby, the NAND gate 116 acts as an inverter and inverts the output logic level of the flip-flop circuit 107.

When it is necessary to deactivate the sense buffer 62 in the state that the enable signal /CE is low, the level of the enable signal SBE is set to L. Thereby, the p-channel MOS transistors 89 and 90 are all turned on and the n-channel MOS transistors 101–106 are all turned OFF. As a result, the differential amplifier 84 is deactivated. Further, the p-channel MOS transistors 108 and 109 are turned ON, and the flip-flop circuit 107 does not change the output state thereof.

On the other hand, when it is necessary to activate the sense buffer 62 in the state that the /CE signal is low, the enable signal SBE is set to the level H. As a result, the p-channel MOS transistors 89 and 90 are turned OFF and the n-channel MOS transistors 101–106 are all turned ON. Thereby, the differential amplifier 84 is activated and the p-channel MOS transistors 108 and 109 are turned OFF. In this state, the flip-flop circuit 107 latches the output of the differential amplifier 84.

In the case in which the level of the global bus data line GDB00 is high and the level of the global data bus line /GDB00 is low, for example, it will be noted that a node N1 of FIG. 8 assumes a high level, a node N2 assumes a low level, a node N3 assumes a low level and a node N4 assumes a high level.

As a result of this, the NAND circuit 111 produces a low level output, while the low level output of the NAND circuit 111 causes the inverter 112 to produce a high level output. Thereby, the high level output of the inverter 112 is forwarded to the inverter 115 via the NAND gate 116, wherein the inverter 115 produces a high level output as the output data D62 of the sense buffer circuit 62.

When the level of the global bus data line GDB00 is low and the level of the global data bus line /GDB00 is high, on the other hand, the node N1 assumes a low level, the node N2 assumes a high level, a node N3 assumes a high level and a node N4 assumes a low level.

As a result of this, the NAND circuit 111 produces a high level output, while the high level output of the NAND circuit 111 causes the inverter 112 to produce a low level output. Thereby, the low level output of the inverter 112 is forwarded to the inverter 115 via the NAND gate 116, wherein the inverter 115 produces a low level output as the output data D62 of the sense buffer circuit 62.

FIG. 9 shows the construction of the data output buffer 71, wherein it should be noted that other buffer circuits 72–74 have the same construction.

Referring to FIG. 9, the data output buffer 71 includes inverters 118–121, NAND gates 122 and 123, p-channel MOS transistors 124–134, n-channel MOS transistors 135–143, and MOS capacitors 144 and 145, wherein a start-up control signal /STT is supplied to the inverter 121 at the time of starting up of the DRAM operation. Further, the data output buffer 71 is supplied with an output enable signal OE.

After the operation of the DRAM has started, the control signal /STT is set to have a low level, and the inverter 121 produces a high level output in response thereto. Thereby, the inverter 119 and the NAND circuit 122 form together a latch circuit once the operation of the DRAM has started. Similarly, the inverter 120 and the NAND circuit 123 form together a latch circuit.

In order to deactivate the data output buffer 71 in the operational state of the DRAM, the output enable signal OE is set to have a low level state such that the n-channel MOS transistors 135 and 139 are all turned OFF and the p-channel MOS transistors 125 and 131 are all turned ON.

As a result of this, the inverter 119 produces a low level output, and a node N5 assumes a low level state and a node N6 assumes a high level state in response thereto. Thereby, the p-channel MOS transistor 129 is turned OFF. Further, in response to the low level state of the output enable signal OE, a node N7 assumes a high level state and a node N8 assumes a low level state. Thereby, the n-channel MOS transistor 143 is turned OFF, and the data buffer circuit 71 assumes a high impedance state at the output terminal 79.

When to activate the data output buffer 71, on the other hand, the output enable signal OE is set to have a high level state such that the n-channel MOS transistors 135 and 139 are turned ON. At the same time, the p-channel MOS transistors 125 and 131 are turned OFF.

In the event the output D62 of the sense buffer 62 has a high level state, the inverter 118 produces a low level output and the inverter 119 assumes a high level state. Thereby, the node N5 assumes a high level state, the node N6 assumes a low level state, the p-channel MOS transistor 129 is turned ON, the inverter 120 produces a low level output, the node N7 assumes a high level output, and the node N8 assumes a low level output. Thus, the n-channel MOS transistor 143 is turned OFF and a high level state appears at the output terminal 79 as the output data DQ0.

When the output D62 of the sense buffer 62 has a low level state, on the other hand, the inverters 118 and 119 produces respectively a high level output and a low level output. Thereby, the node N5 assumes a low level state, the node N6 assumes a high level state , the p-channel MOS transistor 129 is turned OFF, the inverter 120 produces a high level output, the node N7 assumes a low level output, and the node N8 assumes a high level output. Thus, the n-channel MOS transistor 143 is turned ON and a low level state appears at the output terminal 79 as the output data DQ0.

FIG. 10 shows the construction of the data input buffer 75, wherein it should be noted that the other data input buffers 76–78 have the same construction.

Referring to FIG. 10, the data input buffer 75 includes an input circuit 146 that in turn includes p-channel MOS transistors 147–152, n-channel MOS transistors 153–158, inverters 159 and 160 and a NAND circuit 161. The data input buffer circuit 75 is thereby supplied with a write enable signal /WE and produces output data D75 at an output terminal.

In FIG. 10, it will be noted that the data input buffer 75 further includes an input control circuit 162 that controls the operation of the input circuit 146. It should be noted that the input control circuit 162 includes inverters 163 and 164, p-channel MOS transistors 165 and 166 and n-channel MOS transistors 167 and 168, and is controlled by an input control signal /ASW.

When the control signal /ASW has a high level state, for example, the inverter 163 produces a low level output, the inverter 164 produces a high level output, and the control circuit 162 produces a high level output.

As a result of this, the p-channel MOS transistor 147 and the n-channel MOS transistor 154 both forming the input circuit 146 are respectively turned OFF and turned ON, and the inverter circuit formed of the p-channel MOS transistors 147 and 148 and the n-channel MOS transistor 153 is deactivated. Further, the level of a node is set to a low level, and the transfer of the input data DQ0 at the node 79 to the NAND gate 161 is prohibited.

When the level of the input control signal /ASW is set to the low level state L, on the other hand, the inverter 163 produces a high level output, the inverter 164 produces a low level output, and the input control circuit 162 produces a low level output.

When the output of the control circuit 162 is low as such, the p-channel MOS transistor 147 is turned ON and the n-channel MOS transistor 154 is turned OFF. Thereby, the node N9 assumes a level that is a logic inversion of the input data DQ0.

When the write enable signal /WE goes high in this state, the n-channel MOS transistor 156 is turned ON and the p-channel MOS transistor 151 is turned OFF. Further, the output of the inverter 159 goes low, the p-channel MOS transistor 149 is turned ON, and the n-channel MOS transistor 158 is turned OFF. Thereby, the output of the NAND gate 161, in other words the output D75 of the buffer 75 is held at a high level state.

When the write enable signal /WE goes low in this state, the n-channel MOS transistor 156 is turned OFF, the p-channel MOS transistor 151 is turned ON, the inverter 159 produces a high level output, the p-channel MOS transistor 149 is turned OFF, and the n-channel MOS transistor 158 is turned ON.

As a result, an inverter circuit, formed of the inverter 160, the p-channel MOS transistors 151 and 152 and the n-channel MOS transistors 157 and 158, operates as a latch circuit and latches the data that is outputted by an inverter circuit formed of the p-channel MOS transistors 149 and 159 and the n-channel MOS transistors 155 and 156.

In this operation, it should be noted that the NAND circuit 161 operates, in view of the high level output of the inverter 159, as an inverter for inverting the logic level of the output of the inverter 160.

In the foregoing operation, it should also be noted that the inverter circuit formed of the inverter 160, the p-channel MOS transistors 151 and 152 and the n-channel MOS transistors 157 and 158, latches the data that is produced by the inverter circuit formed of the p-channel MOS transistors 149 and 150 and the n-channel MOS transistors 155 and 156.

Thus, in the case that the input data DQ0 has a high level state H, the node N9 assumes a low level state, the node N10 assumes a high level state and the inverter 160 produces a low level output. In this case, the output D75 of the data input buffer 75 assumes a high level state.

When the input data DQ0 has a low level state, on the other hand, the node N9 assumes a high level state, the node N10 assumes a low level state and the inverter 160 produces a high level output. Thereby, the output D75 of the data input buffer 75 assumes a low level state.

FIG. 11 shows the construction of the write amplifier 66, wherein it should be noted that the other write amplifiers 67–69 have the same construction.

Referring to FIG. 11, the write amplifier 66 includes inverters 171–176, analog switch circuits 177 and 178, p-channel MOS transistors 179 and 180, and n-channel MOS transistors 181 and 182.

In the case the write enable signal WE has a low level state L, the inverter 175 produces a high level output, the inverter 176 produces a low level output, and the analog switch circuits 177 and 178 are turned OFF.

When the write enable signal WE has a high level state H, the inverter 175 produces a low level output, the inverter 176 produces a high level output, and the analog switch circuits 177 and 178 are both turned ON.

Thus, when the output D75 of the data input buffer 75 has a high level state, it will be noted from FIG. 11 that the inverter 171 produces a low level output, the inverter 172 produces a high level output, the inverter 173 produces a low level output and the inverter 174 produces a high level output. Thereby, the data line GDB00 forming a global data bus assumes a high level state and the other data line /GDB00 also forming the same global data bus assumes a low level state.

When the output D75 of the data input buffer 75 has a low level state, on the other hand, the inverter 171 produces a high level output, the inverter 172 produces a low level output, the inverter 173 produces a high level output and the inverter 174 produces a low level output. Thereby, the data line GDB00 forming the global data bus has a low level state and the data line /GDB00 forming also the global data bus has a high level state.

In the conventional DRAM explained heretofore, it is assumed that the DRAM has a relaxed sense amplifier design as noted already.

In such a conventional DRAM having a relaxed sense amplifier arrangement, the control signals S00, S01, S20 and S21 are set to have a high level state and the control signals S10, S11, S30, S31 and S40 are set to have a low level state when selecting the memory blocks A0 and A1, see FIG. 2. In correspondence to this, the hierarchical data bus switches P00, Q00, P01, Q01, P20, Q20, P21 and Q21 are all turned ON and the hierarchical data bus switches P10, Q10, P11, Q11, P30, Q30, P31, Q31, P40 and Q40 are all turned OFF.

Thereby, the local data bus (LDB00, /LDB00) is connected to the global data bus (GDB00, /GDB00), the local data bus (LDB01, /LDB01) is connected to the global data bus (GDB01, /GDB01), the local data bus (LDB20, /LDB20) is connected to the global data bus (GDB10, /GDB10), and the local data bus (LDB21, /LDB21) is connected to the global data bus (GDB11, /GDB11).

In the reading operation, therefore, the data for a selected column, which is selected from the odd number memory cell columns of the memory cell block A0, is amplified by a corresponding sense amplifier included in the sense amplifier array S00 and is further transferred to the global data bus (GDB00, /GDB00) via the local data bus (LDB00, /LDB00).

Similarly, the data for a selected column, which is selected from the even number memory cell columns of the memory cell block A0, is amplified by a corresponding sense amplifier included in the sense amplifier array S01 and is further transferred to the global data bus (GDB01, /GDB01) via the local data bus (LDB01, /LDB01).

Further, the data for a selected column, which is selected from the odd number memory cell columns of the memory cell block A1, is amplified by a corresponding sense amplifier included in the sense amplifier array S20 and is further transferred to the global data bus (GDB10, /GDB10) via the local data bus (LDB20, /LDB20).

Further, the data for a selected column, which is selected from the even number memory cell columns of the memory cell block A1, is amplified by a corresponding sense amplifier included in the sense amplifier array S21 and is further transferred to the global data bus (GDB11, /GDB11) via the local data bus (LDB21, /LDB21).

TABLE I below summarizes, in the first row, the memory cell data obtained at the output terminals 79–82 for the case in which the memory blocks A0 and A1 are selected, wherein the data A0-0 represents the memory cell data read out from a memory cell column selected from odd number memory cell columns of the memory cell block A0 and amplified subsequently by a corresponding sense amplifier included in the sense amplifier array S00, the data A0-1 represents the memory cell data read out from a memory cell column selected from even number memory cell columns of the memory cell block A0 and amplified subsequently by a corresponding sense amplifier included in the sense amplifier array S01, the data A1-0 represents the memory cell data read out from a memory cell column selected from odd number memory cell columns of the memory cell block A1 and amplified subsequently by a corresponding sense amplifier included in the sense amplifier array S20, and the data A1-1 represents the memory cell data read out from a memory cell column selected from even number memory cell columns of the memory cell block A1 and amplified subsequently by a corresponding sense amplifier included in the sense amplifier array S21.

TABLE I

| SELECTED MEM BLK | DATA AT 79 | DATA AT 80 | DATA AT 81 | DATA AT 82 |
|---|---|---|---|---|
| A0, A1 | A0-0 | A0-1 | A1-0 | A1-1 |
| B0, B1 | B0-0 | B0-1 | B1-0 | B1-1 |
| C0, C1 | C0-0 | C0-1 | C1-0 | C1-1 |
| D0, D1 | D1-0 | D0-1 | D0-0 | D1-1 |

A similar relationship holds also between the input data DQ0–DQ3 supplied respectively to the input/output terminals 79–82 and the memory cell column into which the foregoing input data is written, as is represented in the first row of TABLE II below.

TABLE II

| SELECTED | INPUT DATA | | | |
|---|---|---|---|---|
| MEM BLK | DQ0 | DQ1 | DQ2 | DQ3 |
| A0, A1 | A0 odd | A0 even | A1 odd | A1 even |
| B0, B1 | B0 odd | B0 even | B1 odd | B1 even |
| C0, C1 | C0 odd | C0 even | C1 odd | C1 even |
| D0, D1 | D1 odd | D0 even | D0 odd | D1 even |

When selecting the memory blocks B0 and B1 in the foregoing conventional DRAM, the control signals S01, S10, S21 and S30 are set to have a high level state and the control signals S00, S11, S20, S31 and S40 are set to have a low level state. In correspondence to this, the hierarchical data bus switches P01, Q01, P10 Q10, P21, Q21, P30 and Q30 are all turned ON and the hierarchical data bus switches P00, Q00, P11, Q11, P20, Q20, P31, Q31, P40 and Q40 are all turned OFF.

Thereby, the local data bus (LDB01, /LDB01) is connected to the global data bus (GDB01, /GDB01), the local data bus (LDB10, /LDB10) is connected to the global data bus (GDB00, /GDB00), the local data bus (LDB21, /LDB21) is connected to the global data bus (GDB11, /GDB11), and the local data bus (LDB30, /LDB30) is connected to the global data bus (GDB10, /GDB10).

In the reading operation, therefore, the data for a selected column, which is selected from the odd number memory cell columns of the memory cell block B0, is amplified by a corresponding sense amplifier included in the sense amplifier array S10 and is further transferred to the global data bus (GDB00, /GDB00) via the local data bus (LDB10, /LDB10).

Similarly, the data for a selected column, which is selected from the even number memory cell columns of the memory cell block BC, is amplified by a corresponding sense amplifier included in the sense amplifier array S01 and is further transferred to the global data bus (GDB01, /GDB01) via the local data bus (LDB01, /LDB01).

Further, the data for a selected column, which is selected from the odd number memory cell columns of the memory cell block B1, is amplified by a corresponding sense amplifier included in the sense amplifier array S30 and is further transferred to the global data bus (GDB10, /GDB10) via the local data bus (LDB30, /LDB30).

Further, the data for a selected column, which is selected from the even number memory cell columns of the memory cell block B1, is amplified by a corresponding sense amplifier included in the sense amplifier array S21 and is further transferred to the global data bus (GDB11, /GDB11) via the local data bus (LDB21, /LDB21).

TABLE I, second row, also summarizes the memory cell data obtained at the output terminals 79–82 when the memory blocks B0 and B1 are selected, wherein the data B0-0 represents the memory cell data read out from a memory cell column selected from odd number memory cell columns of the memory cell block B0 and amplified subsequently by a corresponding sense amplifier included in the sense amplifier array S10, the data B0-1 represents the memory cell data read out from a memory cell column selected from even number memory cell columns of the memory cell block B0 and amplified subsequently by a corresponding sense amplifier included in the sense amplifier array S01, the data B1-0 represents the memory cell data read out from a memory cell column selected from odd number memory cell columns of the memory cell block B1 and amplified subsequently by a corresponding sense amplifier included in the sense amplifier array S30, and the data B1-1 represents the memory cell data read out from a memory cell column selected from even number memory cell columns of the memory cell block B1 and amplified subsequently by a corresponding sense amplifier included in the sense amplifier array S21.

A similar relationship holds also between the input data DQ0–DQ3 supplied respectively to the input/output terminals 79–82 and the memory cell column into which the foregoing input data is written, as is represented in the second row of TABLE II.

When selecting the memory blocks C0 and C1 in the foregoing conventional DRAM, the control signals S10, S11, S30 and S31 are set to have a high level state and the control signals S00, S01, S20, S21 and S40 are set to have a low level state. In correspondence to this, the hierarchical data bus switches P10, Q10, P11, Q11, P30, Q30, P31 and Q31 are all turned ON and the hierarchical data bus switches P00, Q00, P01, Q01, P20, Q20, P21, Q21, P40 and Q40 are all turned OFF.

Thereby, the local data bus (LDB10, /LDB10) is connected to the global data bus (GDB00, /GDB00), the local data bus (LDB11, /LDB11) is connected to the global data bus (GDB01, /GDB01), the local data bus (LDB30, /LDB30) is connected to the global data bus (GDB10, /GDB10), and the local data bus (LDB31, /LDB31) is connected to the global data bus (GDB11, /GDB11).

In the reading operation, therefore, the data for a selected column, which is selected from the odd number memory cell columns of the memory cell block C0, is amplified by a corresponding sense amplifier included in the sense amplifier array S10 and is further transferred to the global data bus (GDB00, /GDB00) via the local data bus (LDB10, /LDB10.

Similarly, the data for a selected column, which is selected from the even number memory cell columns of the memory cell block C0, is amplified by a corresponding sense amplifier included in the sense amplifier array S11 and is further transferred to the global data bus (GDB01, /GDB01) via the local data bus (LDB11, /LDB11).

Further, the data for a selected column, which is selected from the odd number memory cell columns of the memory cell block C1, is amplified by a corresponding sense amplifier included in the sense amplifier array S30 and is further transferred to the global data bus (GDB10, /GDB10) via the local data bus (LDB30, /LDB30).

Further, the data for a selected column, which is selected from the even number memory cell columns of the memory cell block C1, is amplified by a corresponding sense amplifier included in the sense amplifier array S31 and is further transferred to the global data bus (GDB11, /GDB11) via the local data bus (LDB31, /LDB31).

TABLE I, third row, also summarizes the memory cell data obtained at the output terminals 79–82 when the memory blocks C0 and C1 are selected, wherein the data C0-0 represents the memory cell data read out from a memory cell column selected from odd number memory cell columns of the memory cell block C0 and amplified subsequently by a corresponding sense amplifier included in the sense amplifier array S10, the data C0-1 represents the memory cell data read out from a memory cell column selected from even number memory cell columns of the memory cell block C0 and amplified subsequently by a corresponding sense amplifier included in the sense amplifier array S11, the data C1-0 represents the memory cell data read out from a memory cell column selected from odd number memory cell columns of the memory cell block C1 and amplified subsequently by a corresponding sense amplifier included in the sense amplifier array S30, and the data C1-1 represents the memory cell data read out from a memory cell column selected from even number memory cell columns of the memory cell block C1 and amplified subsequently by a corresponding sense amplifier included in the sense amplifier array S31.

A similar relationship holds also between the input data DQ0–DQ3 supplied respectively to the input/output terminals 79–82 and the memory cell column into which the foregoing input data is written, as is represented in the third row of TABLE II.

When selecting the memory blocks D0 and D1 in the foregoing conventional DRAM, the control signals S11, S20, S31 and S40 are set to have a high level state and the control signals S00, S01, S10, S21 and S30 are set to have a low level state. In correspondence to this, the hierarchical data bus switches P11, Q11, P20, Q20, P31, Q31, P40 and Q40 are all turned ON and the hierarchical data bus switches P00, Q00, P01, Q01, P10, Q10, P21, Q21, P30 and Q30 are all turned OFF.

Thereby, the local data bus (LDB11, /LDB11) is connected to the global data bus (GDB01, /GDB01), the local data bus (LDB20, /LDB20) is connected to the global data bus (GDB10, /GDB10), the local data bus (LDB31, /LDB31) is connected to the global data bus (GDB11, /GDB11), and the local data bus (LDB40, /LDB40) is connected to the global data bus (GDB00, /GDB00).

In the reading operation, therefore, the data for a selected column, which is selected from the odd number memory cell columns of the memory cell block D0, is amplified by a corresponding sense amplifier included in the sense amplifier array S20 and is further transferred to the global data bus (GDB10, /GDB10) via the local data bus (LDB20, /LDB20).

Similarly, the data for a selected column, which is selected from the even number memory cell columns of the memory cell block D0, is amplified by a corresponding sense amplifier included in the sense amplifier array S11 and is further transferred to the global data bus (GDB01, /GDB01) via the local data bus (LDB11, /LDB11).

Further, the data for a selected column, which is selected from the odd number memory cell columns of the memory cell block D1, is amplified by a corresponding sense amplifier included in the sense amplifier array S40 and is further transferred to the global data bus (GDB00, /GDB00) via the local data bus (LDB40, /LDB40).

Further, the data for a selected column, which is selected from the even number memory cell columns of the memory cell block D1, is amplified by a corresponding sense amplifier included in the sense amplifier array S31 and is further transferred to the global data bus (GDB11, /GDB11) via the local data bus (LDB31, /LDB31).

TABLE I, fourth row, also summarizes the memory cell data obtained at the output terminals 79–82 when the memory blocks D0 and D1 are selected, wherein the data D0-0 represents the memory cell data read out from a memory cell column selected from odd number memory cell columns of the memory cell block D0 and amplified subsequently by a corresponding sense amplifier included in the sense amplifier array S20, the data D0-1 represents the memory cell data read out from a memory cell column selected from even number memory cell columns of the memory cell block D0 and amplified subsequently by a corresponding sense amplifier included in the sense amplifier array S11, the data D1-0 represents the memory cell data read out from a memory cell column selected from odd number memory cell columns of the memory cell block D1 and amplified subsequently by a corresponding sense amplifier included in the sense amplifier array S40, and the data D1-1 represents the memory cell data read out from a memory cell column selected from even number memory cell columns of the memory cell block D1 and amplified subsequently by a corresponding sense amplifier included in the sense amplifier array S31.

A similar relationship holds also between the input data DQ0–DQ3 supplied respectively to the input/output terminals 79–82 and the memory cell column into which the foregoing input data is written, as is represented in the fourth row of TABLE II.

In the conventional DRAM of the foregoing type, it will thus be noted that the input/output terminals 79, 80, 81 and 82 produce respectively data X0-0, X0-1, X1-0 and X1-1 (X=A, B, C) when the memory blocks X0 and X1 are selected. As already noted, the data X0-0 represents the data read out from an odd number memory cell column of the memory block X0, the data X0-1 represents the data read out from an even number memory cell column of the memory block X0, the data X1-0 represents the data read out from an odd number memory cell column of the memory block X1, and the data X1-1 represents the data read out from an even number memory cell column of the memory block X1.

In other words, there appears a rule, when reading data from the memory blocks X0 and X1, in that the input/output terminals 79, 80, 81 and 82 respectively correspond to an odd number memory cell column of the memory block X0, an even number memory cell column of the memory block X0, an odd number memory cell column of the memory block X1 and an even number memory cell column of the memory block X1.

On the other hand, in the case the memory blocks D0 and D1 are selected for reading, the input/output terminals 79, 80, 81 and 82 respectively produce data D1-0, D0-1, D0-0 and D1-1, wherein the data D1-0 represents the data read out from an odd number memory cell column of the memory block D1, the data D0-1 represents the data read out from an even number memory cell column of the memory block D0, the data D0-0 represents the data read out from an odd number memory cell column of the memory block D0, and the data D1-1 represents the data read out from an even number memory cell column of the memory block D1.

Thus, the data obtained at the terminals 79 and 81 in such a case correspond respectively to the odd number memory cell column of the memory block D1 and the odd number memory cell column of the memory block D0. In such a case, therefore, the correspondence of the data obtained at the terminals 79 and 81 and the memory cell column in the selected memory blocks is different from the correspondence given by the aforementioned rule.

A similar problem occurs also when writing data into selected memory blocks X0 and X1.

In such a case, it will be noted that the data DQ0, DQ1, DQ2 and DQ3 supplied to the input/output terminals 79, 80, 81 and 82 are written respectively into an odd number memory cell column of the memory block X0, an even number memory cell column of the memory block X0, an odd number memory cell column of the memory block X1 and an even number memory cell column of the memory block X1 respectively, provided that X is selected from one of A, B and C, similarly as before.

In this case again, there exists a rule that the data on the data input/output terminals 79, 80, 81 and 82 are written respectively into an odd number memory cell column of the memory block X0, an even number memory cell column of the memory block X0, an odd number memory cell column of the memory block X1 and an even number memory cell column of the memory block X1.

When the memory blocks D0 and D1 are selected, however, the data DQ0, DQ1, DQ2 and DQ3 on the input/output terminals 79, 80, 81 and 82 are written respectively into an odd number memory cell column of the memory block D1, an even number memory cell column of the memory block D0, an odd number memory cell column of the memory block D0 and an even number memory cell column of the memory block D1.

In such a case, therefore, the data input/output terminals 79 and 81 correspond respectively to an odd number memory cell column of the memory block D1 and an odd number memory cell column of the memory block D0, wherein such a relationship contradicts with the foregoing rule for writing data into the memory blocks X0 and X1 for the case in which X is selected from A, B and C.

Such a discrepancy does not cause any problem at all as long as the user of the memory semiconductor device is concerned.

For the manufacturer of the semiconductor device, however, such a violation of the correspondence between the input/output terminals 79–80 and the physical location of the memory cell columns in the memory cell blocks, is important in relation to a test conducted for evaluating the interference between the memory cells. In such a test, it is necessary to identify the location of the tested memory cell that experiences an interference and the location of the memory cell that provides the interference to the tested memory cell. In the absence of the rule describing the correspondence between the input/output terminals 79–82 and the memory cell columns and hence the memory cells in the memory blocks A0 and A1, B0 and B1, C0 and C1 and D0 and D1. it is necessary to use a complicated program in such a test in order to guarantee the proper correspondence between the data on the terminals 79–82 and the memory cells in the selected memory blocks.

In order to eliminate the foregoing problems and to impose a generalized rule applicable to all of the memory blocks A0-D1, it is proposed to provide the hierarchical data bus switches shown in FIGS. 2 and 27 to all of the intersections between the local data buses and the global data buses, in addition to the hierarchical data bus switches P00, Q00–P31, Q31 described in FIGS. 2 and 27. Alternatively, it is propose to provide additional sense amplifier arrays to the memory blocks D0 and A1 (Y. Watanabe, et al., 1995 Symposium on VLSI Circuits Digest of Technical Papers, pp.105–106).

However, the approach to use additional hierarchical bus switches raises a problem in that use of such additional bus switches substantially complicates the circuit layout of the core area 1. On the other hand, the approach to provide sense amplifiers to each of the memory blocks D0 and A1 raises the problem of increased chip area.

SUMMARY OF THE INVENTION

Accordingly, it is a general object of the present invention to provide a novel and useful memory semiconductor device wherein the foregoing problems are eliminated.

Another and more specific object of the present invention is to provide a memory semiconductor device suitable for an interference test of memory cells, without complicating the layout process and without increasing the chip area.

Another object of the present invention is to provide a memory semiconductor device for storing parallel data formed of a plurality of data bits, comprising:

a memory block array including a plurality of memory blocks each having an address, said memory block array storing said parallel data;

first data transmission means for transmitting said parallel data therethrough, said first data transmission means including a plurality of data transmission paths;

a plurality of input/output terminals corresponding to said plurality of data bits of said parallel data; and cross connection means provided in said first data transmission means for cross connecting a part of said data transmission paths.

According to the present invention, it is possible to achieve a correspondence between the input/output terminals and the physical location of a memory cell for all of the memory blocks. Thereby, the interference test of the memory cells can be achieved easily for all of the memory blocks, without using a complicated program or providing additional sense amplifier array.

Other objects and further features of the present invention will become apparent from the following description of preferred embodiments when read in conjunction with the attached drawings.

DETAILED DESCRIPTION OF PREFERRED EMBODIMENTS

[First Embodiment]

Figure 12:
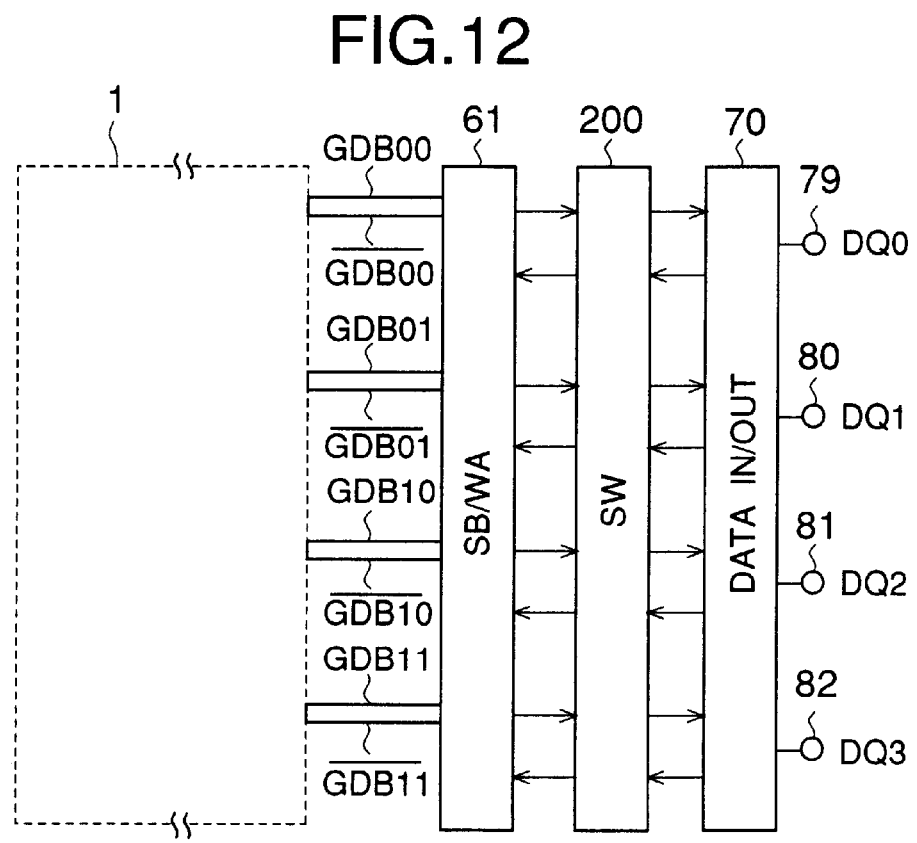
FIG. 12 is a block diagram showing the overall construction of a DRAM to which the present invention is applicable.
Figure 13:
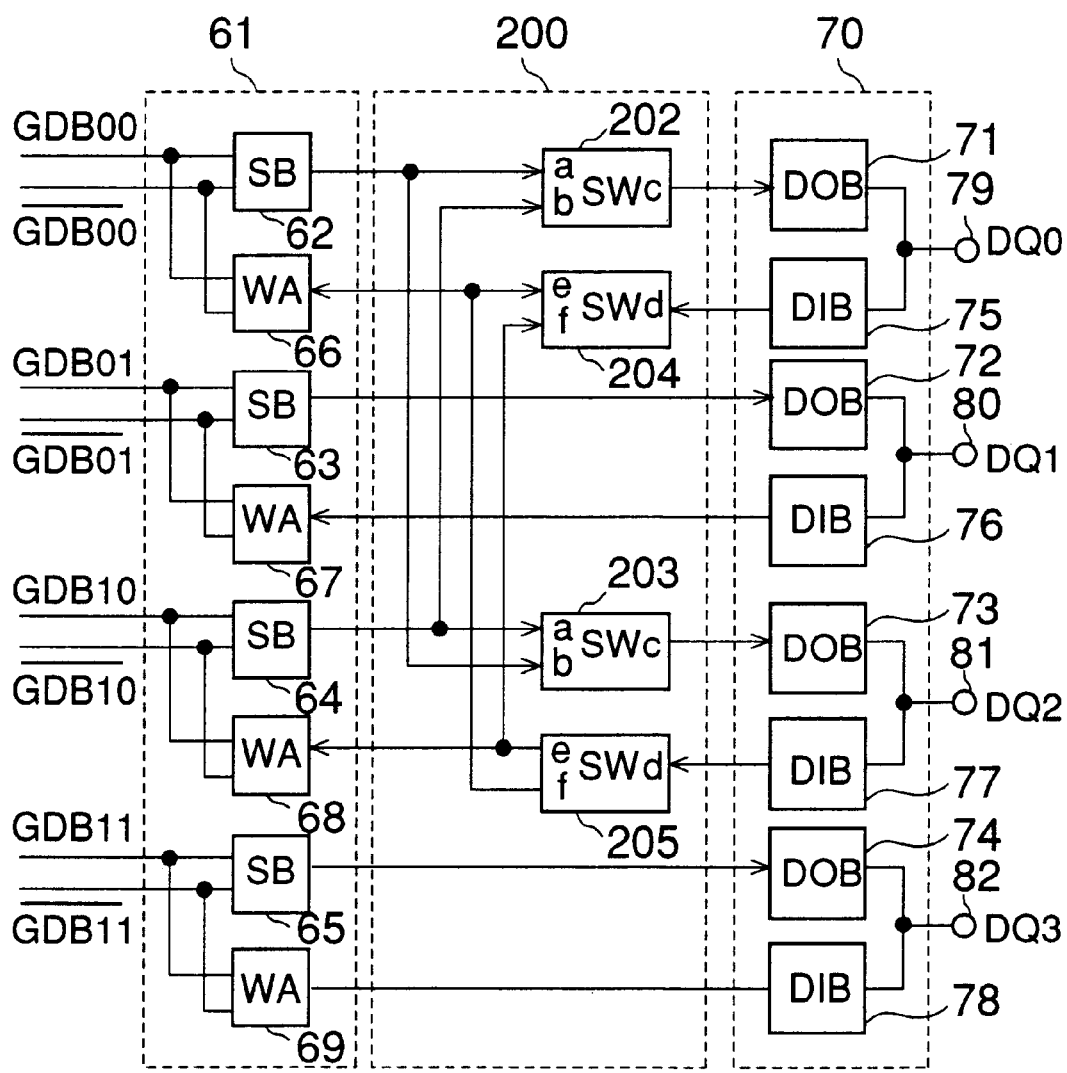
FIG. 13 is a block diagram showing a part of the DRAM of FIG. 12 according to a first embodiment of the present invention.
Figure 14:
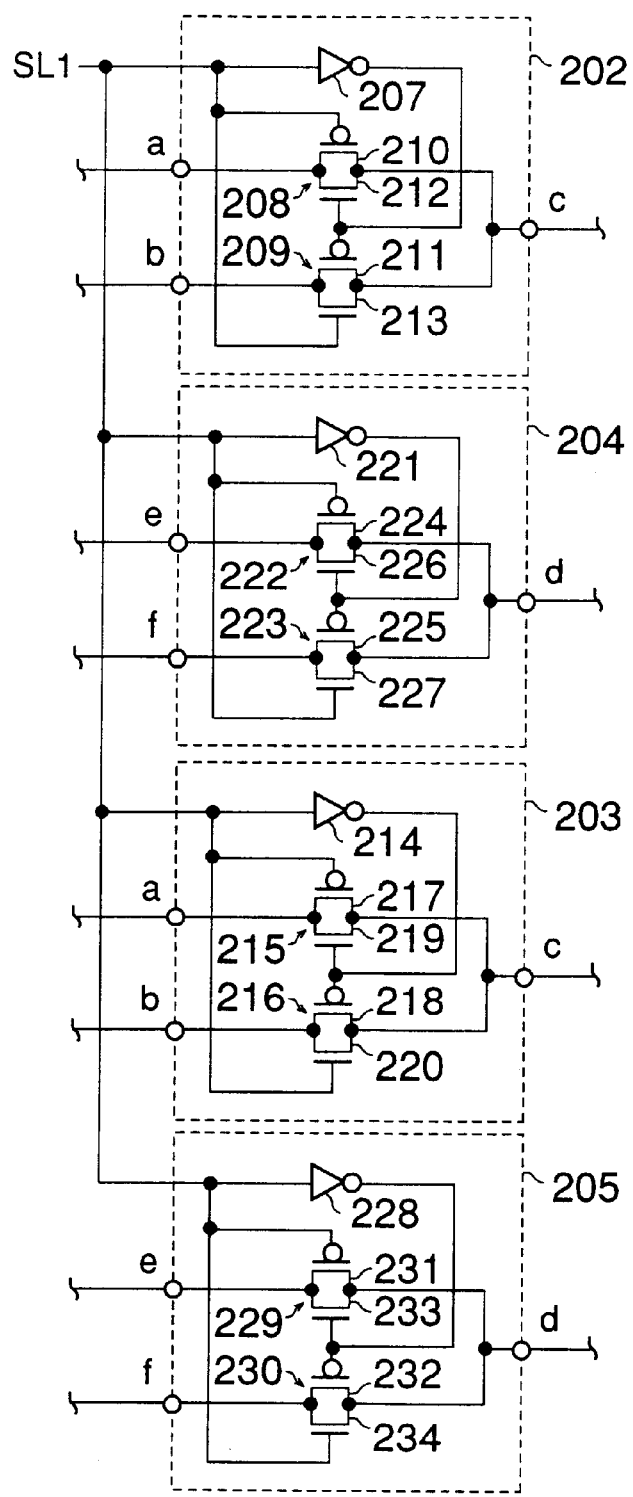
FIG. 14 is a circuit diagram showing a part of FIG. 13 in detail.

FIGS. 12–14 show the construction of a DRAM according to a first embodiment of the present invention, wherein FIG. 12 shows the overall construction. In the description hereinafter, the parts explained already are designated by the same reference numerals and the description thereof will be omitted.

Figure 1:
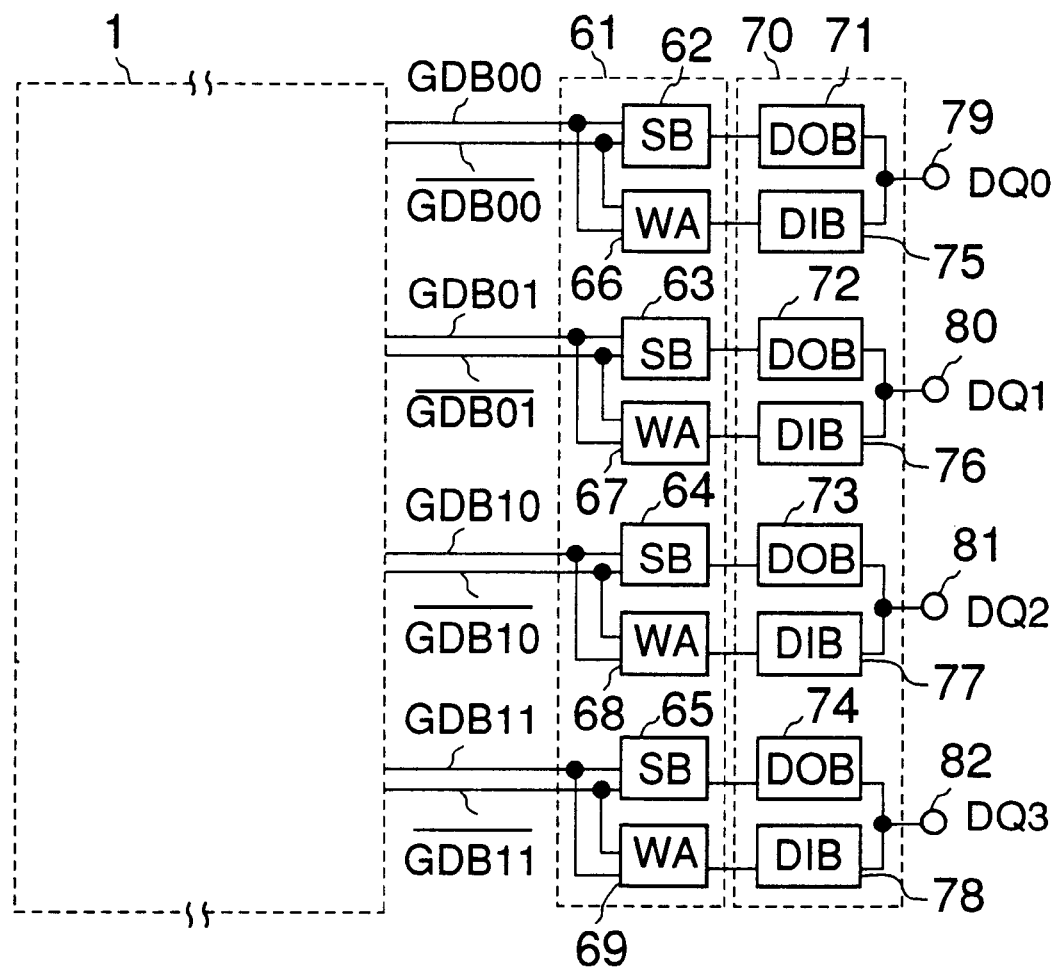
FIG. 1 is a block diagram showing a conventional DRAM having a relaxed sense amplifier arrangement.

Referring to FIG. 12, it will be noted that the DRAM of the present embodiment has an overall construction similar to that of FIG. 1 in that the DRAM includes the core area 1, the read/write circuit 61 and the input/output circuit 70 explained already. Further, the DRAM includes a data path switch block 200 between the read/write circuit 61 and the input/output circuit 70.

FIG. 13 shows the construction of the data path switch block 200.

Referring to FIG. 13, the switch block 200 includes switch circuits 202–205 having input and output terminals, wherein each of the switch circuits 202 and 203 has input terminals a and b and an output terminal c, while each of the switch circuits 204 and 205 has an input terminal d and output terminals e and f.

Thereby, it will be noted that the sense amplifier 62 has an output terminal connected to the input terminal a of the switch circuit 202 and further to the input terminal b of the switch circuit 203. Further, the sense amplifier 63 has an output terminal connected to an input terminal of the data output buffer 72.

Similarly, the sense amplifier 64 has an output terminal connected to the input terminal a of the switch circuit 203 and further to the input terminal b of the switch circuit 202. Further, the sense amplifier 65 has an output terminal connected to an input terminal of the data output buffer 74.

Further, the switch circuit 202 has the output terminal c connected to an input terminal of the data output buffer 71, and the switch circuit 203 has the output terminal c connected to an input terminal of the data output buffer 73.

Further, the data input buffer 75 has an output terminal connected to the input terminal d of the switch circuit 204, and the data input buffer 76 has an output terminal connected to an input terminal of the write amplifier 67.

Further, the data input buffer 77 has an output terminal connected to the input terminal d of the switch circuit 205, and the data input buffer 78 has an output terminal connected to an input terminal of the write amplifier 69.

Further, the switch circuit 204 has the output terminal e connected to an input terminal of the write amplifier 66 and the output terminal f connected to the input terminal of the write amplifier 68.

Further, the switch circuit 205 has the output terminal e connected to the input terminal of the write amplifier 68 and the output terminal f connected to the input terminal of the write amplifier 66.

FIG. 14 shows the construction of the switch circuit 202, wherein it will be noted that the switch circuits 203–205 have the same construction shown in FIG. 14.

Referring to FIG. 14, the switch circuit 202 includes an inverter 207, analog switch circuits 208 and 209, p-channel MOS transistors 210 and 211, and n-channel MOS transistors 212 and 213.

Similarly, the switch circuit 203 includes an inverter 214, analog switch circuits 215 and 216, p-channel MOS transistors 217 and 218, and n-channel MOS transistors 219 and 220.

Further, the switch circuit 204 includes an inverter 221, analog switch circuits 222 and 223, p-channel MOS transistors 224 and 225, and n-channel MOS transistors 226 and 227.

Further, the switch circuit 205 includes an inverter 228, analog switch circuits 229 and 230, p-channel MOS transistors 231 and 232, and n-channel MOS transistors 233 and 234.

It should be noted that each of the switch circuits 202–205 is supplied with a switch control signal SL1, wherein the control signal SL1 is set to a low level when selecting the memory blocks A0, A1, B0, B1, C0 and C1. The control signal SL1 is further set to the low level or to a high level when selecting the memory blocks D0 and D1.

Thus, when the switch control signal SL1 is set to the low level state, the analog switches 208, 215, 222 and 229 are all turned ON, while the analog switches 209, 216, 223 and 230 are all turned OFF.

As a result, the input terminal a and the output terminal c are connected with each other in the switch circuits 202 and 203, while the input terminal b and the output terminal c are disconnected in this state.

Thereby, the output terminal of the sense buffer 62 is connected to the input terminal of the data output buffer 71 via the switch circuit 202. Similarly, the output terminal of the sense buffer 64 is connected to the input terminal of the data output buffer 73 via the switch circuit 203.

Similarly, the output terminal of the sense buffer 75 is connected to the input terminal of the write amplifier 66 via the switch circuit 204, and the output terminal of the data output buffer 77 is connected to the input terminal of the write amplifier 68 via the switch circuit 205.

Thus, when reading out data, the same relationship as shown in TABLE I is obtained for the data obtained on the input/output terminals 79–82, as long as the switch control signal SL1 is set to a low level state irrespective to the selected memory block.

Similarly, when writing data, the same relationship as shown in TABLE II is obtained for the input data DQ0–DQ3 supplied to the input/output terminals 79–82 as long as the switch control signal SL1 is set to a low level state irrespective to the selected memory block.

When the switch control signal SL1 is set to a high level state, on the other hand, the analog switches 208, 215, 222 and 229 are all turned OFF while the analog switches 209, 216, 223 and 230 are all turned ON.

In this state, the input terminal b and the output terminal c are connected in the switch circuits 202 and 203, while the input terminal a and the output terminal c are disconnected. In the switch circuits 204 and 205, on the other hand, the input terminal d and the output terminal f are connected and the input terminal d and the output terminal e are disconnected.

Thus, the output terminal of the sense buffer 62 is now connected to the input terminal of the data output buffer 73 via the switch circuit 203. Similarly, the output terminal of the sense buffer 64 is connected to the input terminal of the data output buffer 71 via the switch circuit 202.

Further, the output terminal of the data input buffer 75 is connected to the input terminal of the write amplifier 68 via the switch circuit 204, and the output terminal of the data input buffer 77 is connected to the input terminal of the write amplifier 66 via the switch circuit 205.

Thus, the relationship of TABLE III below holds in the read mode operation, by setting the switch control signal SL1 to the low level state when selecting the memory blocks A0, A1, B0, B1, C0 and C1 and by setting the switch control signal SL1 to the high level state when selecting the memory blocks D0 and D1.

TABLE III

| SELECTED MEM BLK | DATA AT 79 | DATA AT 80 | DATA AT 81 | DATA AT 82 |
|---|---|---|---|---|
| A0, A1 | A0-0 | A0-1 | A1-0 | A1-1 |
| B0, B1 | B0-0 | B0-1 | B1-0 | B1-1 |
| C0, C1 | C0-0 | C0-1 | C1-0 | C1-1 |
| D0, D1 | D0-0 | D0-1 | D1-0 | D1-1 |

Thus, one obtains the output data Y0-0, Y0-1, Y1-0 and Y1-1 respectively corresponding to an odd number memory cell column of the memory block Y0, an even number memory cell column of the memory block Y0, an odd number memory cell column of the memory block Y1 and an even number memory cell column of the memory block Y1, on the respective data input/output terminals 79, 80, 81 and 82, for any of the memory blocks Y0 and Y1 selected from the memory blocks A0 and A1, B0 and B1, C0 and C1, and D0 and D1, provided that the switch control signal SL1 is set to have a low level state when the memory blocks Y0 and Y1 are selected from the memory blocks A0 and A1, B0 and B1, and C0 and C1, and further that the switch control case in which the memory blocks D0 and D1 are selected for the memory blocks Y0 and Y1.

In the writing mode operation, the switch control signal SL1 is set to have a low level state when the memory blocks are selected from the memory blocks A0, A1, B0, B1, C0 and C1. Further, the switch control signal SL1 is set to have a high level state when the memory blocks D0 and D1 are selected. By controlling the logic level of the switch control signal SL1 as such, there holds a relationship shown in TABLE IV below between the input data DQ0–DQ3 supplied to the input/output terminals 79–82 and the memory cell column in the selected memory block to which the data DQ0–DQ3 are written.

TABLE IV

| SELECTED | INPUT DATA | | | |
|---|---|---|---|---|
| MEM BLK | DQ0 | DQ1 | DQ2 | DQ3 |
| A0, A1 | A0 odd | A0 even | A1 odd | A1 even |
| B0, B1 | B0 odd | B0 even | B1 odd | B1 even |
| C0, C1 | C0 odd | C0 even | C1 odd | C1 even |
| D0, D1 | D0 odd | D0 even | D1 odd | D1 even |

Thus, by setting the logic level of the switch control signal SL1 to the low level state when writing the data DQ0–DQ3 into the memory blocks Y0 and Y1 that are selected from the memory blocks A0 and A1, B0 and B1, and C0 and C1, and further by setting the logic level of the switch control signal SL1 to have the high level state when writing the data DQ0–DQ3 into the memory blocks D0 and D1, it is possible to carry out the writing of the data into the respective memory cell columns of the memory blocks D0 and D1 according to the rule identical to the rule for writing the data into the memory blocks selected from the memory blocks A0 and A1, B0 and B1, and C0 and C1. More specifically, the data DQ0 on the input/output terminal 79 is written into an odd number memory cell column of the memory block Y0, the data DQ1 on the input/output terminal 80 is written into an even number memory cell column of the memory block Y0, the data DQ2 on the input/output terminal 81 is written into an odd number memory cell column of the memory block Y1, and the data DQ3 on the input/output terminal 82 is written into an even number memory cell column of the memory block Y1.

Thus, according to the first embodiment of the present invention, in which the data transfer path switching circuit 200 is provided between the read/write circuit 61 and the input/output circuit 70, the input/output terminals 79, 80, 81 and 82 are physically correlated to respective, corresponding memory cell columns of the memory selected from the memory blocks A0 and A1, B0 and 81, and C0 and C1 and D0 and D1, by setting the switch control signal SL1 to have a low level state when selecting the memory blocks from the memory blocks A0 and A1, B0 and B1 and C0 and C1, or by setting the switch control signal SL1 to have a high level state when selecting the memory blocks D0 and D1. Thereby, the input/output terminals 79–82 correspond to physical locations of the memory cell columns in the selected memory blocks, and one can conduct an interference test of memory cells without using a switching software or using complicated circuitry for the hierarchical bus switches, or without increasing the chip area.

[Second Embodiment]

Figure 15:
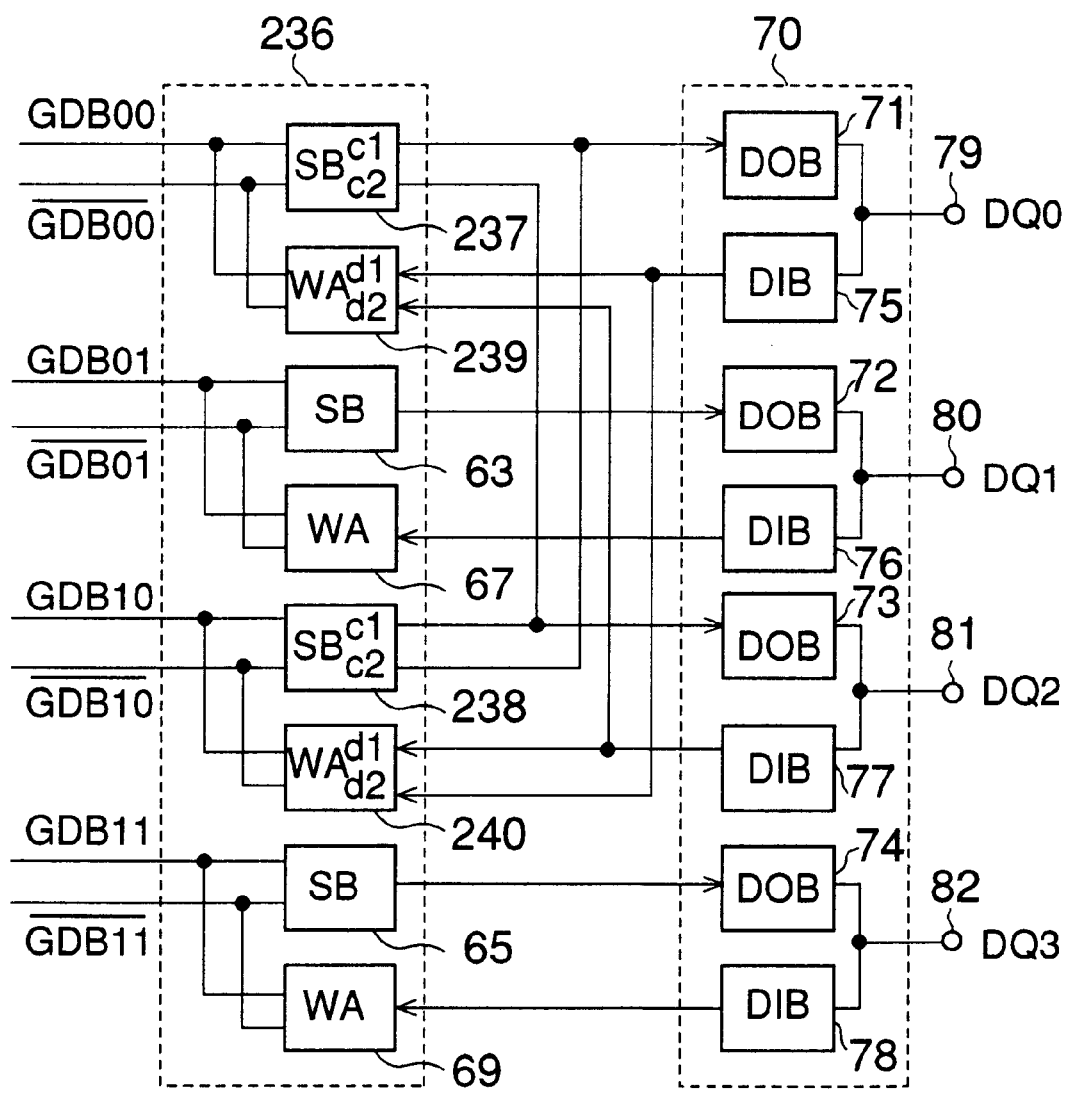
FIG. 15 is a block diagram similar to FIG. 13 showing a second embodiment of the present invention.
Figure 16:
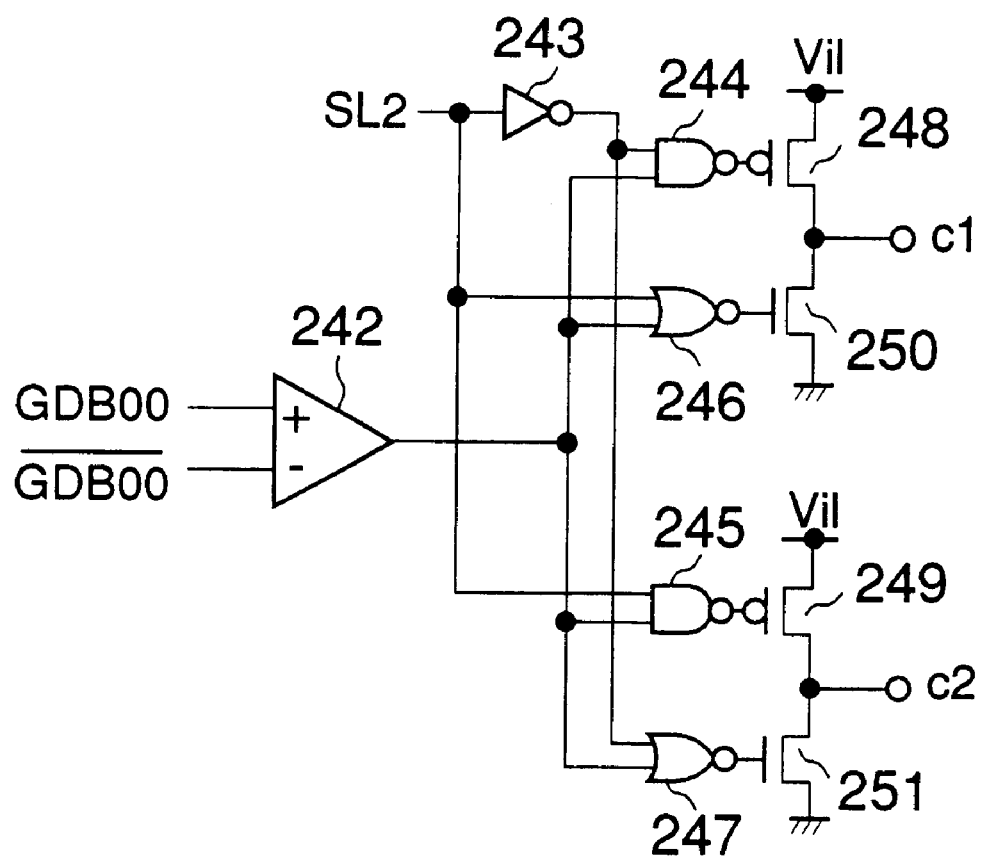
FIG. 16 is a circuit diagram showing a part of FIG. 15 in detail.
Figure 17:
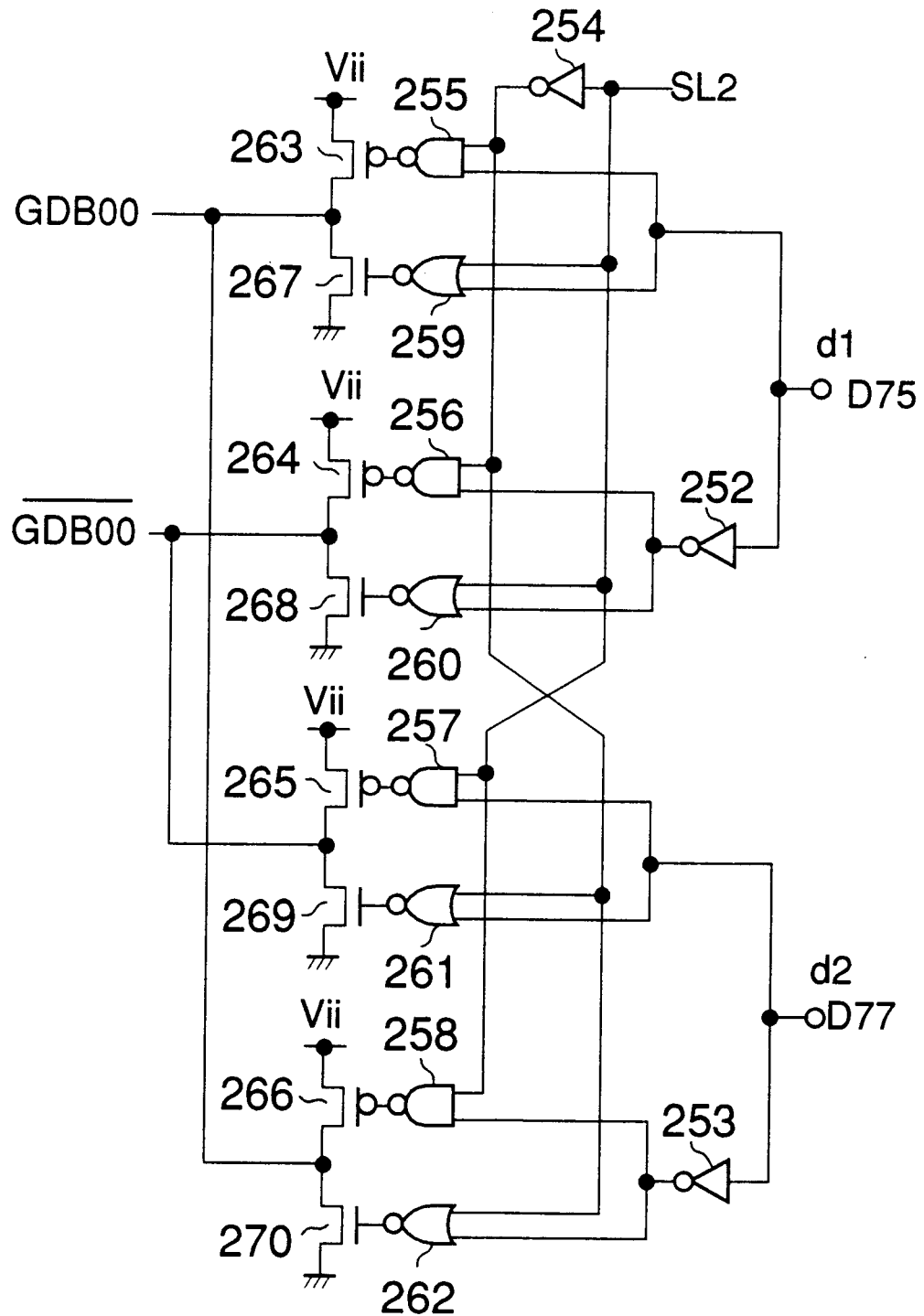
FIG. 17 is a circuit diagram showing a part of FIG. 15 in detail.

FIGS. 15–17 show the construction of a DRAM according to a second embodiment of the present invention, wherein those parts constructed identical to the previous embodiment are designated by the same reference numerals and the description thereof will be omitted.

In the present embodiment, the DRAM has an overall construction substantially identical to the construction of FIG. 1, except that the read/write circuit 61 is replaced by a read/write circuit 236.

Referring to FIG. 15, the read/write circuit 236 includes a sense buffer 237 in place of the sense buffer 62, a write amplifier 239 in place of the write amplifier 66, a sense buffer 238 in place of the sense buffer 64, and a write amplifier 240 in place of the write amplifier 68. Otherwise, the read/write circuit 236 is identical to the read/write circuit 61.

From FIG. 15, it will be noted that each of the sense buffers 237 and 238 has output terminals c1 and c2, while each of the write amplifiers 239 and 240 has input terminals d1 and d2, wherein the output terminal c1 of the sense buffer 237 is connected to the input terminal of the data output buffer 71 and the output terminal c2 of the sense buffer 237 is connected to the input terminal of the data output buffer 73. Further, the output terminal of the sense buffer 63 is connected to the input terminal of the data output buffer 72.

Further, the output terminal c1 of the sense buffer 238 is connected to the input terminal of the output buffer 73 and the output terminal c2 of the sense buffer 238 is connected to the input terminal of the data output buffer 71. Further, the output terminal of the sense buffer 65 is connected to the input terminal of the data output buffer 74.

Further, the output terminal of the data input buffer 75 is connected to the input terminal d1 of the write amplifier 239 and the input terminal d2 of the write amplifier 240, and the output terminal of the data input buffer 76 is connected to the input terminal of the write amplifier 67.

Further, the output terminal of the data input buffer 77 is connected to the input terminal d1 of the write amplifier 240 and to the input terminal d2 of the write amplifier 239. The output terminal of the data input buffer 78 is connected to the input terminal of the write amplifier 69.

FIG. 16 shows the construction of the sense buffer 237. It should be noted that the sense buffer 238 also has essentially the same construction as the sense buffer 237.

Figure 8:
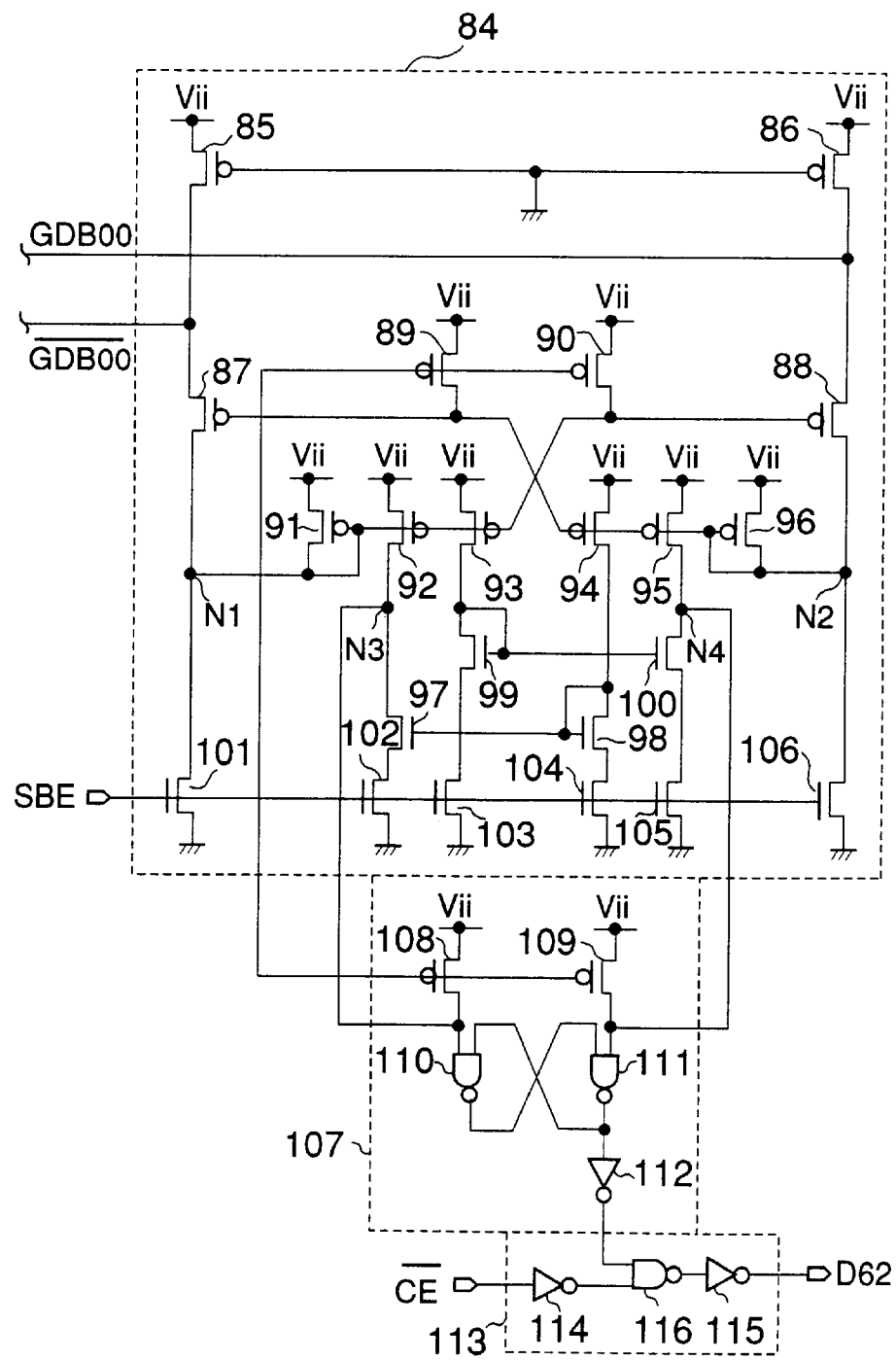
FIG. 8 is a circuit diagram showing the construction of a sense buffer shown in FIG. 1.

Referring to FIG. 16, the sense buffer 237 includes a differential amplifier 242 identical to the sense buffer 62 of FIG. 1 or 8, an inverter 243, NAND gates 244 and 245, NOR gates 246 and 247, p-channel MOS transistors 248 and 249, and n-channel MOS transistors 520 and 251.

It should be noted that the p-channel MOS transistor 248 and the n-channel MOS transistor 250 form an output circuit. Similarly, the p-channel MOS transistor 249 and the n-channel MOS transistor 251 form an output circuit, wherein the output circuit formed of the transistors 248 and 250 and the output circuit formed of the transistors 249 and 251 form a part of a data transmission path switching circuit to be explained below.

It will be noted that the sense buffer 237 of FIG. 16 is supplied with a switch control signal SL2 at the input terminal of the inverter 243 and one of the input terminals of the NAND gate 245, wherein the switch control signal SL2 assumes a low level state when the memory blocks A0 and A1, B0 and B1, or C0 and C1 are selected. On the other hand, the switch control signal SL2 assumes a high level state H when the memory blocks D0 and D1 are selected.

In the case the switch control signal SL2 is set to the low level state, it should be noted that the NAND gate 244 and the NOR gate 246 act for the output of the differential amplifier 246 as an inverter.

In this state, the NAND gate 245 and the NOR gate 247 produce respectively a high level output and a low level output, and both the p-channel MOS transistor 249 and the n-channel MOS transistor 251 are turned OFF.

When the line GDB00 of the global data bus assumes a high level state and the line /GDB00 assumes a low level state in the state of the sense buffer 237 noted above, the high level output of the differential amplifier 242 causes the NAND gate 244 to output a low level output and causes the NOR gate 246 to output a low level output. Thereby, the p-channel MOS transistor 248 is turned ON and the n-channel MOS transistor 250 is turned OFF. In response to this, a high level output is obtained at the output terminal c1.

When the line GDB00 of the global data bus line assumes a low level state and the line /GDB00 assumes a high level state, on the other hand, the differential amplifier 242 produces a high level output, and the NAND gate 244 produces a high level output and the NOR gate 246 produces a low level output. Thereby, the p-channel MOS transistor 248 is turned OFF and the n-channel MOS transistor 250 is turned ON. As a result, a low level output is obtained at the output terminal c1.

Thus, when reading data from the DRAM, the output of the sense buffer 237 is forwarded to the input terminal of the data output buffer 71 via the output terminal c1 as long as the switch control signal SL2 assumes a low level state, irrespective to the selected memory block. Similarly, the output of the sense buffer 238 is forwarded to the input terminal of the data output buffer 73 via the output terminal c1 as long as the switch control signal SL2 assumes the low level state, irrespective of the selected memory block. Thereby, the relationship of TABLE I appears in the data obtained at the input/output terminals 79–82, similarly to the conventional case.

When the switch control signal SL2 has a high level state, on the other hand, the NAND gate 244 assumes a high level state and the NOR gate 246 assumes a low level state. Thereby, the p-channel MOS transistor 248 is turned OFF and the n-channel MOS transistor 250 is also turned OFF. Thereby, the inverter, formed of the transistors 248 and 250, shows a high impedance state at the output terminal c1.

On the other hand, the NAND gate 245 and the NOR gate 247 acts as an inverter for the output of the differential amplifier 242.

In such a case, the appearance of a high level state on the data bus line GDB00 of the global data bus and a low level state on the conjugate data bus line /GDB00 causes the differential amplifier 242 to produce a high level output, while the high level output of the differential amplifier 242 causes the NAND gate 245 to produce a low level output and further the NOR gate 247 to produce another low level output. In response thereto, the p-channel MOS transistor 249 is turned ON and the n-channel MOS transistor 251 is turned OFF. Thereby, a high level output is obtained at the output terminal c2.

Thus, by setting the switch control signal SL2 to the high level state when reading data, the output of the sense buffer 237 is forwarded to the input terminal of the data output buffer 73 via the output terminal c2. Similarly, the output of the sense buffer 238 is forwarded to the input terminal of the data output buffer 71 via the output terminal c2.

Thus, when reading data while selecting the memory blocks from the memory blocks A0 and A1, B0 and B1, and C0 and C1, the selection control signal SL2 is set to the low level state. On the other hand, when selecting the memory blocks D0 and D1, the switch control signal SL2 is set to a high level state. Thereby, the output data obtained at the input/output terminals 79–82 satisfy the relationship shown in TABLE 3, similarly to the first embodiment of the present invention.

Thus, by setting the selection control signal SL2 to have a low level state when selecting the memory blocks Y0 and Y1 from the memory blocks A0 and A1, B0 and B1 and C0 and C1, and by setting the selection control signal SL2 to have a high level state when selecting the memory blocks D0 and D1 for the memory blocks Y0 and Y1, the data Y0-0, Y0-1, Y1-0 and Y1-1 are obtained at the input/output terminals 79–82 respectively.

FIG. 17 shows the construction of the write amplifier 239, while it should be noted that the write amplifier 240 has essentially the same construction.

Referring to FIG. 17, the write amplifier 239 includes inverters 252–254, NAND gates 255–258, NOR gates 259–262, p-channel MOS transistors 263–266, and n-channel MOS transistors 267–270.

Referring to FIG. 17, the p-channel MOS transistor 263 and the n-channel MOS transistor 267 form an output circuit that in turn forms a part of the transfer path switching circuit. Similarly, the p-channel MOS transistor 264 and n-channel MOS transistor 268 form an output circuit that forms a part of the transfer path switching circuit, the p-channel MOS transistor 265 and the n-channel MOS transistor 269 form an output circuit also forming a part of the transfer path switching circuit, and the p-channel MOS transistor 266 and the n-channel MOS transistor 270 form an output circuit that forms a part of the data transfer path switching circuit.

When the level of the switch control signal SL2 is set to a low level state in the circuit of FIG. 17, it will be noted that the NAND gate 255 and the NOR gate 259 act as an inverter for an output signal D75 of the data input buffer 75, while the NAND gate 256 and the NOR gate 260 act as an inverter for the output of the inverter 252.

In such a state, the NAND gates 257 and 258 both produce a high level output, while the NOR gates 261 and 262 both produces a low level output. Thereby, the p-channel MOS transistors 265 and 266 are both turned OFF and the n-channel MOS transistors 269 and 270 are both turned OFF. In response to this, the output circuit formed of the p-channel MOS transistor 265 and the n-channel MOS transistor 269 assumes a high impedance state. Similarly, the output circuit formed of the p-channel MOS transistor 266 and the n-channel MOS transistor 270 assumes a high impedance state.

Thus, in the write amplifier 239, the output signal D75 of the data input buffer 75 supplied to the input terminal d1 is treated as a valid data, while the output signal D77 of the data input buffer 77 supplied to the input terminal d2 is ignored.

When the output signal D75 of the data input buffer 75 has a high level state under the foregoing state of the switch control signal SL2, on the other hand, the NAND gate 255, the NOR gate 259 and the inverter 252 all produce a low level output, while the NAND gate 256 and the NOR gate 260 produce a high level output.

As a result, the p-channel MOS transistor 263 is turned ON, the n-channel MOS transistor 267 is turned OFF, the p-channel MOS transistor 264 is turned OFF and the n-channel MOS transistor 268 is turned ON. Thereby, the line GDB00 of the global data bus is set to have a high level state, while the conjugate line /GDB00 assumes a low level state.

When the output signal D75 of the data input buffer 75 has a low level state, on the other hand, the NAND circuit 255 produces a high level output, the NOR gate 259 produces a high level output, the inverter 252 produces a high level output, while the NAND gate 256 produces a low level output. Further, the NOR gate 260 produces a low level output.

As a result, there appears a state in which the p-channel MOS transistor 263 is turned OFF, the n-channel MOS transistor 267 is turned ON, the p-channel MOS transistor 264 is turned ON, and the n-channel MOS transistor 268 is turned OFF. Thereby, the line GDB00 assumes a low level state while the data line /GDB00 assumes a high level state.

In the write amplifier 240 having a construction substantially identical to the construction of the write amplifier 240, on the other hand, the data D77 of the data input buffer 77 at the input terminal d1 is treated as valid data while the output data D75 of the data output buffer 75 at the input terminal d2 is ignored.

Thus, the output signal D75 of the data input buffer 75 is supplied to the write amplifier 239 from the input terminal d1, while the output signal D77 of the data input buffer 77 is supplied to the write amplifier 240 from the input terminal d1.

Thereby, it will be noted that the input data DQ0–DQ3 on the input/output terminals 79–82 are written into the respective memory cell columns according to the relationship of TABLE II when the switch control signal SL2 is set to the low level state irrespective of the selected memory block.

When the switch control signal SL2 is set to the high level state, on the other hand, the NAND gates 255 and 256 produce a high level output and the NOR gates 259 and 260 produce a low level output in the write amplifier 239. Thereby, the p-channel MOS transistors 263 and 264 are turned OFF and the n-channel MOS transistors 267 and 268 are turned OFF. In other words, the output circuit formed of the p-channel MOS transistor 263 and the n-channel MOS transistor 267 as well as the output circuit formed of the p-channel MOS transistor 264 and the n-channel MOS transistor 268 both take a high impedance state.

On the other hand, the NAND gate 257 and the NOR gate 261 act as an inverter for the output D77 of the data input buffer 77. Similarly, the NAND gate 258 and the NOR gate 262 act as an inverter for the output of the inverter 253.

Thus, the write amplifier 239 treats the output signal D77 of the data input buffer 77 supplied to the input terminal d2 as a valid input and ignores the output signal D75 of the data input buffer 75 supplied to the input terminal d1.

In such a state of the switch control signal SL2, therefore, the NAND gate 257 produces a low level output when the output signal D77 of the data input buffer 77 has a high level state. In relation to this, the NOR gate 261 produces a low level output, the inverter 253 produces a low level output, the NAND gate 258 produces a high level output and the NOR gate 262 produces a high level output.

As a result of this, the p-channel MOS transistor 265 is turned ON, the n-channel MOS transistor 269 is turned OFF, the p-channel MOS transistor 266 is turned OFF and the n-channel MOS transistor 270 is turned ON. Thereby, the line GDB00 of the global data bus assumes a high level state while the line /GDB00 assumes a low level state.

On the other hand, when the output D77 of the data input buffer 77 assumes a low level state, the NAND gate 257 produces a high level output, the NOR gate 261 produces a high level output, the inverter 253 produces a high level output, the NAND gate 258 produces a low level output, and the NOR gate produces a low level output.

As a result of this, the p-channel MOS transistor 265 is turned OFF, the n-channel MOS transistor 269 is turned ON, the p-channel MOS transistor 266 is turned ON and the n-channel MOS transistor 270 is turned OFF. Thereby, the line GDB00 of the global data bus assumes a low level state while the line /GDB00 assumes a high level state.

In the write amplifier 240 having an identical construction to the write amplifier 239, on the other hand, the output signal D75 of the data input buffer 75 supplied to the input terminal d2 is treated as the valid data while the output signal D77 of the data input buffer 77 supplied to the input terminal d1 is ignored.

Thus, by setting the switch control signal SL2 to have a low level state when selecting any of the memory blocks A0 and A1, B0 and B1, C0 and C1, and further by setting the switch control signal SL2 to have a high level state when selecting the memory blocks D0 and D1, the input data DQ0–DQ3 on the input/output terminals 79–82 are written into respective corresponding memory cell columns according to the relationship of TABLE IV similarly to the case of the first embodiment.

Thus, when the memory blocks Y0 and Y1 are selected from the memory blocks A0 and A1, B0 and B1 or C0 and C1, the input data DQ0–DQ3 on the input/output terminals 79–82 are written respectively into an odd number memory cell column of the memory block Y0, an even number memory cell column of the memory block Y1, an odd number memory cell column of the memory block Y1 and an even number memory cell column of the memory block Y1, by setting the switch control signal SL2 to have a low level state. Further, by setting the switching control signal SL2 to have a high level state, it is possible to carry out the writing of the input data DQ0–DQ3 similarly as above, even when the memory blocks D0 and D1 are selected for the memory blocks Y0 and Y1.

Thus, according to the second embodiment of the present invention, in which the data transfer path switching circuit is provided inside the sense buffers 237 and 238 as well as inside the write amplifiers 239 and 240, the input/output terminals 79, 80, 81 and 82 are physically correlated to respective, corresponding memory cell columns of the memory selected from the memory blocks A0 and A1, B0 and B1, and C0 and C1 and D0 and D1, by setting the switch control signal SL2 to have a low level state when selecting the memory blocks from the memory blocks A0 and A1, B0 and B1 and C0 and C1, or by setting the switch control signal SL2 to have a high level state when selecting the memory blocks D0 and D1. Thereby, the input/output terminals 79–82 correspond to physical locations of the memory cell columns in the selected memory blocks, and one can conduct an interference test of memory cells without using a switching software or using complicated circuitry for the hierarchical bus switches, or without increasing the chip area.

[Third Embodiment]

Figure 18:
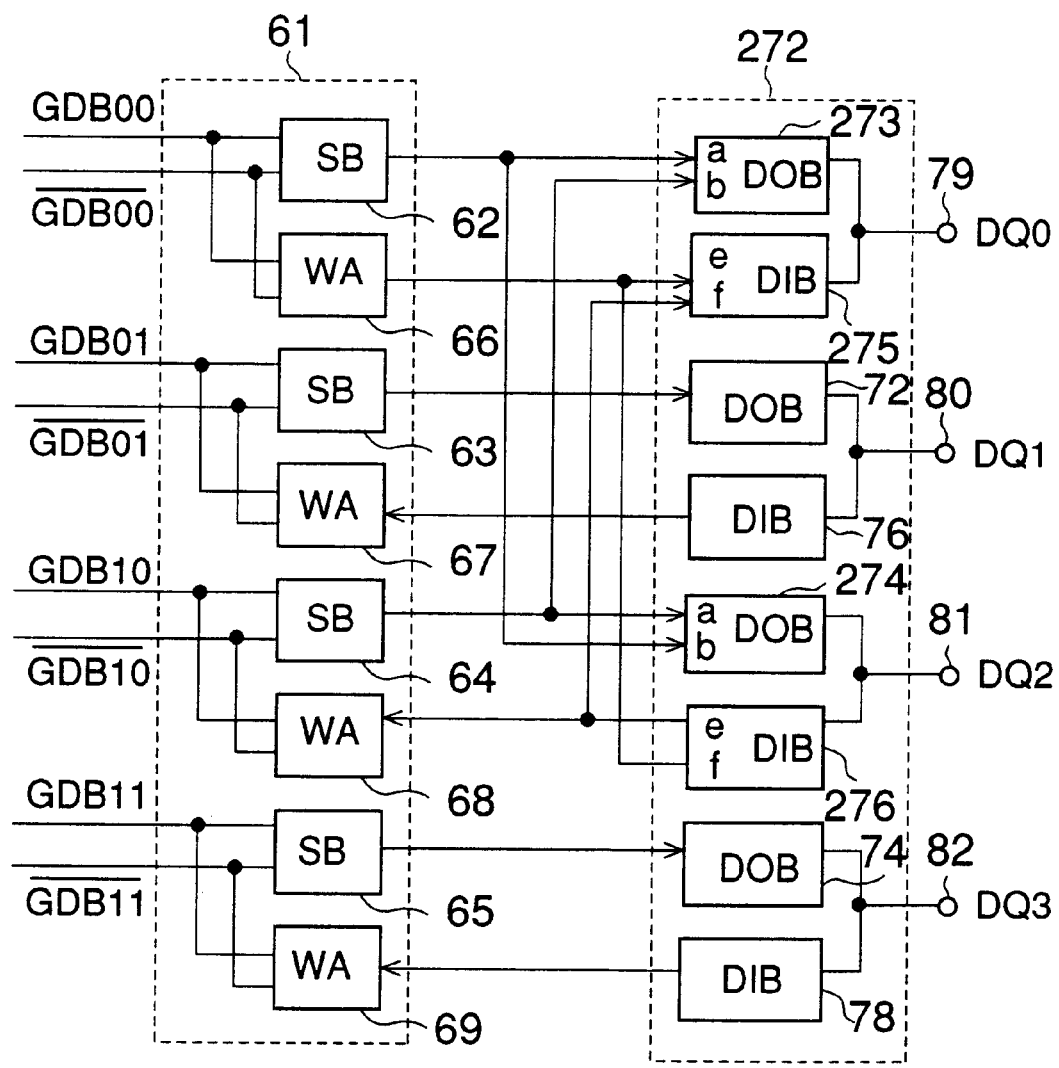
FIG. 18 is a block diagram similar to FIG. 13 showing a third embodiment of the present invention.
Figure 19:
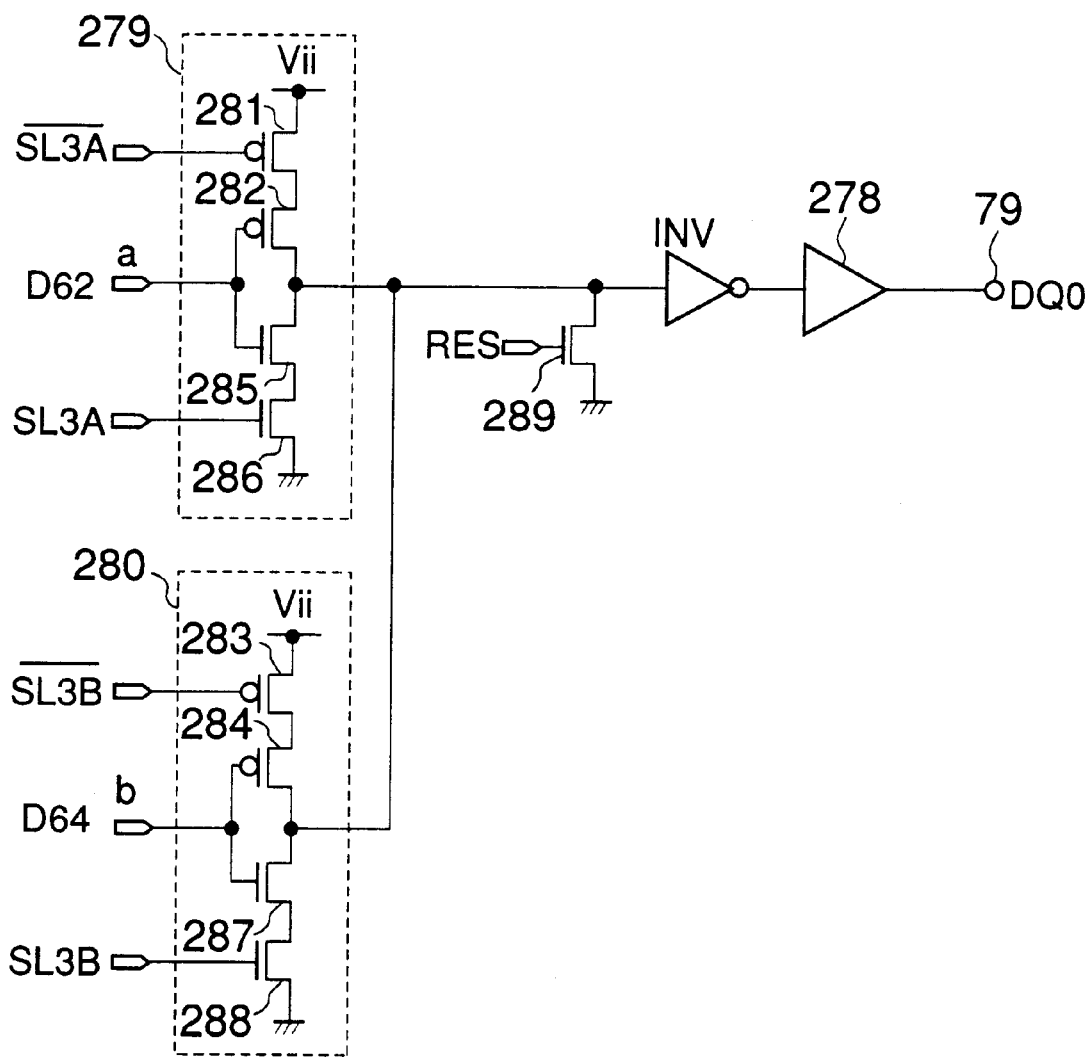
FIG. 19 is a circuit diagram showing a part of FIG. 18 in detail.
Figure 20:
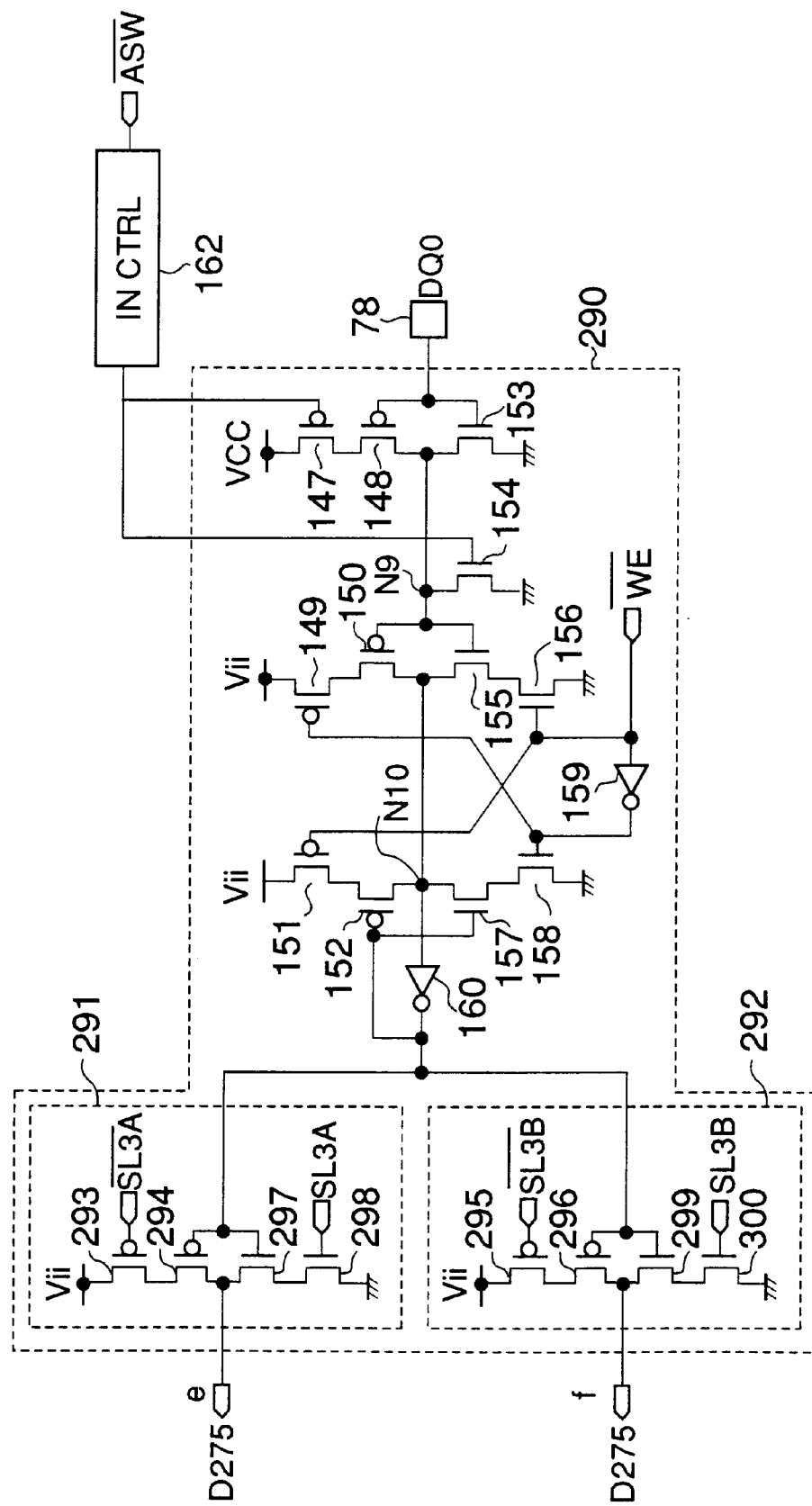
FIG. 20 is a circuit diagram showing a part of FIG. 18 in detail.

FIGS. 18–20 show the construction of a DRAM according to a third embodiment of the present invention, wherein those parts constructed identically to the previous embodiments are designated by the same reference numerals and the description thereof will be omitted.

In the present embodiment, the DRAM has an overall construction substantially identical to the construction of FIG. 1, except that the input/output circuit 70 is replaced by an input/output circuit 272.

Referring to FIG. 18, the input/output circuit 272 includes data output buffers 273 and 274 as well as data input buffers 275 and 276 in place of the data output buffers 71 and 73 and the data input buffers 75 and 77. Otherwise, the input/output circuit 272 is identical to the input/output circuit 70.

From FIG. 18, it will be noted that each of the data output buffers 273 and 274 has input terminals a and b, while each of the data input buffers 275 and 276 has output terminals e and f, wherein the output terminal of the sense buffer 62 is connected to the input terminal a of the data output buffer 273 and to the input terminal b of the data output buffer 274, while the output terminal of the sense buffer 63 is connected to the input terminal of the data output buffer 72.

Further, the output terminal of the sense buffer 64 is connected to the input terminal a of the data output buffer 274 and further to the input terminal b of the data output buffer 273. Further, the output terminal of the sense buffer 65 is connected to the input terminal of the data output buffer 74.

Further, the output terminal e of the data input buffer 275 is connected to the input terminal of the write amplifier 66 and the output terminal f of the data input buffer 275 is connected to the input terminal of the write amplifier 68. Further, the output terminal of the data input buffer 76 is connected to the input terminal of the write amplifier 67.

Further, the output terminal e of the data input buffer 276 is connected to the input terminal of the write amplifier 68 and the output terminal f of the data input buffer 276 is connected to the input terminal of the write amplifier 66. Further, the output terminal of the data input buffer 78 is connected to the input terminal of the write amplifier 69.

FIG. 19 shows the construction of the data output buffer 273, wherein it should be noted that the data output buffer 274 has essentially the same construction.

Figure 29:
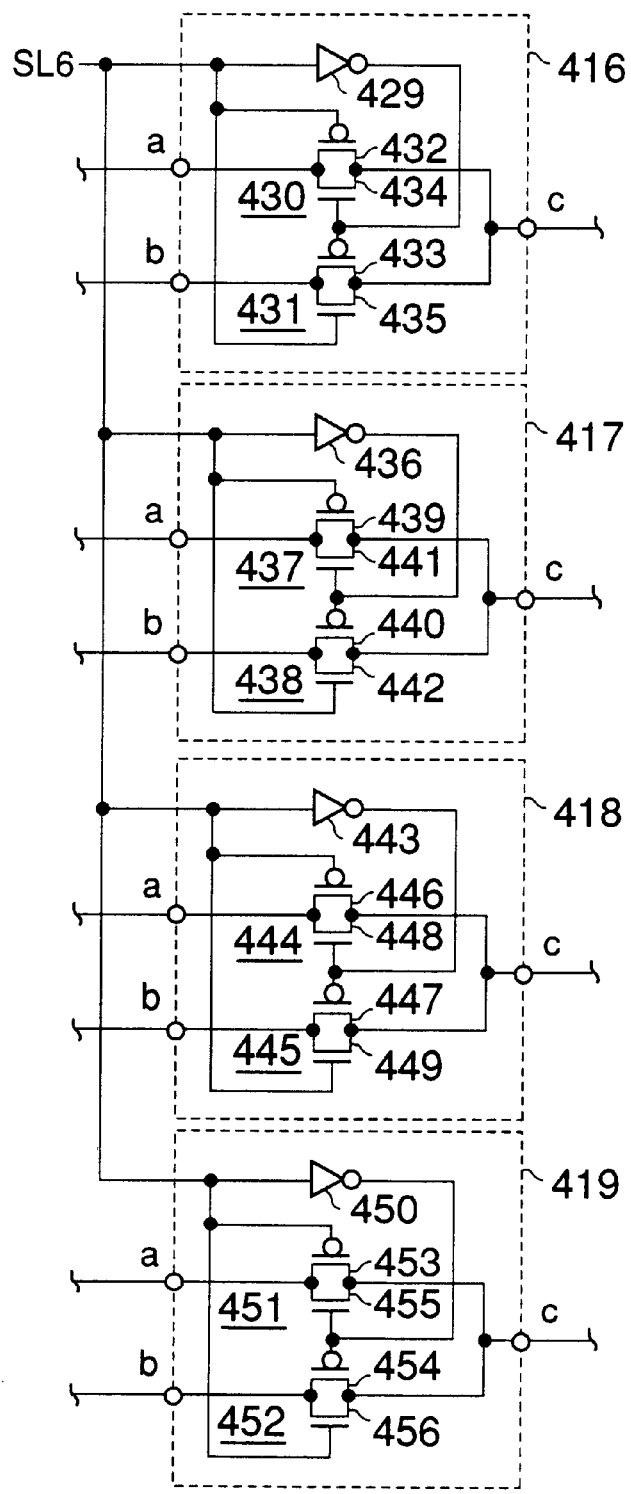
FIG. 29 is a circuit diagram showing a part of FIG. 28 in detail.

Referring to FIG. 19, the data output buffer 273 includes an output circuit 278 essentially identical to the output buffer 71 shown in FIGS. 1 and 29, as well as inverters 279 and 280 forming a part of the data transfer path switching circuit, wherein the inverters 279 and 280 includes p-channel MOS transistors 281–284 and n-channel MOS transistors 285–288.

In the construction of FIG. 19, it should be noted that the n-channel MOS transistor 289 forms a resetting transistor activated by a reset signal RES, wherein the reset signal RES is set to a high level state when resetting such that the MOS transistor 289 is turned ON. When in the non-reset state, the reset signal RES is set to have a low level state and the n-channel MOS transistor is turned OFF.

The data output buffer 273 is suppled with complementary switch control signals /SL3A, SL3A, /SL3B and SL3B, wherein the switch control signals /SL3A, SL3A, /SL3B and SL3B are set respectively to a low level state, a high level state, a high level state and a low level state, when the memory blocks Y0 and Y1 are selected from the memory blocks A0 and A1, B0 and B0, and C0 and C1. On the other hand, when the memory blocks D0 and D1 are to be selected for the memory blocks Y0 and Y1, the switch control signals /SL3A, SL3A, /SL3B and SL3B are set respectively to a high level state, a low level state, a low level state and a high level state.

It will be noted that the p-channel MOS transistor 281 is turned ON, the n-channel MOS transistor 286 is turned ON, the p-channel MOS transistor 283 is turned OFF and the n-channel MOS transistor 288 is turned OFF when the switch control signals /SL3A, SL3A, /SL3B and SL3B have respectively a low level state, a high level state, a high level state and a low level state. In correspondence to this, the inverter 279 is activated while the inverter 280 is deactivated.

In such a state of the data output buffer 273, therefore, the output D62 of the sense buffer 62 supplied to the input terminal a is treated as a valid data, while the output D64 of the sense buffer 64 supplied to the input terminal b is ignored.

In such a case, the p-channel MOS transistor 282 is turned OFF and the n-channel MOS transistor 285 is turned ON when the output D62 of the sense buffer 62 has a high level state. Thereby, the inverter 279 produces a low level output and the output data DQ0 assumes a high level state.

When the output D62 of the sense buffer 62 has a low level state, on the other hand, the p-channel MOS transistor 282 is turned ON and the n-channel MOS transistor 285 is turned OFF. Thereby, the inverter 279 produces a high level output and the data DQ0 assumes a low level state.

Thus, when reading data from the DRAM, the data on the input/output terminals 79–82 correspond to the corresponding memory cell columns according to the relationship of TABLE I, provided that the switch control signals /SL3A, SL3A, /SL3B and SL3B are set respectively to have a low level state, a high level state, a high level state and a low level state irrespective to the selected memory blocks.

When the switch control signals /SL3A, SL3A, /SL3B and SL3B are set respectively to have a high level state, a low level state, a low level state and a high level state, on the other hand, the p-channel MOS transistor 281 is turned OFF, the p-channel MOS transistor 283 is turned ON, the n-channel MOS transistor 286 is turned OFF, and the n-channel MOS transistor 288 is turned ON. Thereby, the inverter 279 is deactivated while the inverter 280 is activated.

Thus, in this state, the data output buffer 273 treats the output D64 of the sense buffer 64 supplied to the input terminal b as valid data while ignores the output D62 of the sense buffer 62 supplied to the input terminal a.

When the output D64 of the sense buffer 64 has a high level state in the foregoing state of the switch control signals, the p-channel MOS transistor 284 is turned OFF while the n-channel MOS transistor 287 is turned ON, and the inverter 280 produces a low level output. Associated with this, the data DQ0 on the input/output terminal 79 assumes a high level state.

When the output D64 of the sense buffer 64 has a low level state, on the other hand, p-channel MOS transistor 284 is turned ON and the n-channel MOS transistor 287 is turned OFF. In response to this, the inverter 280 produces a high level output and the output data DQ0 assumes a low level state.

Thus, the memory cell columns and the data on the input/output terminals 79–82 can be related with each other according to the relationship of TABLE III noted before by setting the switch control signals /SL3A, SL3A, /SL3B and SL3B respectively to the low level state, high level state, high level state and low level state when the memory blocks Y0 and Y1 are selected from the memory blocks A0 and A1, B0 and B1, C0 and C1, or by setting the switch control signals /SL3A, SL3A, /SL3B and SL3B respectively to the high level state, low level state, low level state and high level state when the memory blocks Y0 and Y1 are selected from the memory blocks D0 and D1.

More specifically, it is possible to obtain the data Y0-0, Y0-1, Y1-0 and Y1-1 (Y=A, B, C, D) respectively on the input/output terminals 79, 80, 81 and 82, by setting the switch control signals /SL3A, SL3A, /SL3B and SL3B respectively to the low level state, high level state, high level state and low level state when the memory blocks Y0 and Y1 are selected from the memory blocks A0 and A1, B0 and B1, C0 and C1, and by setting the switch control signals /SL3A, SL3A, /SL3B and SL3B respectively to the high level state, low level state, low level state and high level state when the memory blocks Y0 and Y1 are selected from the memory blocks D0 and D1.

FIG. 20 shows the construction of the data input buffer 275 according to the present embodiment, wherein it should be noted that the data input buffer 276 has the same construction.

Figure 10:
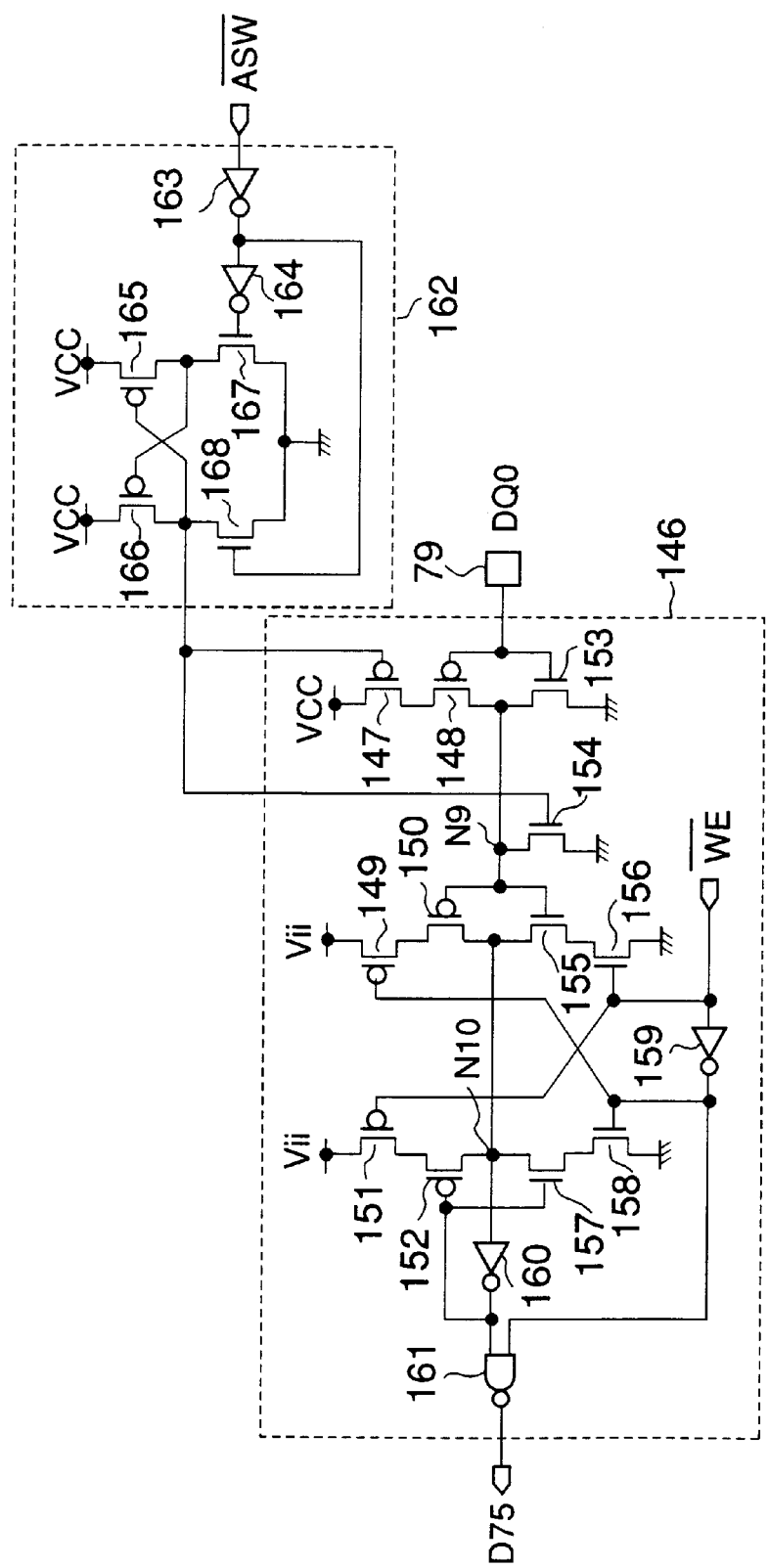
FIG. 10 is a circuit diagram showing the construction of a data input buffer shown in FIG. 1.

Referring to FIG. 20, it will be noted that the data input buffer 275 uses an input circuit 290 that is different from the input circuit 146 used in the data input buffer 75 of FIG. 1 or FIG. 10. Otherwise the data input buffer 275 is constructed identically to the data input buffer 75 represented in FIG. 1 or FIG. 10.

Referring to FIG. 20, the input circuit 290 uses inverters 291 and 292 in place of the NAND gate 161 in the input circuit 146, such that the output terminal of the inverter 160 is connected to respective input terminals of the inverters 291 and 292. Further, the output terminal of the inverter 159 is not connected to the input terminals of the inverters 291 and 292. Otherwise, the circuit 290 is identical to the input circuit 146 shown in FIG. 10.

It should be noted that the inverters 291 and 292 include p-channel MOS transistors 293–296 and n-channel MOS transistors 297–300. The inverters 291 and 292 form a part of the data transfer path switching circuit.

When the switch control signals /SL3A, SL3A, /SL3B and SL3B are set respectively to a low level state, a high level state, a high level state and a low level sate similarly as before, the p-channel MOS transistor 293 is turned ON, the n-channel MOS transistor 298 is turned ON, the p-channel MOS transistor 295 is turned OFF and the n-channel MOS transistor 300 is turned OFF. Thus, the inverter 291 is activated while the inverter 292 is deactivated.

Thus, the output terminal e forms a valid, effective output terminal in such a state while the output terminal f forms an invalid, ineffective output terminal, and data identical to the input data DQ0 supplied to the input terminal 79 is obtained at the output terminal e as the output data D275 of the data input buffer 275.

The output data D275 of the data input buffer 275 thus obtained is then forwarded to the write amplifier 66 from the output terminal e. Similarly, the data input buffer 276 produce output data D276 at the output terminal e, wherein the data D276 is forwarded to the write amplifier 68.

Thus, when the switch control signals /SL3A, SL3A, /SL3B and SL3B are set respectively to the low level state, high level state, high level state and low level state irrespectively to the selection of the memory blocks Y0 and Y1, the input data DQ0–DQ3 on the input/output terminals 79–82 are written into corresponding memory cell blocks according to the relationship represented in TABLE II similarly to the prior art device.

When the switch control signals /SL3A, SL3A, /SL3B and SL3B are set respectively to the high level state, low level state, low level state and high level state, on the other hand, the p-channel MOS transistor 293 is turned OFF, the n-channel MOS transistor 298 is turned OFF, the p-channel MOS transistor 295 is turned ON and the n-channel MOS transistor 300 is turned ON. Thereby, the inverter 291 is deactivated while the inverter 292 is activated.

In this case, therefore, the output terminal e becomes an invalid terminal while the output terminal f becomes a valid output terminal, and the data identical to the input data DQ0 on the input terminal 79 appears on the output terminal f as the output data D275 of the data input buffer 275.

The output data D275 of the data input buffer 275 thus obtained is then forwarded to the write amplifier 68 from the output terminal f, and the output data D276 of the data input buffer 276 is forwarded to the write amplifier 66 from the output terminal f.

Thus, it is possible to write the input data DQ0–DQ3 on the input/output terminals 79–82 into respective corresponding memory cell columns of the selected memory blocks, by setting the switch control signals /SL3A, SL3A, /SL3B and SL3B respectively to have a low level state, high level state, high level state and low level state when the memory blocks are selected from the memory blocks A0 and A1, B0 and B1, and C0 and C1, or by setting the switch control signals /SL3A, SL3A, /SL3B and SL3B respectively to have a high level state, low level state, low level state and high level state when the memory blocks are selected from the memory blocks D0 and D1, as represented in TABLE IV described previously.

More specifically, the input data DQ0–DQ3 respectively on the data input/output terminals 79–85 are supplied such that the data D00 on the terminal 79 is written into an odd number memory cell column of the memory block Y0, the data DQ1 on the terminal 80 is written into an even number memory cell column of the memory block Y0, the data DQ2 on the terminal 81 is written into an odd number memory cell column of the memory block Y1 and the data DQ3 on the terminal 82 is written into an even number memory cell column of the memory block Y1, by setting the switch control signals /SL3A, SL3A, /SL3B and SL3B respectively to have a low level state, a high level state, a high level state and a low level state when the memory blocks Y0 and Y1 are selected from the memory blocks A0 and A1, B0 and B1, and C0 and C1, or by setting the switch control signals /SL3A, SL3A, /SL3B and SL3B respectively to have a high level state, low level state, low level state and high level state when the memory blocks Y0 and Y1 are selected from the memory blocks D0 and D1.

Thus, according to the third embodiment of the present invention, in which the data transfer path switching circuit is provided inside the data output buffers 273 and 274 as well as inside the data input buffers 275 and 276, it is possible to physically correlate the input/output terminals 79–82 with the respective, corresponding memory cell columns of the memory blocks that are selected from the memory blocks A0 and A1, B0 and B1, C0 and C1 and D0 and D1, by setting the switch control signals /SL3A, SL3A, /SL3B and SL3B to have respectively a low level state, a high level state, a high level state and a low level state when the memory blocks are selected from the memory blocks A0 and A1, B0 and B1 and C0 and C1, or by setting the switch control signals /SL3A, SL3A, /SL3B and SL3B to have respectively a high level state, a low level sate, a low level state and a high level state, when selecting the memory blocks D0 and D1. Thereby, the input/output terminals 79–82 correspond to the physical location of the memory cell columns in the selected memory blocks, and one can conduct an interference test of memory cells without using a switching software or using complicated circuitry for the hierarchical bus switches, or without increasing the chip area.

[Fourth Embodiment]

Figure 21:
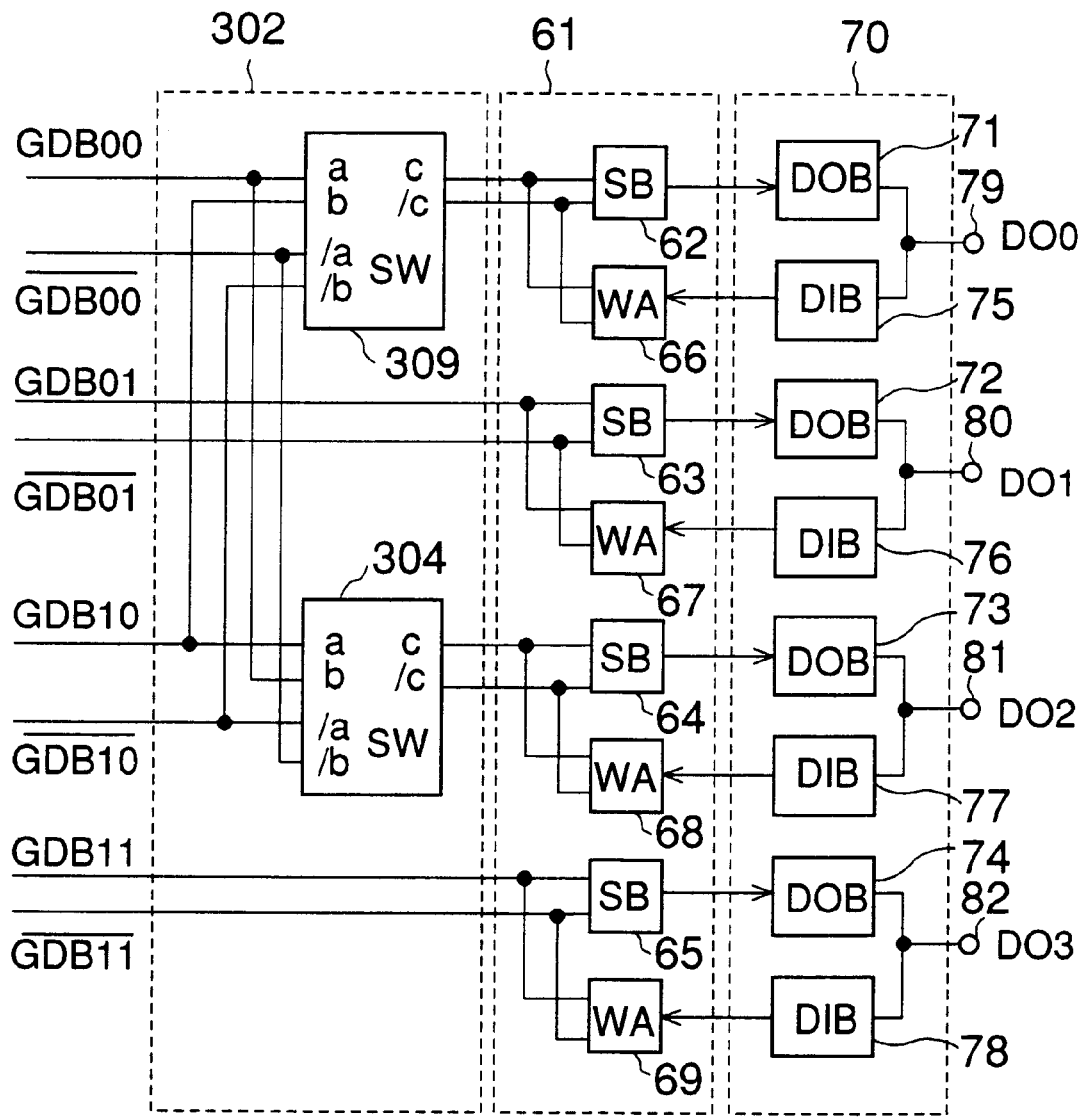
FIG. 21 is a block diagram similar to FIG. 13 showing a fourth embodiment of the present invention.
Figure 22:
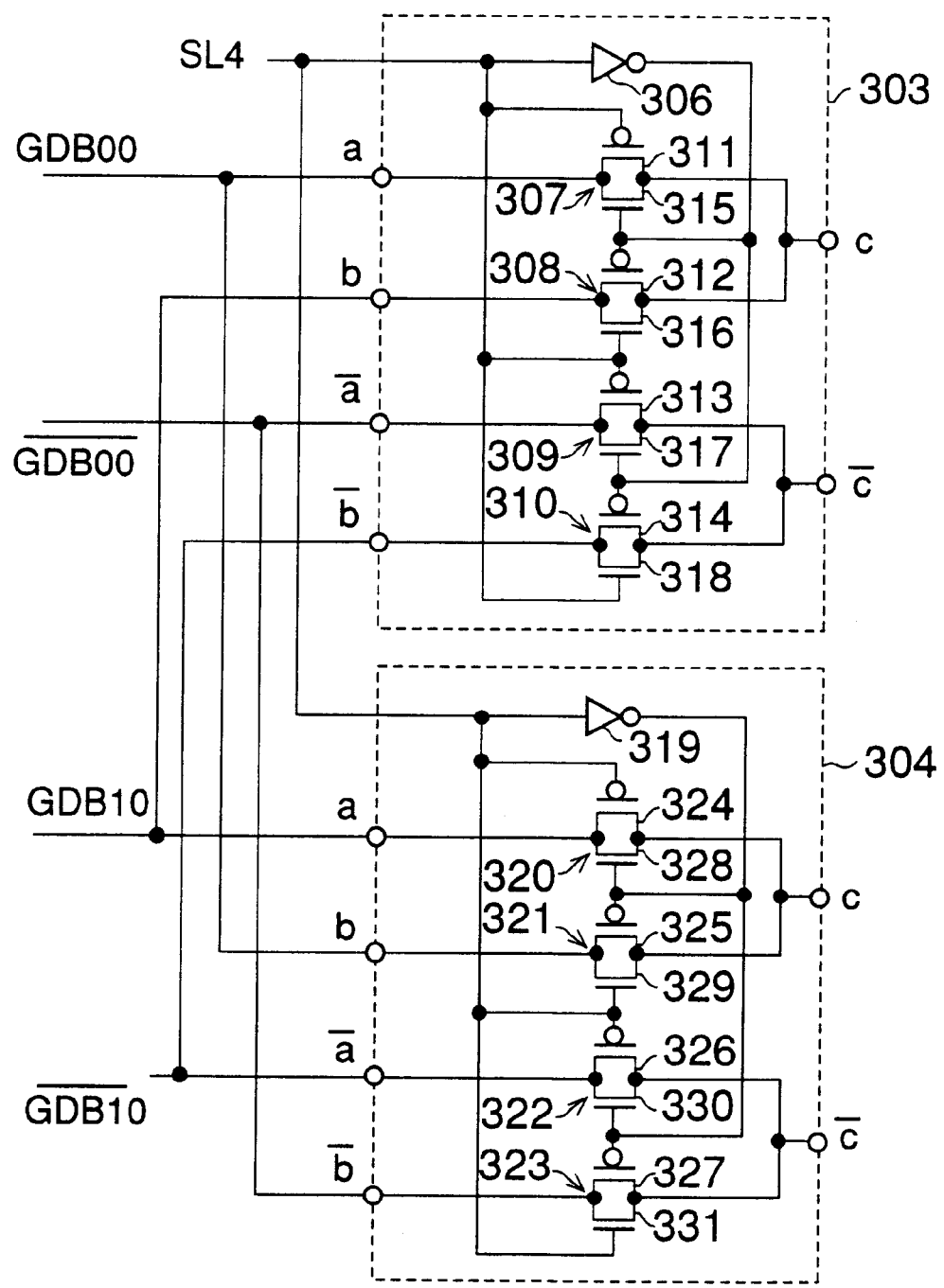
FIG. 22 is a circuit diagram showing a part of FIG. 21 in detail.

FIGS. 21 and 22 show the construction of a DRAM according to a fourth embodiment of the present invention, wherein those parts constructed identically to the previous embodiments are designated by the same reference numerals and the description thereof will be omitted.

Referring to FIG. 21, it will be noted that there is provided a data transfer path switching circuit 302 between the input/output circuit 61 and the global data bus (GDB00–/GDB11). Otherwise, the construction of FIG. 21 is identical to the construction of FIG. 1.

Referring to FIG. 21, the circuit 302 includes switch circuits 303 and 304 each having input/output terminals a, /a, b, /b, c and /c, wherein it will be noted that the data line GDB00 forming the global data bus is connected to the input/output terminal a of the switch circuit 303 and the input/output terminal b of the switch circuit 304, while the data line /GDB00 of the global data bus is connected to the input/output terminal /a of the switch circuit 303 and to the input/output terminal /b of the switch circuit 304.

On the other hand, the global data bus (GDB01. /GDB01) is connected to the input side of the sense buffer 63 and further to the output side of the write amplifier 67.

Further, the data line GDB10 forming the global data bus is connected to the input/output terminal a of the switch circuit 304 and to the input/output terminal b of the switch circuit 303 while the data line /GDB10 of the global data bus is connected to the input/output terminal /a of the switch circuit 304 and to the input/output terminal /b of the switch circuit 303.

On the other hand, the global data bus (GDB11. /GDB11) is connected to the input side of the sense buffer 65 and further to the output side of the write amplifier 69.

FIG. 22 shows the construction of the switch circuits 303 and 304. It will be noted that the switch circuit 303 includes an inverter 306 and analog switches 307–310 wherein the analog switches 307–310 includes p-channel MOS transistors 311–314 and n-channel MOS transistors 315–318.

Similarly, the switch circuit 304 includes an inverter 319 and analog switches 320–323, wherein the analog switches 320–323 includes p-channel MOS transistors 324–327 and n-channel MOS transistors 328–331.

The switch circuits 303 and 304 are supplied with a switch control signal SL4, wherein the switch control signal SL4 is set to a low level when the memory blocks A0, A1, B0, B1, C0 and C1 are to be selected. When the memory blocks D0 and D1 are to be selected, the switch control signal SL4 is set to have a high level.

In the event the switch control signal SL4 has a low level state, the analog switches 307, 309, 320 and 322 are turned ON, while the analog switches 308, 310, 321 and 323 are turned OFF.

As a result, the input/output terminal a and the input/output terminal c are connected in the switch circuits 303 and 304. Similarly, the input/output terminals /a and /c are connected. On the other hand, the input/output terminal b and the input/output terminal c are disconnected and the input/output terminal /b and the input/output terminal /c are disconnected in the switch circuits 303 and 304.

Thereby, the global data bus (GDB00, /GDB00) is connected, via the switch circuit 303, to the input terminal of the sense buffer 62 and further to the output terminal of the write amplifier 66. Similarly, the global data bus (GDB10, /GDB10) is connected to the input terminal of the sense buffer 64 and further to the output terminal of the write amplifier 68.

Thus, the input/output terminals 79–82 produce, in the read mode operation of the DRAM, respective output data according to the relationship of TABLE I when the foregoing switch control signal SL4 is set to a low level state.

Similarly, the input data DQ0–DQ3 on the input/output terminals 79–82 are, in the write mode operation of the DRAM, written into respective, corresponding memory cell columns of the selected memory blocks, according to the conventional relationship represented in TABLE II, provided that the switch control signal SL4 is set to the low level state irrespective of the selected memory blocks.

On the other hand, when the switch control signal SL4 is set to have a high level state, the analog switches 307, 309, 320 and 322 are all turned OFF while the analog switches 308, 310, 321 and 323 are all turned ON.

As a result, the input/output terminal b and the input output terminal c are connected with each other in the switch circuits 303 and 304. Further, the input/output terminal /b and the input/output terminal /c are connected with each other.

Thus, the global data bus (GDB00, /GDB00) is connected to the input terminal of the sense buffer 64 and further to the output terminal of the write amplifier 68 via the switch circuit 304. Similarly, the global data bus (GDB10, /GDB10) is connected to the input terminal of the sense buffer 62 and further to the output terminal of the write amplifier 66 via the switch circuit 303.

Thus, it is possible to read the data from the DRAM according to the relationship of TABLE III described before, by setting the switch control signal SL4 to have a low level state when the memory blocks are selected from the memory blocks A0 and A1, B0 and B1, and C0 and C1, or by setting the switch control signal SL4 to have a high level state when the memory blocks are selected from the memory blocks D0 and D1.

Thus, when reading data, it is possible to obtain the data Y0-0, Y0-1, Y1-0 and Y1-1 on the input/output terminals 79, 80, 81 and 82 respectively, by setting the switch control signal SL4 to have a low level state when the memory blocks Y0 and Y1 are selected from the memory blocks A0 and A1, B0 and B1, and C0 and C1, or by setting the switch control signal SL4 to have a high level state when the memory blocks D0 and D1 are to be selected for the memory blocks Y0 and Y1. Similarly as before, the data Y0-0, Y0-1, Y1-0 and Y1-1 correspond respectively to an odd number memory cell column in the selected memory block Y0, an even number memory cell column in the selected memory block Y0, an odd number memory cell column in the selected memory block Y1 and an even number memory cell column in the selected memory block Y1.

In the writing mode operation, too, it is possible to obtain the relationship of TABLE IV between the input/output terminals 79–82 and the memory cell column in which the data DQ0–DQ3, which are the input data supplied respectively to the terminals 79–82, are written, by setting the switch control signal SL4 to have a low level when selecting the memory blocks from the memory blocks A0 and A1, B0 and B1, and C0 and C1, or by setting the switch control signal SL4 to have a high level when selecting the memory blocks D0 and D1.

More specifically, the input data DQ0–DQ3 respectively on the data input/output terminals 79–83 are supplied such that the data D00 on the terminal 79 is written into an odd number memory cell column of the memory block Y0, the data DQ1 on the terminal 80 is written into an even number memory cell column of the memory block Y0, the data DQ2 on the terminal 81 is written into an odd number memory cell column of the memory block Y1 and the data DQ3 on the terminal 82 is written into an even number memory cell column of the memory block Y1, by setting the switch control signal SL4 to have a low level state when the memory blocks Y0 and Y1 are selected from the memory blocks A0 and A1, B0 and B1, and C0 and C1, or by setting the switch control signal SL4 to have a high level state when the memory blocks Y0 and Y1 are selected from the memory blocks D0 and D1.

Thus, according to the fourth embodiment of the present invention that uses the data transfer path switching circuit 302, it is possible to physically correlate the input/output terminals 79–82 with respective, corresponding memory cell columns selected from the memory blocks A0 and A1, B0 and B1, C0 and C1 and D0 and D1, by setting the switch control signal SL4 to have a low level state when the memory blocks are selected from the memory blocks A0 and A1, B0 and B1 and C0 and C1, or by setting the switch control signal SL4 to have a high level state when selecting the memory blocks D0 and D1. Thereby, the input/output terminals 79–82 correspond to the physical location of the memory cell columns in the selected memory blocks, and one can conduct an interference test of memory cells without using a switching software or using complicated circuitry for the hierarchical bus switches, or without increasing the chip area.

[Fifth Embodiment]

Figure 23:
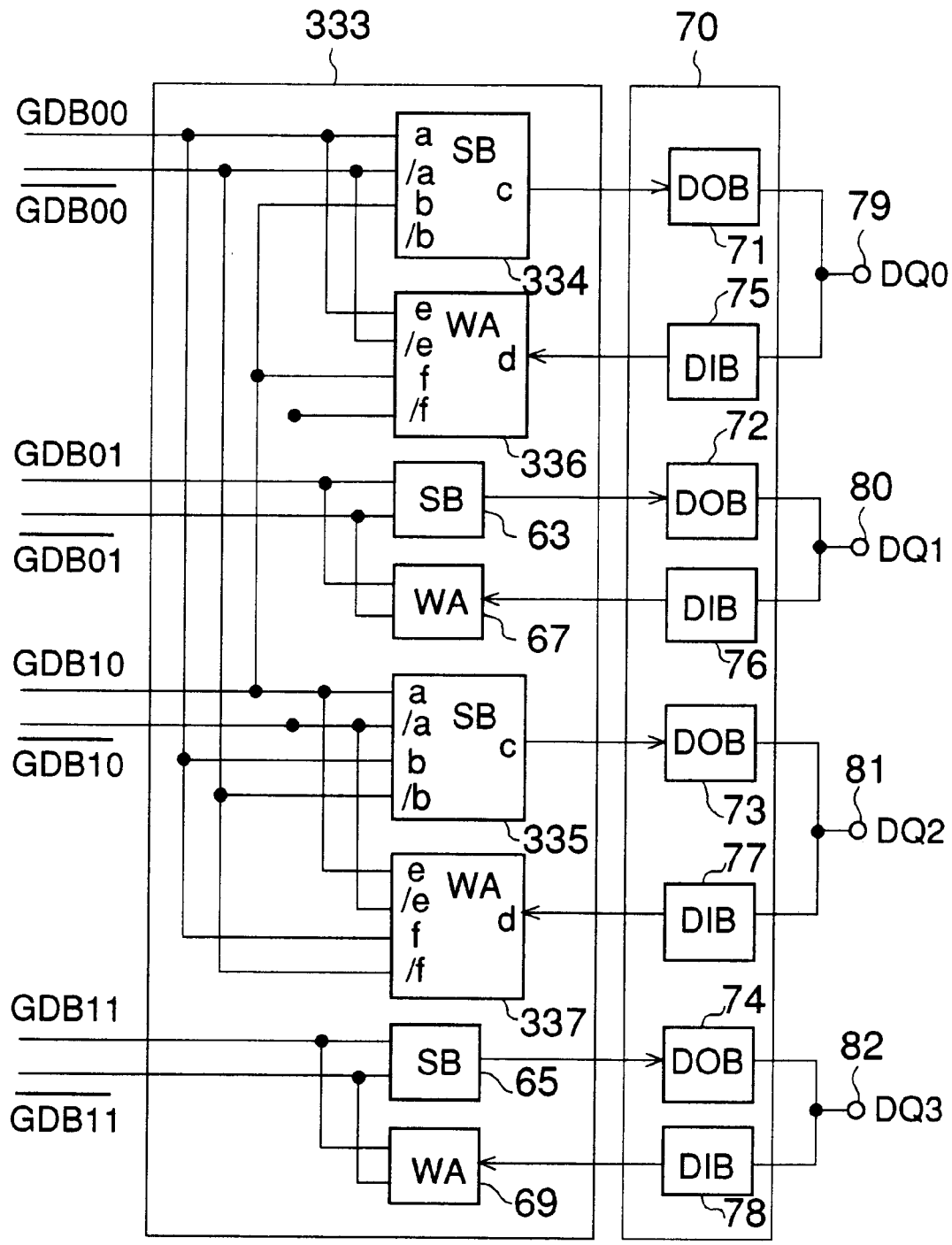
FIG. 23 is a block diagram similar to FIG. 13 showing a fifth embodiment of the present invention.
Figure 24:
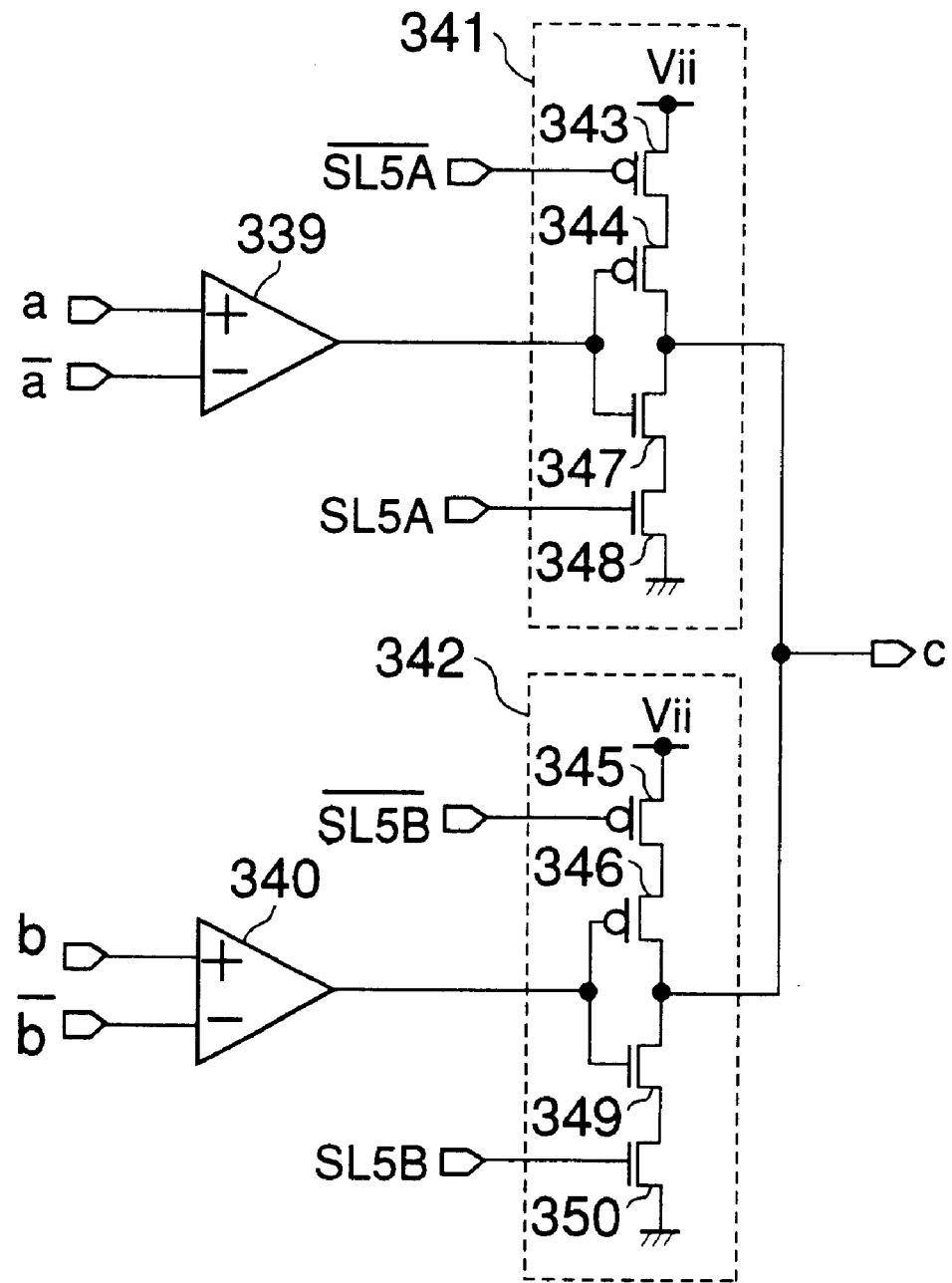
FIG. 24 is a circuit diagram showing a part of FIG. 23 in detail.
Figure 25:
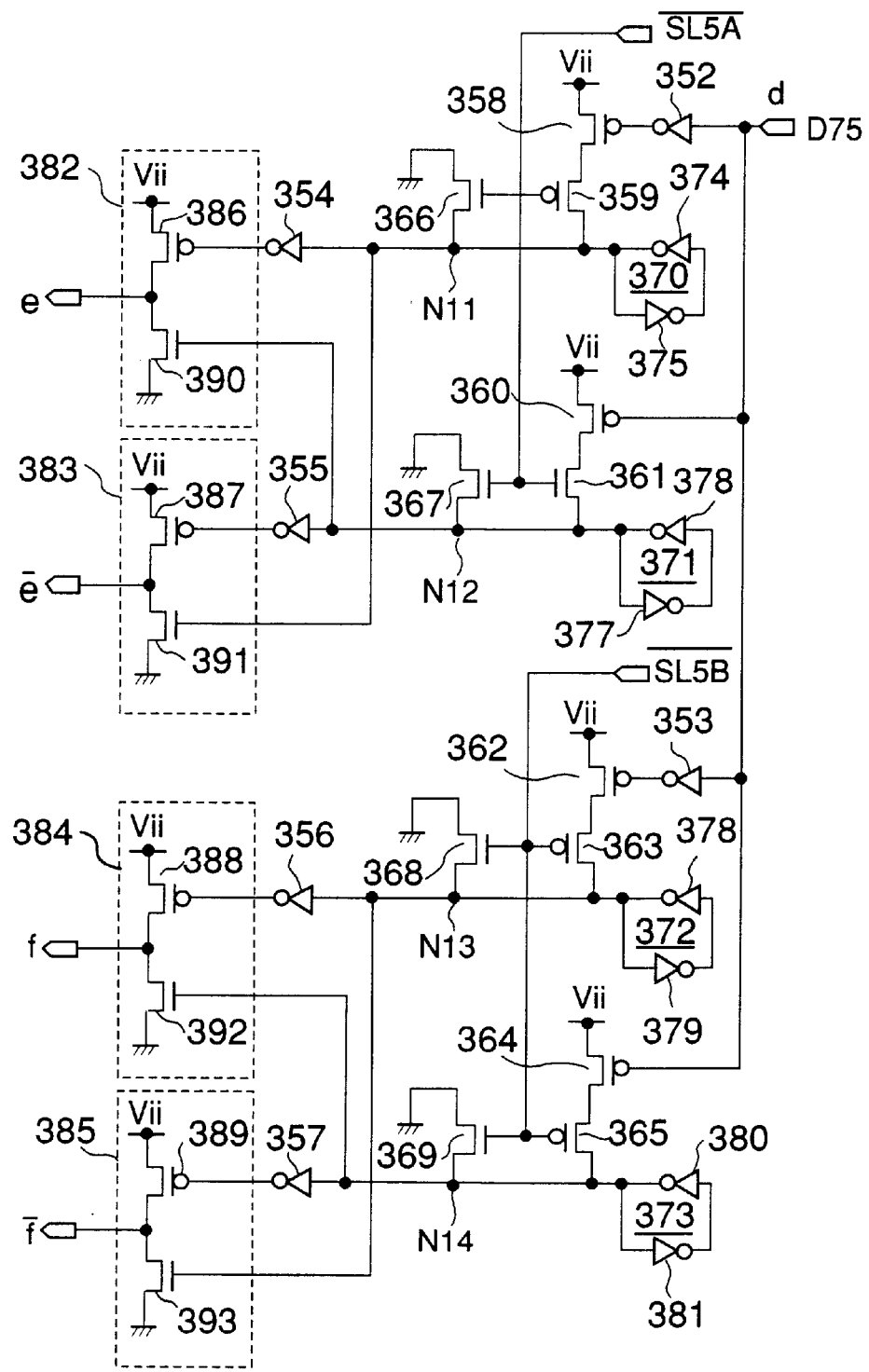
FIG. 25 is a circuit diagram showing a part of FIG. 23 in detail.

FIGS. 23–25 show the construction of a DRAM according to a fifth embodiment of the present invention, wherein those parts constructed identically to the previous embodiments are designated by the same reference numerals and the description thereof will be omitted.

Referring to FIG. 23, the present embodiment uses a read/write circuit 333 in place of the conventional read/write circuit 61 shown in FIG. 1, while the DRAM of the present embodiment is otherwise constructed substantially identical to the conventional device of FIG. 1.

In the construction of FIG. 23, the input/output circuit 333 includes sense buffers 334 and 335 that are different from the sense buffers 62 and 64 used in the input/output circuit 61 as well as write amplifiers 336 and 337 that are different from the write amplifiers 66 and 68 of the foregoing input/output circuit 61. Otherwise, the input/output circuit 333 is substantially identical to the conventional input/output circuit 61.

Referring to FIG. 23, it will be noted that each of the sense buffers 334 and 335 includes input terminals a, /a, b and /b and an output terminal c, while each of the write amplifiers 336 and 337 includes an input terminal d and output terminals e, /e, f and /f.

The data line GDB00 forming the global data bus (GDB00, /GDB00) is connected to the input terminal a of the sense buffer 334 and further to the input terminal b of the sense buffer 335, as well as to the output terminal e of the write amplifier 336 and the output terminal f of the write amplifier 337.

Further, the line /GDB00 of the global data bus (GDB00, /GDB00) is connected to the input terminal /a of the sense buffer 334 and the input terminal /b of the sense buffer 335 as well as to the output terminal /e of the write amplifier 336 and further to the output terminal /f of the write amplifier 337.

The global data bus (GDB01, /GDB01), on the other hand, is connected to the input terminal of the sense buffer 63 and to the output terminal of the write amplifier 67 similarly to the conventional device.

Further, the line GDB10 forming the global data bus (GDB10, /GDB10) is connected to the input terminal a of the sense buffer 335 as well as to the input terminal b of the sense buffer 334 and further to the output terminal e of the write amplifier 337 and the output terminal f of the write amplifier 336.

Further, the line /GDB10 of the global data bus (GDB10, /GDB10) is connected to the input terminal /a of the sense buffer 335 as well as to the input terminal /b of the sense buffer 334 and further to the output terminal /e of the write amplifier 337 and the by output terminal /f of the write amplifier 336.

The global data bus (GDB11, /GDB11), on the other hand, is connected to the input terminal of the sense buffer 65 and to the output terminal of the write amplifier 69 similarly to the conventional device.

FIG. 24 shows the construction of the sense buffer 334, wherein it will be noted that the sense buffer 335 has a substantially identical construction.

Referring to FIG. 24, the sense buffer 334 includes differential amplifiers 339 and 340 identical to the one used in the sense buffer 62 of FIG. 1 or 8, in addition to inverters 341 and 342 forming a data transfer path switching circuit, wherein the inverters 341 and 342 includes p-channel MOS transistors 343–346 and n-channel MOS transistors 347–350.

The sense buffer 334 is thereby supplied with switch control signals /SL5A, SL5A, /SL5B and SL5B, such that the control signals /SL5A, SL5A, /SL5B and SL5B assume respectively a low level state, a high level state, a high level state and a low level state when the memory blocks A0, A1, B0, B1, C0 and C1 are selected. In the case the memory blocks D0 and D1 be selected, the switch control signals /SL5A, SL5A, /SL5B and SL5B are set to have a high level state, a low level state, a low level state and a high level state, respectively.

It will be noted that the p-channel MOS transistor 343 is turned ON, the n-channel MOS transistor 348 is turn ON, the p-channel MOS transistor 345 is turned OFF and the n-channel MOS transistor 350 is turned OFF when the foregoing switch control signals /SL5A, SL5A, /SL5B and SL5B are set to have a low level state, a high level state, a high level state and a low level state respectively. In correspondence to this, the inverter 341 is activated while the inverter 342 is deactivated.

Thus, as a result of the foregoing operation of the inverters 341 and 342, the sense buffer 334 functions as a sense buffer for the data on the global data bus (GDB00, /GDB00) while it does not function so for the data on the global data bus (GDB10, /GDB10). Similarly, the sense buffer 335 functions as a sense buffer for the data on the global data bus (GDB10, /GDB10) while it does not function so for the data on the global data bus (GDB00, /GDB00).

Thus, the data transmitted through the global data bus (GDB00, /GDB00) is forwarded to the data output buffer 71 via the sense buffer 334. Similarly, the data transmitted through the global data bus (GDB10, /GDB10) is forwarded to the data output buffer 73 via the sense buffer 335.

Thus, the conventional relation of TABLE I holds between the input/output terminals 79–82 and the memory cell columns from which the data is read out to the terminals 79–82, as long as the switch control signals /SL5A, SL5A, /SL5B and SL5B are set respectively to have a low level state, a high level state, a high level state and a low level state, irrespective of the selected memory blocks.

On the other hand, when the switch control signals /SL5A, SL5A, /SL5B and SL5B are set respectively to high level, low level, low level and high level, the p-channel MOS transistor 343 is turned OFF, the n-channel MOS transistor 348 is turned OFF, the p-channel MOS transistor 345 is turned ON and the n-channel MOS transistor 350 is turned ON. In response to this, the inverter 341 is deactivated while the inverter 342 is activated.

In such a sate, the sense buffer 334 functions as a sense buffer for the data on the global data bus (GDB10, /GDB10) while it does not function so for the data on the global data bus (GDB00, /GDB00).

On the other hand, the sense buffer 335 functions as a sense buffer for the data on the global data bus (GDB00, /GDB00) while it does not function so for the data on the global data bus (GDB10, /GDB10).

Thus, the data transmitted through the global data bus (GDB00, /GDB00) is forwarded to the data output buffer 73 via the sense buffer 335, while the data transmitted through the global data bus (GDB10, /GDB10) is forwarded to the data output buffer 71 via the sense buffer 334.

Summarizing above, it is possible to impose a relationship of TABLE III between the input/output terminals 79–82 and the memory cell columns in the selected memory blocks, by setting the switch control signals /SL5A, SL5A, /SL5B and /SL5B respectively to have a low level state, a high level state, a high level state and a low level state when selecting the memory blocks from the memory blocks A0 and A1, B0 and B1, C0 and C1, and further by setting the switch control signals /SL5A, SL5A, /SL5B and /SL5B respectively to have a high level state, a low level state, a low level state and a high level state when selecting the memory blocks D0 and D1.

Thus, the switch control signals /SL5A, SL5A, /SL5B and /SL5B are respectively set to a low level state, a high level state, a high level state and a low level state when reading data from the memory blocks Y0 and Y1 selected from the memory blocks A0 and A1, B0 and B1, C0 and C1, or by setting the switch control signals /SL5A, SL5A, /SL5B and /SL5B respectively to have a high level state, a low level state, a low level state and a high level state when reading data from the memory blocks D0 and D1 selected for the memory blocks Y0 and Y1. In any of these cases, the data Y0-0, Y0-1, Y1-0 and Y1-1 are obtained respectively at the input/output terminals 79, 80, 81 and 82.

FIG. 25 shows the construction of the write amplifier 336. It should be noted that the write amplifier 337 is configured similarly.

Referring to FIG. 25, the write amplifier 336 includes inverters 352–357, p-channel MOS transistors 358–365, n-channel MOS transistors 366–369 and latch circuits 370–373, wherein the latch circuits 370–373 include inverters 374–381.

Further, the write amplifier 336 includes output circuits 382–385, wherein the output circuits 382–385 include p-channel MOS transistors 386–389 and n-channel MOS transistors 390–393. It should be noted that the output circuits 382–385 form a part of the data transfer path switching circuit.

Thus, it will be noted that the p-channel MOS transistors 359 and 361 are turned ON, the n-channel MOS transistors 366 and 367 are turned OFF, the p-channel MOS transistors 363 and 365 are turned OFF and the n-channel MOS transistors 368 and 369 are turned ON, when the switch control signals /SL5A and /SL5B are respectively set to a low level state and a high level state.

As a result, the node N11 assumes a level identical to the output 75 of the data input buffer 75, while the node N12 assumes a logic inversion level of the output D75 of the data input buffer 75. Further, the nodes N13 and 14 assume a low level state.

Thus, in the output circuits 382 and 383, the p-channel MOS transistor 386 is turned ON, the n-channel MOS transistor 390 is turned OFF, the p-channel MOS transistor 387 is turned OFF and the n-channel MOS transistor 391 is turned ON when the output D75 of the data output 75 has a high level state. In response thereto, there appears a high level state in the output terminal e and a low level state in the conjugate output terminal /e.

On the other hand, when the output D75 of the data output buffer 75 has a low level state, the p-channel MOS transistor 386 is turned OFF, the n-channel MOS transistor 390 is turned ON, the p-channel MOS transistor 387 is turned ON, and the n-channel MOS transistor 391 is turned OFF. Thereby, a low level state and a high level state appear respectively on the output terminal e and on the output terminal /e.

On the other hand, in the output circuits 384 and 385, the p-channel MOS transistors 388 and 389 are both turned OFF while the n-channel MOS transistors 392 and 393 are both turned OFF. Thereby, there appears a high impedance state both on the output terminals f and /f.

Thus, it will be noted that the write amplifier produces, in response to the output D75 of the data input buffer 75, complementary signals of the output D75, wherein the complementary signals thus produced are supplied respectively to the data lines GDB00 and /GDB00 forming the global bus (GDB00, /GDB00).

On the other hand, the write amplifier 337 produces complementary signals of the output D77 of the data input buffer 77 and supplies the complementary signals thus obtained respectively to the line GDB10, /GDB10 of the global data bus (GDB10, /GDB10).

Thus, when writing data, one obtains a relationship identical to that of TABLE II described before, between the data DQ0–DQ3 on the input/output terminals 79–82 and the memory cell column in which the data DQ0–DQ3 is written, provided that the switch control signals /SL5A and /SL5B are set respectively to a low level state and a high level state.

When the switch control signals /SL5A and /SL5B are set to have a high level state and a low level state respectively, on the other hand, the p-channel MOS transistors 359 and 361 are turned OFF, the n-channel MOS transistors 366 and 367 are turned ON, the p-channel MOS transistors 363 and 365 are turned ON, and the n-channel MOS transistors 368 and 369 are turned OFF.

As a result, there appears a low level state on the nodes N11 and N12, while the node N13 assumes a level identical to the level of the output D75 of the data input buffer 75. Further, the node N14 assumes a logic inversion of the output D75 of the data input buffer 75.

Thus, it will be noted that the p-channel MOS transistors 386 and 387 are both turned OFF in the output circuits 382 and 383, while the n-channel MOS transistors 390 and 391 are both turned OFF. Thereby, there appears a high impedance state on the output terminals e and /e.

In the output circuits 384 and 385, on the other hand, the p-channel MOS transistor 388 is turned ON, the n-channel MOS transistor 392 is turned OFF, the p-channel MOS transistor 389 is turned OFF and the n-channel MOS transistor 393 is turned ON, when the output D75 of the data input buffer 75 has a high level state.

Thus, the write amplifier 336 produces complementary logic outputs from the output D75 of the data input buffer 75 and supplies the same to the data lines GDB10 and /GDB10 forming the global data bus (GDB10, /GDB10).

Similarly, the write amplifier 337 produces complementary logic outputs from the output D77 of the data input buffer 75 and supplies the same to the data lines GDB00 and /GDB00 forming the global data bus (GDB00, /GDB00).

Thus, the writing is made according to the relationship of TABLE IV explained with reference to the first embodiment of the present invention, between the input/output terminals 79–82 and the memory cell columns into which the data DQ0–DQ3 on the input/output terminals 79–82 are written, by setting the switch control signals /SL5A and /SL5B respectively to the low level state and the high level state when the memory blocks are selected from the memory blocks A0 and A1, B0 and B1, and C0 and C1, or by setting the switch control signals /SL5A and /SL5B respectively to the high level state and the low level state when the memory blocks D0 and D1 are selected.

More specifically, the data DQ0–DQ3 on the input/output terminals 79–82 are written respectively into an odd number memory cell column of the memory block Y0, an even number memory cell column of the memory block Y0, an odd number memory cell column of the memory block Y1 and an even number memory cell column of the memory block Y1, by setting the switch control signals /SL5A and /SL5B respectively to the low level state and the high level state when the memory blocks Y0 and Y1 are selected from the memory blocks A0 and A1, B0 and B1, and C0 and C1, or by setting the switch control signals /SL5A and /SL5B respectively to the high level state and the low level state when the memory blocks D0 and D1 are selected for the memory blocks Y0 and Y1.

Thus according to the fifth embodiment of the present invention in which each of the sense buffers 334 and 335 as well as the write amplifiers 336 and 337 forms a part of the data transfer path switching circuit, it is possible to physically correlate the input/output terminals 79–82 with respective, corresponding memory cell columns of the memory blocks A0, A1, B0, B1, C0 and C1, by setting the switch control signals /SL5A, SL5A, /SL5B and SL5B respectively to have a low level state, a high level state, a high level state and a low level state when the memory blocks are selected from the memory blocks A0 and A1, B0 and B1 and C0 and C1, or by setting the switch control signals /SL5A, SL5A, /SL5B and SL5B respectively to have a high level state, a low level state, a low level state and a high level state when selecting the memory blocks D0 and D1. Thereby, the input/output terminals 79–82 correspond to the physical location of the memory cell columns in the selected memory blocks, and one can conduct an interference test of memory cells without using a switching software or using complicated circuitry for the hierarchical bus switches, or without increasing the chip area.

[Sixth Embodiment]

Figure 26:
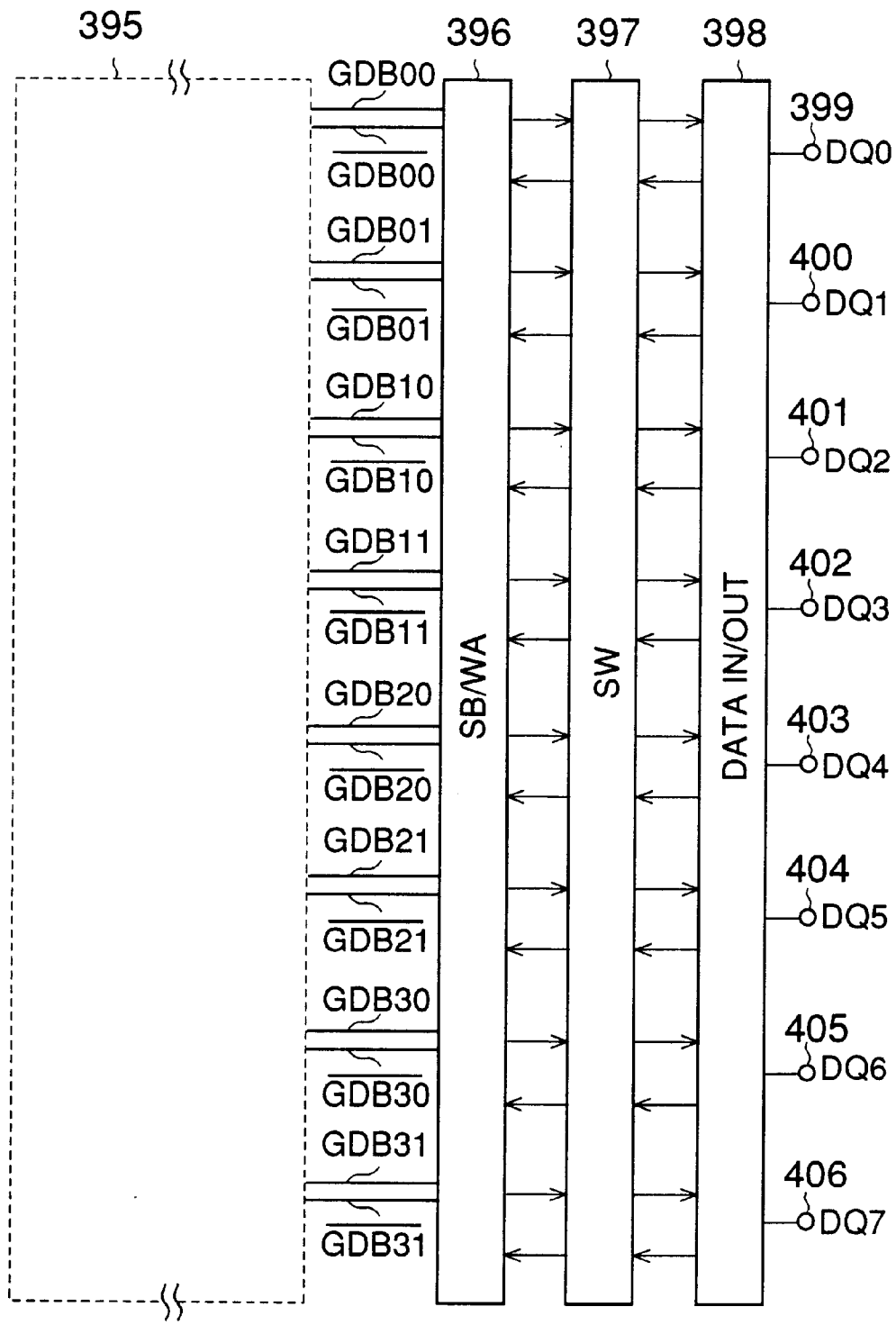
FIG. 26 is a block diagram showing the overall construction of a DRAM according to a sixth embodiment of the present invention.

FIG. 26 shows the overall construction of a DRAM according to a sixth embodiment of the present embodiment.

Referring to FIG. 26, it will be noted that the DRAM includes a core area 395 to which a read/write circuit 396 is connected by a global data bus GDB00–/GDB31, wherein the read/write circuit 396 is further connected to an input/output circuit 398 via a data transfer path switching circuit 397. Thereby, the input/output circuit 398 have input/output terminals 399–406 and supplies data DQ0–DQ7 thereon, in the write mode operation of the DRAM, to the read/write circuit 396 via the data transfer path switching circuit 397, wherein the data DQ0–DQ7 is written into a corresponding address of the core area 395 via the global data bus (GDB00–/GDB31). In the read mode operation, the data DQ0–DQ7 are read out from respective selected addresses of the core area 395 and are forwarded to the read/write circuit via the global data bus (GDB00–/GDB31). The data thus read out are further forwarded to the input/output circuit 398 via the data transfer path switching circuit 397.

Figure 27:
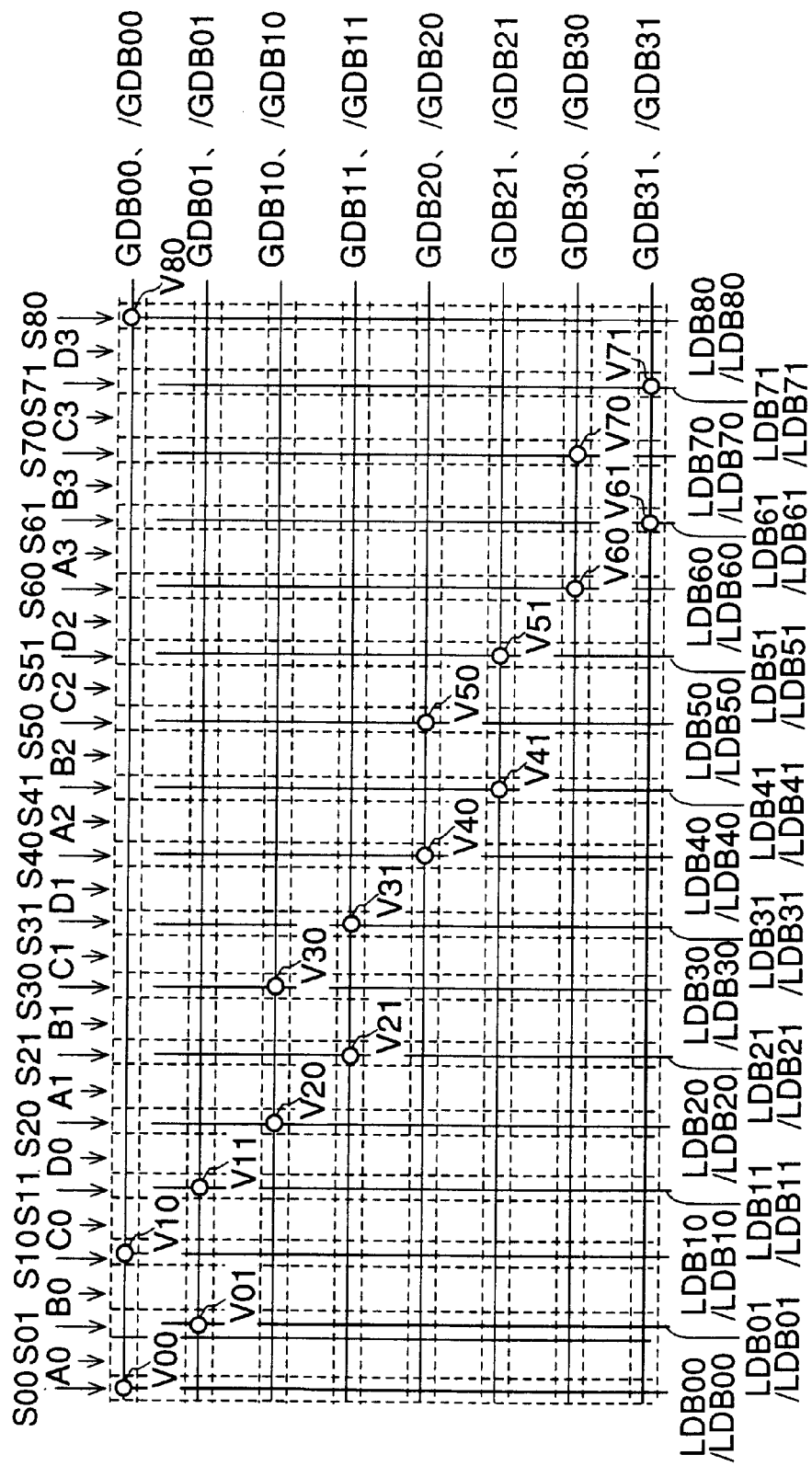
FIG. 27 is a plan view showing a part of FIG. 26 in detail.

FIG. 27 shows a part of the core area 395 in a plan view.

Referring to FIG. 27, it will be noted that the core area 395 includes memory blocks A0–A3 commonly having a block address [00], memory blocks B0–B3 commonly having a block address [01], memory blocks C0–C3 commonly having a block address [10], and memory blocks D0–D3 commonly having a block address [11].

Further, the core area 395 includes a sense amplifier column S00 formed of a number of sense amplifiers each corresponding to an odd number bit line pair included in the memory block A0 and a sense amplifier column S01 formed of a number of sense amplifiers each corresponding to an even number bit line pair of the memory block A0 as well as the memory block B0.

Further, the core area 395 includes a sense amplifier column S10 formed of a number of sense amplifiers each corresponding to an odd number bit line pair included in the memory blocks B0 and C0 and a sense amplifier column S11 formed of a number of sense amplifiers each corresponding to an even number bit line pair of the memory blocks C0 and D0.

Further, the core area 395 includes a sense amplifier column S20 formed of a number of sense amplifiers each corresponding to an odd number bit line pair included in the memory blocks D0 and A1 and a sense amplifier column S21 formed of a number of sense amplifiers each corresponding to an even number bit line pair of the memory blocks A1 and B1.

Further, the core area 395 includes a sense amplifier column S30 formed of a number of sense amplifiers each corresponding to an odd number bit line pair included in the memory blocks B1 and C1 and a sense amplifier column S31 formed of a number of sense amplifiers each corresponding to an even number bit line pair of the memory blocks C1 and D1.

Further, the core area 395 includes a sense amplifier column S40 formed of a number of sense amplifiers each corresponding to an odd number bit line pair included in the memory blocks D1 and A2 and a sense amplifier column S41 formed of a number of sense amplifiers each corresponding to an even number bit line pair of the memory blocks A2 and B2.

Further, the core area 395 includes a sense amplifier column S50 formed of a number of sense amplifiers each corresponding to an odd number bit line pair included in the memory blocks B2 and C2 and a sense amplifier column S51 formed of a number of sense amplifiers each corresponding to an even number bit line pair of the memory blocks C2 and D2.

Further, the core area 395 includes a sense amplifier column S60 formed of a number of sense amplifiers each corresponding to an odd number bit line pair included in the memory blocks D2 and A3 and a sense amplifier column S61 formed of a number of sense amplifiers each corresponding to an even number bit line pair of the memory blocks A3 and B3.

Further, the core area 395 includes a sense amplifier column S70 formed of a number of sense amplifiers each corresponding to an odd number bit line pair included in the memory blocks B3 and C3 and a sense amplifier column S71 formed of a number of sense amplifiers each corresponding to an even number bit line pair of the memory blocks C3 and D3.

Further, the core area 395 includes a sense amplifier column S80 formed of a number of sense amplifiers each corresponding to an odd number bit line pair included in the memory block D3.

Further, the core area 395 includes a number of local buses (LDBj0, /LDBj0; j=0 or 1–8) provided in correspondence to the sense amplifier array Bj0, and a number of local buses (LDBk1, /LDBk1; k=0 or 1–7) corresponding to the sense amplifier array Sk1.

Further, the core area 395 includes a global data bus (GDBi0, /GDBi0) and a global data bus (GDBi1, /GDBi1) (i=0 or 1–3), as well as hierarchical data bus switches Vj0, Vk1 cooperating therewith.

Figure 2:
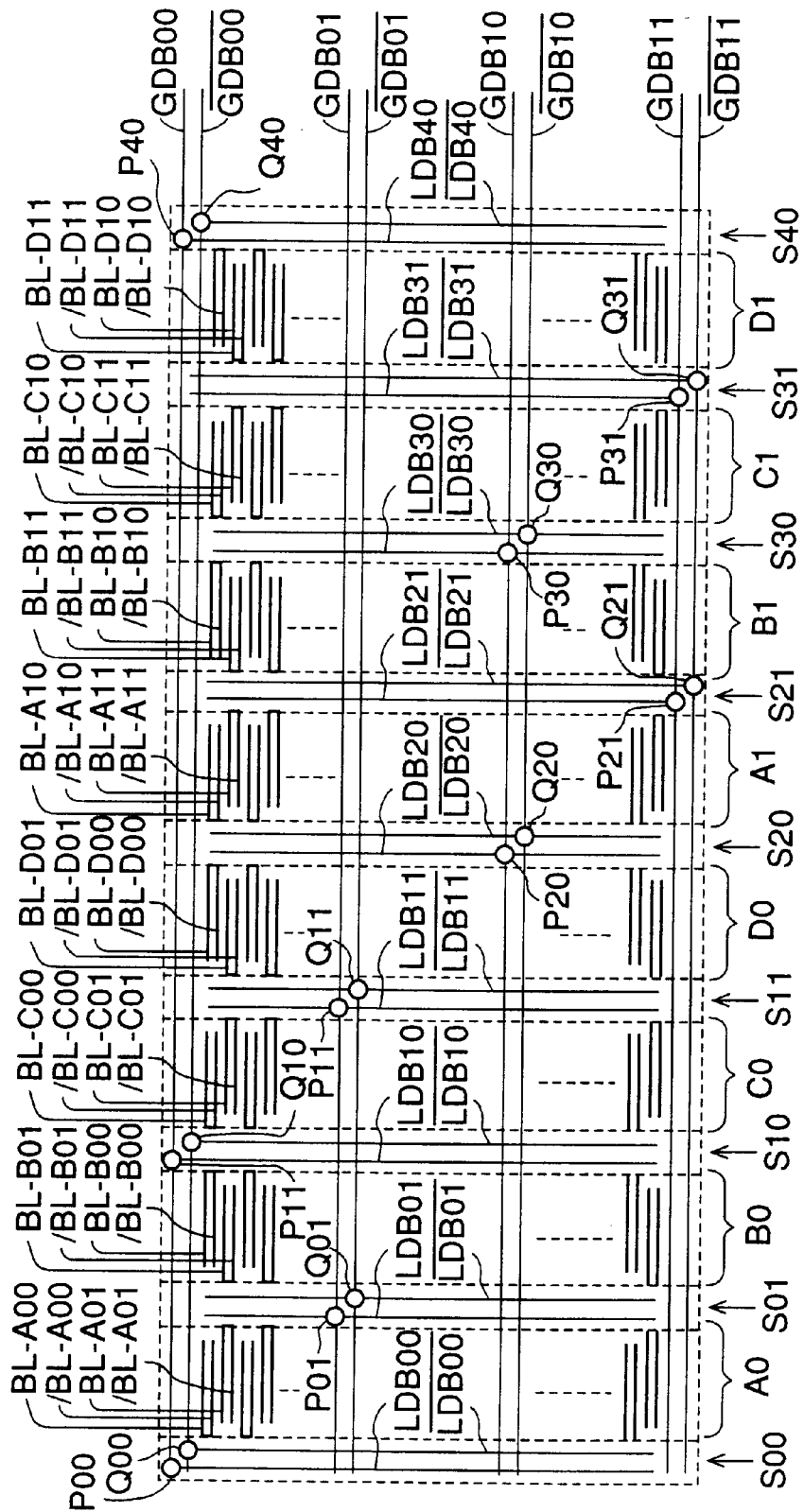
FIG. 2 is a diagram showing a part of FIG. 1 in detail.
Figure 3:
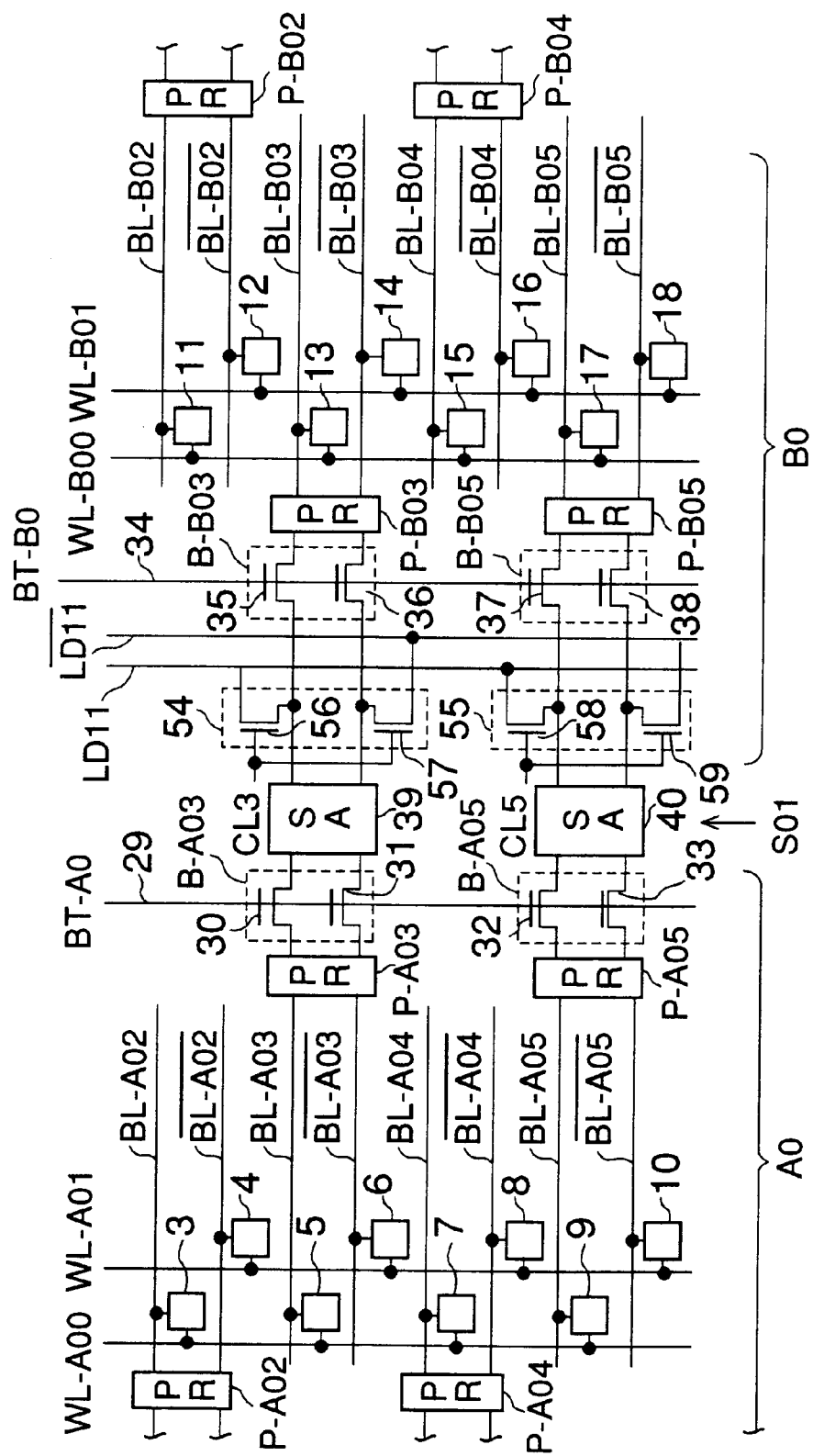
FIG. 3 is a block diagram showing a part of FIG. 2.
Figure 4:
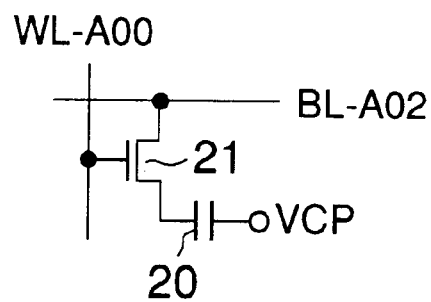
FIG. 4 is a circuit diagram showing a part of FIG. 3.
Figure 5:
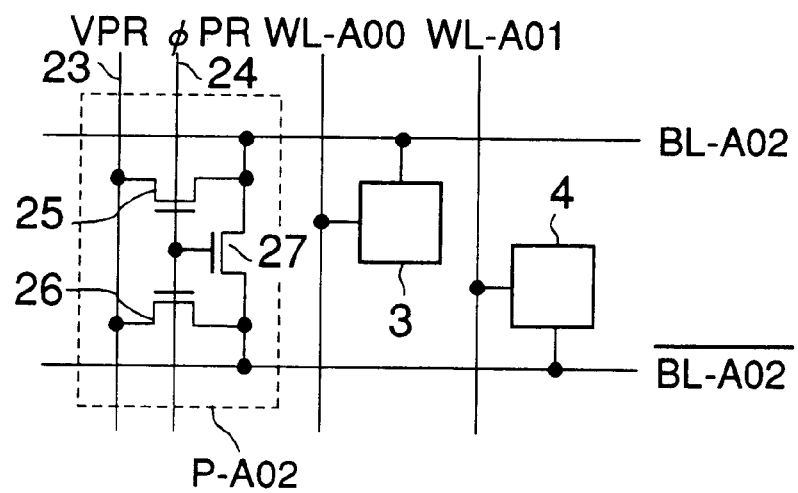
FIG. 5 is a circuit diagram showing a part of FIG. 3.
Figure 6:
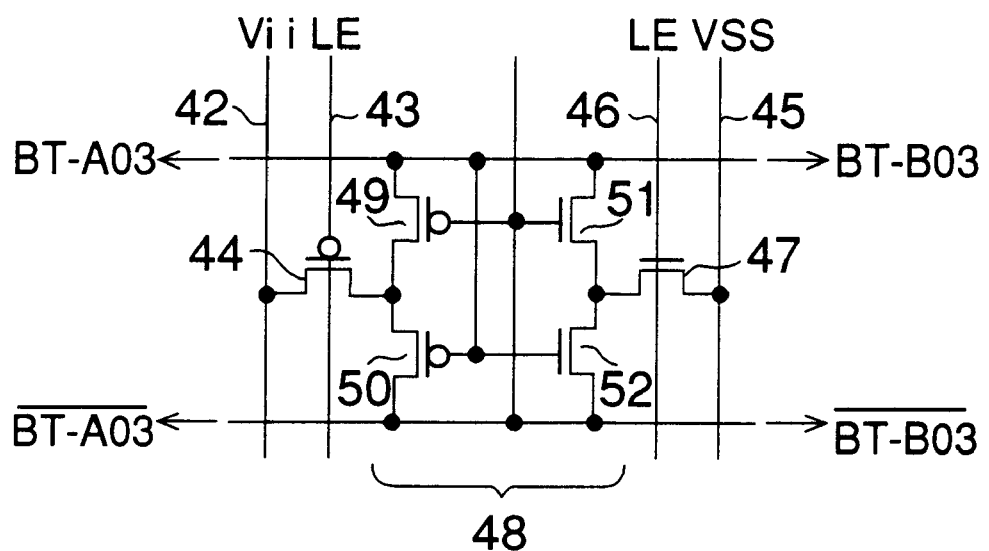
FIG. 6 is a circuit diagram showing a part of FIG. 3.
Figure 7:
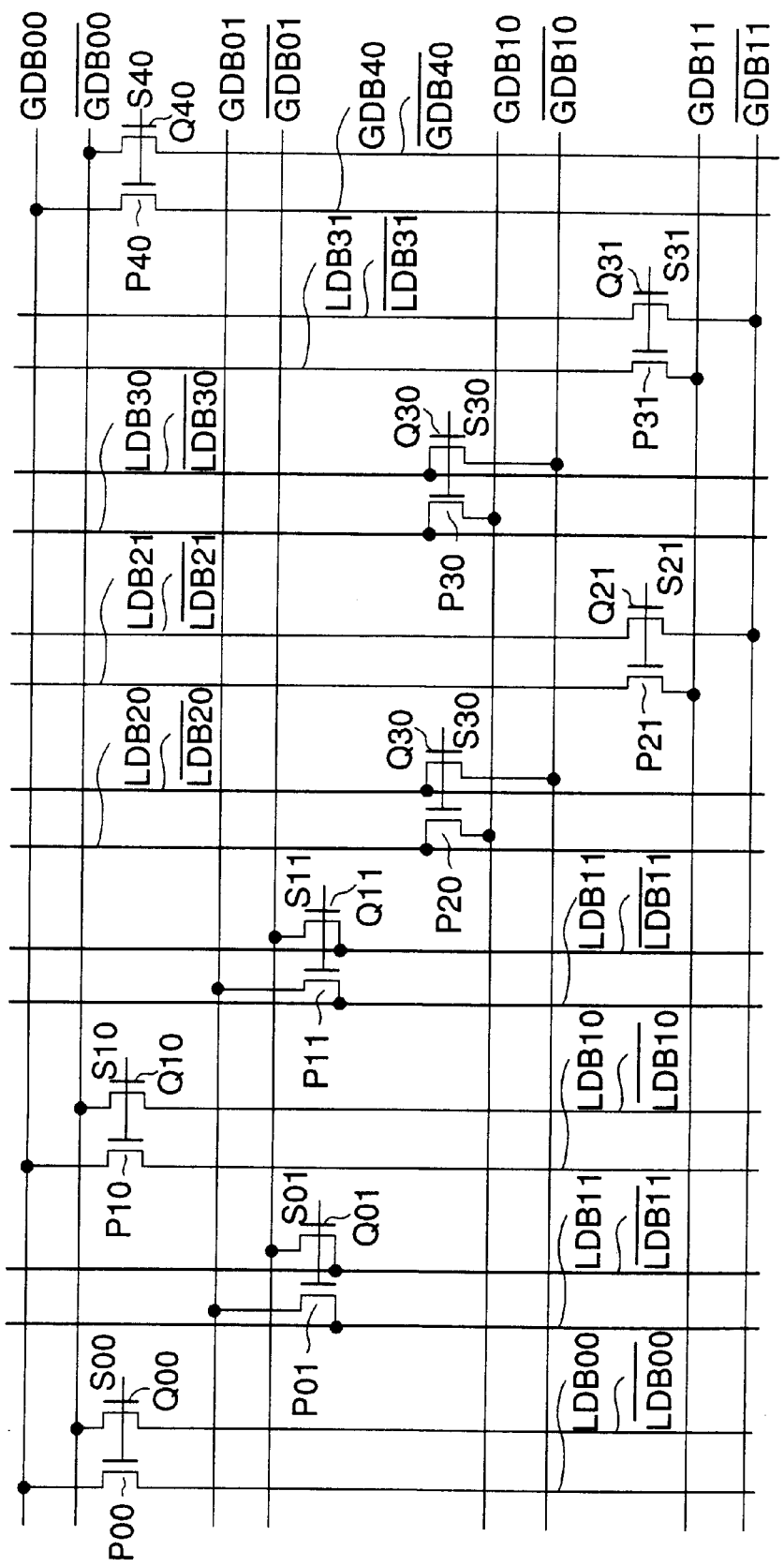
FIG. 7 is a diagram showing the construction of hierarchical data bus switch shown in FIG. 2.

Thus, it will be noted that the core area 395 is a modification of the core area 1 of FIG. 2 modified such that the core area 395 can store eight bit data in place of the four bit data for the core area 1.

Figure 28:
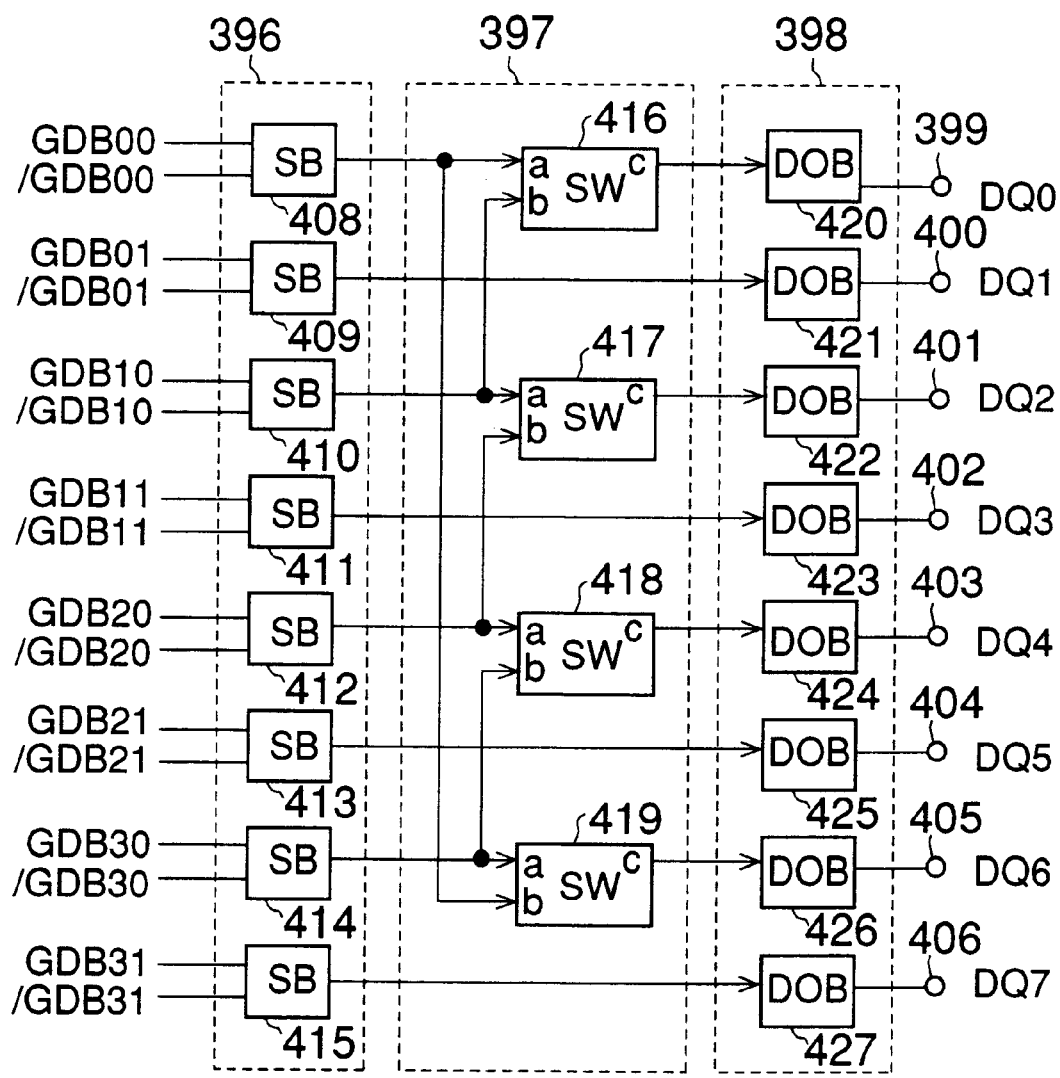
FIG. 28 is a block diagram showing a part of FIG. 26 in detail.

FIG. 28 shows the construction of the read write circuit 396, the data transfer path switching circuit 397 and the input/output circuit 398 particularly for the part related to the data output path.

Referring to FIG. 28, the read write circuit 396 includes an array of sense buffers 408–415 each having a similar construction of the sense buffers 62 of FIG. 1 or 8.

Figure 9:
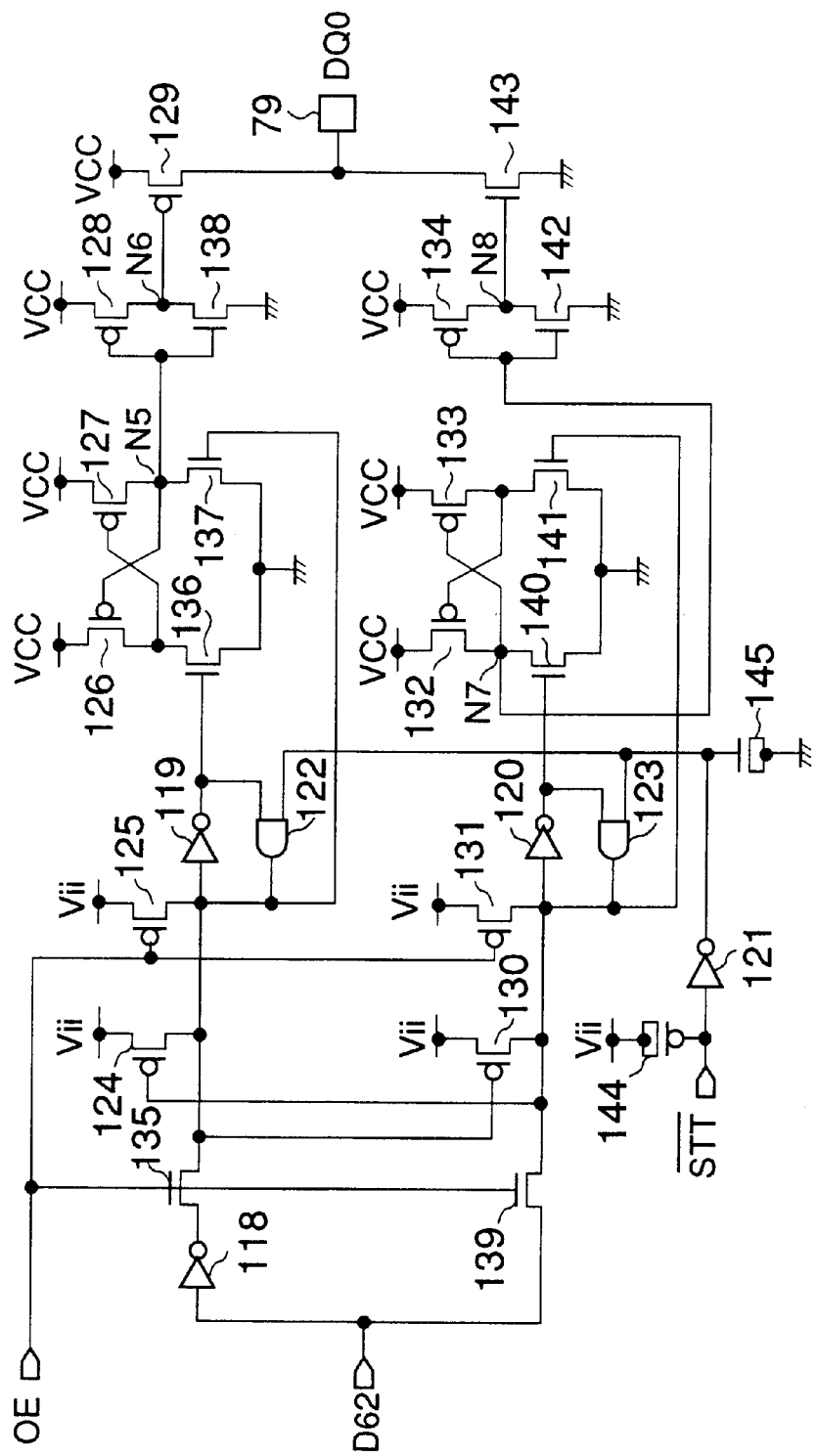
FIG. 9 is a circuit diagram showing the construction of a data output buffer shown in FIG. 1.

Further, the data transfer path switching circuit 397 includes an array of switch circuits 416–419, while the input/output circuits 398 includes an array of data output buffers 420–427 each having a construction identical to the data output buffer 71 of FIG. 1 or 9.

It should be noted that each of the switch circuits 416–419 includes input terminals a and b and an output terminal c, and the output terminal of the sense buffer 408 is connected to the input terminal a of the switch circuit 416 as well as to the input terminal b of the switch circuit 419. Further, the output terminal of the sense buffer 409 is connected to the input terminal of the data output buffer 421.

Further, the output terminal of the sense buffer 410 is connected to the input terminal a of the switch circuit 417 as well as to the input terminal b of the switch circuit 416. Further, the output terminal of the sense buffer 411 is connected to the input terminal of the data output buffer 423.

Further, the output terminal of the sense buffer 412 is connected to the input terminal a of the switch circuit 418 as well as to the input terminal b of the switch circuit 417. Further, the output terminal of the sense buffer 413 is connected to the input terminal of the data output buffer 425.

Further, the output terminal of the sense buffer 414 is connected to the input terminal a of the switch circuit 419 as well as to the input terminal b of the switch circuit 418. Further, the output terminal of the sense buffer 415 is connected to the input terminal of the data output buffer 427.

Further, the output terminal c of the switch circuit 416 is connected to the input terminal the data output buffer 420, while the output terminal c of the switch circuit 417 is connected to the input terminal of the data output buffer 422.

Further, the output terminal c of the switch circuit 418 is connected to the input terminal of the data output buffer 424, while the output terminal c of the switch circuit 419 is connected to the input terminal of the data output buffer 426.

FIG. 29 shows the construction of the switch circuits 416–419.

Referring to FIG. 29, it will be noted that the switch circuit 416 includes an inverter 429 and analog switch circuits 430 and 431, wherein the analog switch circuits 430 and 431 includes p-channel MOS transistors 432 and 433 and n-channel MOS transistors 434 and 435.

Further, the switch circuit 417 includes an inverter 436 and analog switch circuits 437 and 438, wherein the analog switch circuits 437 and 438 includes p-channel MOS transistors 439 and 440 and n-channel MOS transistors 441 and 442.

Further, the switch circuit 418 includes an inverter 443 and analog switch circuits 444 and 445, wherein the analog switch circuits 444 and 445 includes p-channel MOS transistors 446 and 447 and n-channel MOS transistors 448 and 449.

Further, the switch circuit 419 includes an inverter 450 and analog switch circuits 451 and 452, wherein the analog switch circuits 451 and 452 includes p-channel MOS transistors 453 and 454 and n-channel MOS transistors 455 and 456.

From FIG. 29, it will be noted that each of the switch circuits 416–419 is supplied with a switch control signal SL6, wherein the switch control signal SL6 is set to a low level state when the memory blocks A0–A3, B0–B3 and C0–C3 are to be selected. When the memory blocks D0–D3 are to be selected, on the other hand, the switch control signal SL6 is set to have a high level state.

When the foregoing switch control signal SL6 is set to the low level state, the analog switch circuits 430, 437, 444 and 451 are turned ON while the analog switches 431, 438, 445 and 452 are turned OFF.

Thus, in each of the switch circuits 416–419, the input terminal a is connected to the output terminal c while the input terminal b and the output terminal c are disconnected from each other.

As a result of this, the output terminal of the sense buffer 408 is connected to the input terminal of the data output buffer 420 via the switch circuit 416. Similarly, the output terminal of the sense buffer 410 is connected to the input terminal of the data output buffer 422 via the switch circuit 417.

Further, the output terminal of the sense buffer 412 is connected to the input terminal of the data output buffer 424 via the switch circuit 418, and the output terminal of the sense buffer 414 is connected to the input terminal of the data output buffer 426 via the switch circuit 419.

Thus, there holds a relationship shown in TABLE VI below in the reading mode operation between the selected memory blocks and the output data obtained at the input/output terminals 399–406 when the switch control signal SL6 is set to have a low level state irrespective of the selected memory blocks.

In TABLE V below, data Ai-0, Bi-0, Ci-0 and Di-0 represent the data of an odd number column selected from the memory blocks Ai, Bi, Ci and Di. Further, data Ai-1, Bi-1, Ci-1 and Di-1 represent the data of an even number column selected from the memory blocks Ai, Bi, Ci and Di.

Further, the output terminal of the sense buffer 412 is connected to the input terminal of the output buffer 422 via the switch circuit 417, and the output terminal of the sense buffer 414 is connected to the input terminal of the output buffer 424 via the switch circuit 418.

Thus, one obtains a relationship of TABLE VI below between the data obtained at the input/output terminals 399–406 and selected memory blocks in the reading mode operation of the DRAM, by setting the switch control signal SL6 to have a low level state when selecting the memory blocks from the memory blocks A0–A3, B0–B3 and C0–C3 and by setting the switch control signal SL6 to a high level state when selecting the memory blocks D0–D3.

TABLE V

| SELECTED MEM BLK | DATA AT 399 | DATA AT 400 | DATA AT 401 | DATA AT 402 | DATA AT 403 | DATA AT 404 | DATA AT 405 | DATA AT 406 |
|---|---|---|---|---|---|---|---|---|
| A0-A3 | A0-0 | A0-1 | A1-0 | A1-1 | A2-0 | A2-1 | A3-0 | A3-1 |
| B0-B3 | B0-0 | B0-1 | B1-0 | B1-1 | B2-0 | B2-1 | B3-0 | B3-1 |
| C0-C3 | C0-0 | C0-1 | C1-0 | C1-1 | C2-0 | C2-1 | C3-0 | C3-1 |
| D0-D3 | D0-0 | D0-1 | D1-0 | D1-1 | D2-0 | D2-1 | D3-0 | D3-1 |

Thus, it is possible to obtain, when selecting the memory blocks Y0–Y3, the output data Y0-0, Y0-1, Y1-0, Y1-1, Y2-0, Y2-1, Y3-0 and Y3-1 respectively on the input/output terminals 399, 400, 401, 402, 403, 404, 405 and 406, by setting the switch control signal SL6 to have a low level state when the memory blocks Y0–Y3 are selected from the memory blocks A0–A3, B0–B3 and C0–C3, and further by setting the switch control signal SL6 to have a high level state when the memory blocks D0–D3 are selected for the memory blocks Y0–Y3.

Figure 30:
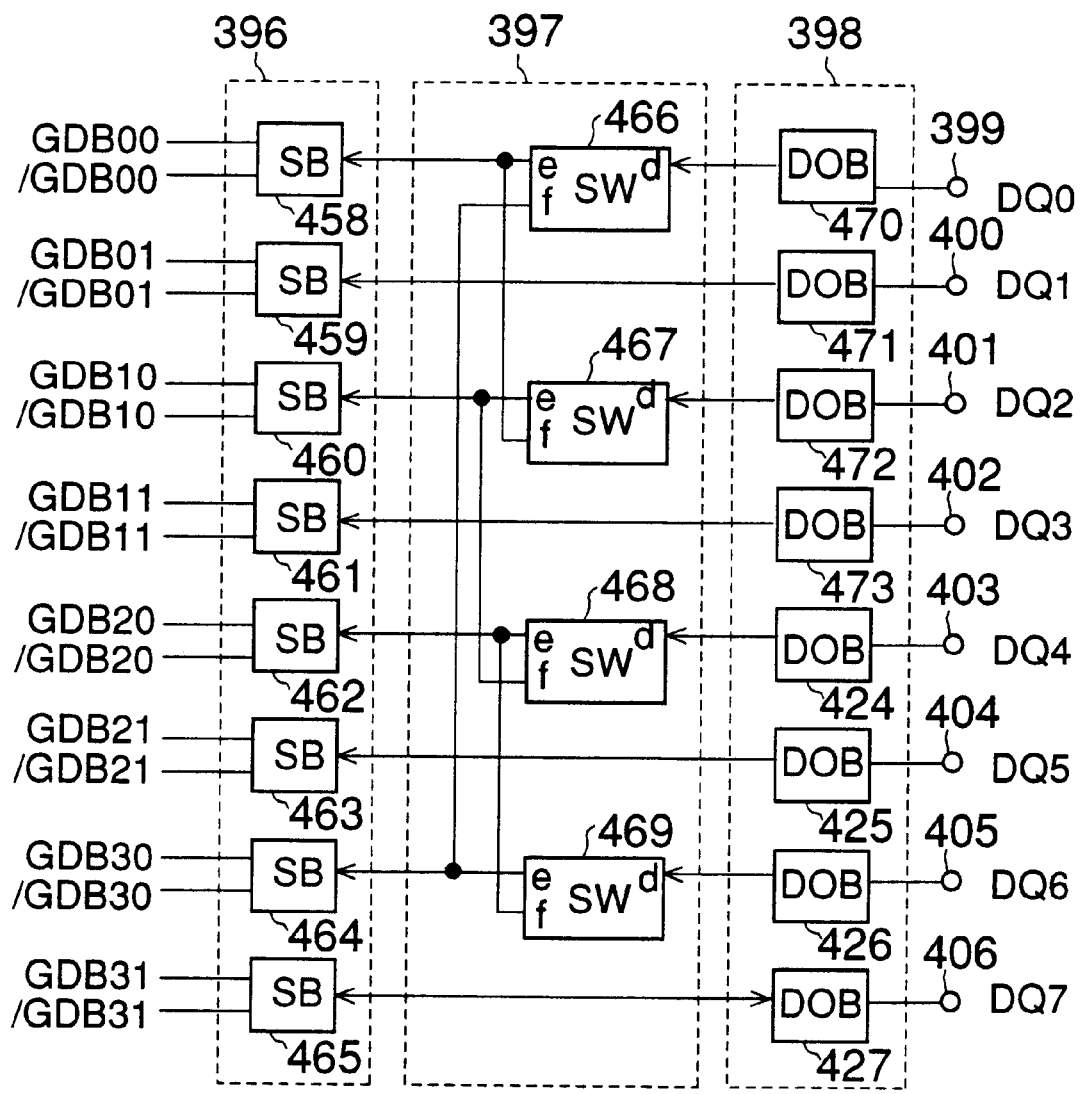
FIG. 30 is a circuit diagram showing a part of FIG. 28 in detail.

FIG. 30 shows the construction of the read/write circuit 396, the data transfer path switching circuit 397 and the input/output circuit 398 for the part related to the data input path.

Figure 11:
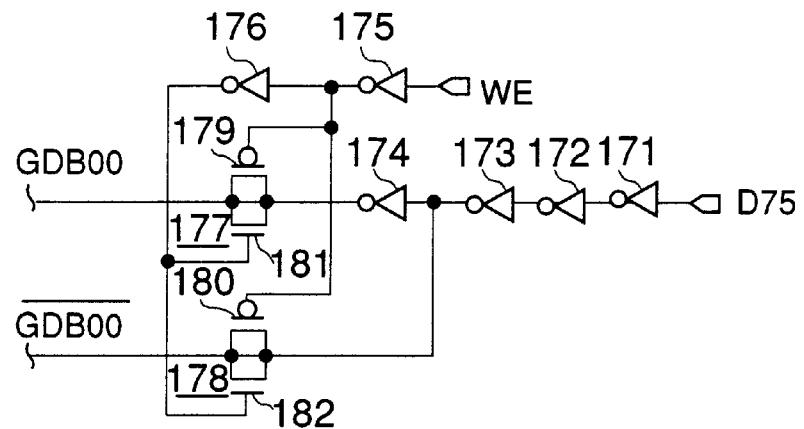
FIG. 11 is a circuit diagram showing the construction of a write amplifier shown in FIG. 1.

Referring to FIG. 30, the read/write circuit 396 includes write amplifiers 458–465 each having a construction identical to the construction of the write amplifier 66 shown in FIG. 1 or 11.

Further, the data transfer path switching circuit 397 includes switch circuits 466–469, while the input/output circuit 398 includes data input buffers 470–477 each having an identical construction to the data input buffer 75 of FIG. 1 or 10.

TABLE V

| SELECTED MEM BLK | DATA AT 399 | DATA AT 400 | DATA AT 401 | DATA AT 402 | DATA AT 403 | DATA AT 404 | DATA AT 405 | DATA AT 406 |
|---|---|---|---|---|---|---|---|---|
| A0-A3 | A0-0 | A0-1 | A1-0 | A1-1 | A2-0 | A2-1 | A3-0 | A3-1 |
| B0-B3 | B0-0 | B0-1 | B1-0 | B1-1 | B2-0 | B2-1 | B3-0 | B3-1 |
| C0-C3 | C0-0 | C0-1 | C1-0 | C1-1 | C2-0 | C2-1 | C3-0 | C3-1 |
| D0-D3 | D0-0 | D0-1 | D1-0 | D1-1 | D1-0 | D2-1 | D2-0 | D3-1 |

On the other hand, the analog switch circuits 430, 437, 444 and 451 are turned OFF while the analog switch circuits 431, 438, 445 and 452 are turned ON.

Thus, the input terminal b and the output terminal c are connected and the input terminal a and the output terminal c are disconnected in the switch circuits 416–419.

As a result, the output terminal of the sense buffer 408 is connected to the input terminal of the data output buffer 426 via the switch circuit 419. Similarly, the output terminal of the sense buffer 410 is connected to the input terminal 420 via the switch circuits 416.

It should be noted that each of the switch circuits 466–469 includes an input terminal d and output terminals e and f, and the input terminal of the data input buffer 470 is connected to the input terminal d of the switch circuit 466. Similarly, the output terminal of the data input buffer 471 is connected to the input terminal of the write amplifier 459.

Further, the input terminal of the data input buffer 472 is connected to the input terminal d of the switch circuit 467, and the output terminal of the data input buffer 473 is connected to the input terminal of the write amplifier 461.

Further, the input terminal of the data input buffer 474 is connected to the input terminal d of the switch circuit 468, and the output terminal of the data input buffer 475 is connected to the input terminal of the write amplifier 463.

Further, the input terminal of the data input buffer 476 is connected to the input terminal d of the switch circuit 469, and the output terminal of the data input buffer 477 is connected to the input terminal of the write amplifier 465.

Further, the output terminal e of the switch circuit 466 is connected to the input terminal of the write amplifier 458, and the output terminal f of the switch circuit 466 is connected to the input terminal of the write amplifier 464.

Further, the output terminal e of the switch circuit 467 is connected to the input terminal of the write amplifier 460, and the output terminal f of the switch circuit 467 is connected to the input terminal of the write amplifier 458.

Further, the output terminal e of the switch circuit 468 is connected to the input terminal of the write amplifier 462, and the output terminal f of the switch circuit 468 is connected to the input terminal of the write amplifier 460.

Further, the output terminal e of the switch circuit 469 is connected to the input terminal of the write amplifier 464, and the output terminal f of the switch circuit 469 is connected to the input terminal of the write amplifier 462.

Figure 31:
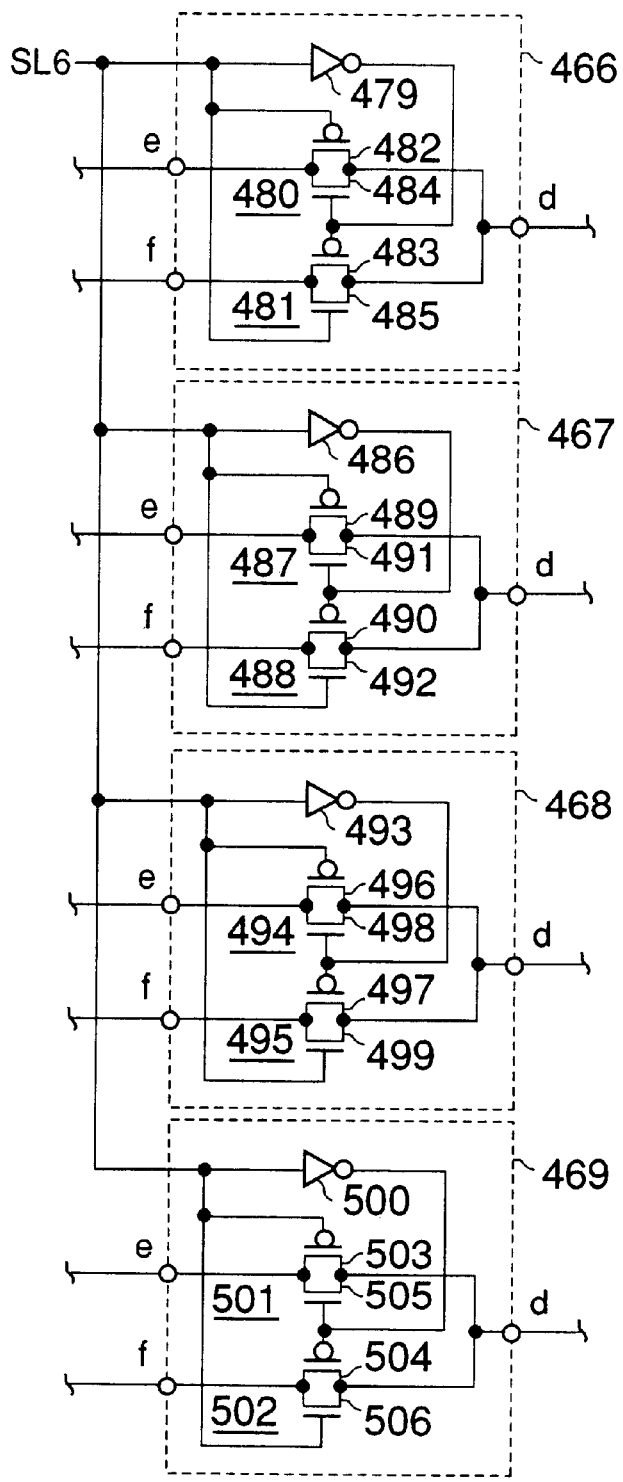
FIG. 31 is a circuit diagram showing a part of FIG. 30 in detail.

FIG. 31 shows the construction of the switch circuits 466–469.

Referring to FIG. 31, it will be noted that the switch circuit 466 includes an inverter 479 and analog switches 480 and 481, wherein the analog switches 480 and 481 includes p-channel MOS transistors 482 and 483 and n-channel MOS transistors 484 and 485.

Similarly, the switch circuit 467 includes an inverter 486 and analog switches 487 and 488, wherein the analog switches 487 and 488 includes p-channel MOS transistors 489 and 490 and n-channel MOS transistors 491 and 492.

Further, the switch circuit 468 includes an inverter 493 and analog switches 494 and 495, wherein the analog switches 494 and 495 includes p-channel MOS transistors 496 and 497 and n-channel MOS transistors 498 and 499.

Further, the switch circuit 469 includes an inverter 500 and analog switches 501 and 502, wherein the analog switches 501 and 502 includes p-channel MOS transistors 503 and 504 and n-channel MOS transistors 505 and 506.

When the foregoing switch control signal SL6 is set to have a low level state, the analog switches 480, 487, 494 and 501 are turned ON, while the analog switches 481, 488, 495 and 502 are turned OFF.

As a result the input terminal d is connected to the output terminal e and the input terminal d is disconnected from the output terminal f in the switch circuits 466–469.

Thus, the output terminal of the data input buffer 470 is connected to the input terminal of the write amplifier 458 via the switch circuit 466, and the output terminal of the data input buffer 472 is connected to the input terminal of the write amplifier 460 via the switch circuit 467.

Similarly, the output terminal of the data input buffer 474 is connected to the input terminal of the write amplifier 462 via the switch circuit 468, and the output terminal of the data input buffer 476 is connected to the input terminal of the write amplifier 464 via the switch circuit 469.

Thus, there holds a relationship represented in TABLE VII below between the input data DQ0–DQ7 on the input/output terminals 399–406 and the memory cell columns into which the foregoing input data DQ0–DQ7 are written, when the foregoing switch control signal SL6 is set to have a low level state irrespective of the selected memory block in the write mode operation of the DRAM.

TABLE VII

| SELECTED | INPUT DATA | | | | | | | |
|---|---|---|---|---|---|---|---|---|
| MEM ELK | DQ0 | DQ1 | DQ2 | DQ3 | DQ4 | DQ5 | DQ6 | DQ7 |
| A0-A3 | A0 odd | A0 even | A1 odd | A1 even | A2 odd | A2 even | A3 odd | A3 even |
| B0-B3 | B0 odd | B0 even | B1 odd | B1 even | B2 odd | 82 even | B3 odd | B3 even |
| C0-C3 | C0 odd | C0 even | C1 odd | C1 even | C2 odd | C2 even | C3 odd | C3 even |
| D0-D3 | D3 odd | D0 even | D0 odd | D1 even | D1 odd | D2 even | D2 odd | D3 even |

On the other hand, when the foregoing switch control signal SL6 is set to have a high level state, the analog switch circuits 480, 487, 494 and 501 are turned OFF while the analog switch circuits 481, 488, 495 and 502 are turned ON.

As a result, the input terminal d is connected to the output terminal f and the input terminal d is disconnected from the output terminal e in the switch circuits 466–469.

Thus, the output terminal of the data input buffer 470 is connected to the input terminal of the write amplifier 464 via the switch circuit 466, and the output terminal of the data input buffer 472 is connected to the input terminal of the write amplifier 458 via the switch circuit 467.

Further, the output terminal of the data input buffer 474 is connected to the input terminal of the write amplifier 460 via the switch circuit 468, and the output terminal of the data input buffer 476 is connected to the input terminal of the write amplifier 462 via the switch circuit 469.

Thus, there holds a relationship represented in TABLE VIII below between the input data DQ0–DQ7 on the input terminals 399–406 and the memory cell columns into which the input data DQ0–DQ7 are written, by setting the switch control signal SL6 to have a low level state when the memory blocks are selected from the memory blocks A0–A3, B0–B3 and C0–C3, or by setting the switch control signal SL6 to have a high level state when the memory blocks D0–D3 are selected.

TABLE VIII

| SELECTED MEM ELK | INPUT DATA | | | | | | | |
|---|---|---|---|---|---|---|---|---|
| | DQ0 | DQ1 | DQ2 | DQ3 | DQ4 | DQ5 | DQ6 | DQ7 |
| A0-A3 | A0 odd | A0 even | A1 odd | A1 even | A2 odd | A2 even | A3 odd | A3 even |
| B0-B3 | B0 odd | B0 even | B1 odd | B1 even | B2 odd | B2 even | B3 odd | B3 even |
| C0-C3 | C0 odd | C0 even | C1 odd | C1 even | C2 odd | C2 even | C3 odd | C3 even |
| D0-D3 | D0 odd | D0 even | D1 odd | D1 even | D2 odd | D2 even | D3 odd | D3 even |

Thus, it is possible to write, when selecting the memory blocks Y0–Y3, the input data DQ0, DQ1, DQ2, DQ3, DQ4, DQ5, DQ6 and DQ7 on the input/output terminals 399, 400, 401, 402, 403, 404, 405 and 406 respectively into an odd number memory cell column of the memory block Y0, an even number memory cell column of the memory block Y0, an odd number memory cell column of the memory block Y1, an even number memory cell column of the memory block Y1, an odd number memory cell column of the memory block Y2, an even number memory cell column of the memory block Y2, an odd number memory cell column of the memory block Y3 and an even number memory cell column of the memory block Y3, by setting the switch control signal SL6 to have a low level state when the memory blocks Y0–Y3 are selected from the memory blocks A0–A3, B0–B3 and C0–C3, and further by setting the switch control signal SL6 to have a high level state when the memory blocks D0–D3 are selected for the memory blocks Y0–Y3.

Thus according to the sixth embodiment of the present invention in which the data transfer path switching circuit 397 is provided between the read/write circuit 396 and the input/output circuit 398, it is possible to physically correlate the input/output terminals 399–406 with respective, corresponding memory cell columns of the memory blocks A0–A3, B0–B3, C0–C3 and D0–D3, by setting the switch control signal SL6 to have a low level state when the memory blocks are selected from the memory blocks A0–A3, B0–B3, C0–C3 and D0–D3 or by setting the switch control signal SL6 to have a high level state when selecting the memory blocks D0–D3. Thereby, the input/output terminals 399–406 correspond to the physical location of the memory cell columns in the selected memory blocks, and one can conduct an interference test of memory cells without using a switching software or using complicated circuitry for the hierarchical bus switches, or without increasing the chip area.

In the first through sixth embodiments described heretofore, local data bus and global data bus are used for both reading and writing of data. However, it should be noted that the present invention is applicable also to the case in which local data bus and global data bus are provided explicitly for reading and explicitly for writing. Alternatively, it is possible to provide a local data bus explicitly for reading and another local data bus explicitly for writing, while using a global data bus for both reading and writing of data.

Further, it should be noted that the switch control signal is not limited to the signals SL1, SL2, /SL3A, SL3A, /SL3B, SL3B, SL4, /SL5A, SL5A, /SL5B, SL5B or SL6 described heretofore, but one may use an address signal or a signal derived from such an address signal including a block address signal, row address signal, column address signal, a decode signal of these address signals, or a bit line transfer signal BT.

The major advantage of using these signals for the switch control signal is that one can avoid the delay in the access time of the DRAM caused by the activation of the data transfer path switching circuit. By using the /RAS signal for the switch control signal, for example, it takes sometime until the /CAS signal goes low after the /RAS signal went low, and one can use this interval for the activation of the data transfer path switching circuit, without increasing the access time of the DRAM.

Further, the present invention is not limited to the embodiments described heretofore, but various variations and modifications may be made without departing from the scope of the invention.

What is claimed is:

1. A semiconductor memory device, comprising:

a core area including a plurality of memory blocks;

a data bus including a plurality of data bus lines such that each of said plurality of data bus lines corresponds to one of said plurality of memory blocks, each of said data bus lines carrying a data bit to be written into or read out from a memory cell included in a memory block that corresponds to said data bus line;

a plurality of input/output terminals provided in number corresponding to said plurality of data bus lines forming said data bus; and a data path switch circuit provided between said data bus lines and said input/output terminals for providing interconnection paths of said data bits between said input/output terminals and said data bus lines, wherein said data path switch circuit switches a part of said interconnection paths in response to a block address signal selecting a memory block from said plurality of memory blocks, said data path switch circuit changing a switching operation thereof between an ordinary operational mode and test operational mode.

2. A semiconductor memory device as claimed in claim 1, wherein each of said plurality of memory blocks forming together said core area is defined by first and second, mutually opposing boundaries both extending in a first direction and includes a plurality of bit lines extending parallel with each other in a second direction perpendicular to said first direction, a plurality of said memory cells being connected to each of said bit lines, said plurality of memory blocks being repeated a plurality of times in said core area in said second direction, such that a second boundary of a memory block faces a first boundary of an adjacent memory block, wherein said core area includes sense amplifiers in the form of sense amplifier columns in which a plurality of said sense amplifiers are aligned in said first direction in each of said sense amplifier columns, each of said memory blocks being provided with a sense amplifier column adjacent to said first boundary and further with a sense amplifier column adjacent to said second boundary, one of said sense amplifier columns adjacent to said first boundary of a first memory block including a plurality of sense amplifiers connected to odd bit lines of said first memory block, one of said sense amplifier columns adjacent to said second boundary of said first memory block and further adjacent to said first boundary of a second, adjacent memory block, including a plurality of sense amplifiers connected to even bit lines of said first memory block and further to even bit lines of said second memory blocks, one of said sense amplifier columns adjacent to said second boundary of said second memory block including a plurality of sense amplifiers connected to odd bit lines of said second memory block, each of said sense amplifier columns including a local data bus extending in said first direction and connected to a corresponding data bus via a switch circuit.

3. A semiconductor memory device as claimed in claim 1, further including a read/write block and an input/output block, said read/write block including: a plurality of reading circuits corresponding respectively to said plurality of data bus lines, said plurality of reading circuits reading data transmitted thereto along said data bus lines; and a plurality of writing circuits corresponding respectively to said plurality of data bus lines, said plurality of writing circuits writing data supplied thereto, into corresponding memory cells along said data bus lines, said input/output block including: a plurality of output buffer circuits corresponding respectively to said plurality of data bus lines; and a plurality of input buffer circuits corresponding respectively to said plurality of data bus lines, said plurality of output buffer circuits being further in electrical connection respectively with said plurality of input/output terminals and forwarding outputs of said read/write block, produced by said plurality of reading circuits, to corresponding input/output terminals, said plurality of input buffer circuits being further in electrical connection respectively with said plurality of input/output terminals and forwarding write data supplied to said plurality of input/output terminals to said read/write block, wherein said data path switch circuit is provided between said read circuit block and said input/output block.

4. A semiconductor memory device as claimed in claim 3, wherein said data path switch circuit includes a switch for supplying an output of a reading circuit included in said plurality of reading circuits selectively to a first output buffer circuit and a second output buffer circuit both included in said plurality of output buffer circuits in response to the control signal supplied to said switch.

5. A semiconductor memory device as claimed in claim 3, wherein said data path switch circuit includes a switch for supplying an output of an input buffer circuit included in said plurality of input buffer circuits selectively to a first writing circuit and a second writing circuit both included in said plurality of writing circuits in response to the control signal supplied to said switch.

6. A semiconductor memory device as claimed in claim 3, wherein said data path switch circuit includes a first switch for supplying an output of a first reading circuit included in said plurality of reading circuits, selectively to one of a first output buffer circuit and a second output buffer circuit of said plurality of output buffer circuits in response to the control signal, and wherein said data path switch circuit further includes a second switch for supplying an output of a second reading circuit included in said plurality of reading circuits, selectively to another of said first output buffer circuit and said second output buffer circuit to which said output of said first reading circuit is supplied via said first switch, in response to the control signal.

7. A semiconductor memory device as claimed in claim 3, wherein said data path switch circuit includes a first switch for supplying an output of a first input buffer circuit included in said plurality of input buffer circuits, selectively to one of a first writing circuit and a second writing circuit of said plurality of writing circuits in response to the control signal, and wherein said data path switch circuit further includes a second switch for supplying an output of a second input buffer circuit included in said plurality of input buffer circuits, selectively to another of said first writing circuit and said second writing circuit to which said output of said first input buffer circuit is supplied via said first switch, in response to the control signal.

8. A semiconductor memory device as claimed in claim 6, wherein said data path switch circuit further includes a third switch for supplying an output of a first input buffer circuit included in said plurality of input buffer circuits, selectively to one of a first writing circuit and a second writing circuit of said plurality of writing circuits in response to the control signal, and wherein said data path switch circuit further includes a fourth switch for supplying an output of a second input buffer circuit included in said plurality of input buffer circuits, selectively to another of said first writing circuit and said second writing buffer circuit to which said output of said first input buffer circuit is supplied via said third switch, in response to said control signal, said first output buffer circuit and said first input buffer circuit being connected commonly to a first input/output terminal included in said plurality of input/output terminals, said first reading circuit and said second writing circuit being connected commonly to a first data bus line included in said plurality of bus lines, said second output buffer circuit and said second input buffer circuit being connected commonly to a second input/output terminal included in said plurality of input/output terminals, said second reading circuit and said second writing circuit being connected commonly to a second data bus line included in said plurality of bus lines.

9. A semiconductor memory device as claimed in claim 3, wherein a first reading circuit included in said plurality of reading circuits forms a part of said data path switch circuit, such that said first reading circuit supplies an output thereof selectively to one of a first output buffer circuit and a second output buffer circuit of said plurality of output buffer circuits, and wherein a second reading circuit included in said plurality of reading circuits forms a part of said data path switch circuit, such that said second reading circuit supplies an output thereof selectively to another of said first output buffer circuit and second output buffer circuit to which said output of said first reading circuit is supplied.

10. A semiconductor memory device as claimed in claim 3, wherein a first writing circuit included in said plurality of writing circuits forms a part of said data path switch circuit, such that said first writing circuit receives an input selectively from one of a first input buffer circuit and a second input buffer circuit both included in said plurality of input buffer circuits, and wherein a second writing circuit included in said plurality of writing circuits forms a part of said data path switch circuit, such that said second writing circuit receives an input selectively from the other of said first input buffer circuit and second input buffer circuit from which said first writing circuit receives said input.

11. A semiconductor memory device as claimed in claim 3, wherein a first input buffer circuit included in said plurality of input buffer circuits forms a part of said data path switch circuit, such that said first input buffer circuit supplies an output thereof selectively to one of a first writing circuit and a second writing circuit of said plurality of writing circuits, and wherein a second input buffer circuit included in said plurality of input buffer circuits forms a part of said data path switch circuit, such that said second input buffer circuit supplies an output thereof selectively to another of said first writing circuit and second writing circuit to which said output of said first input buffer circuit is supplied.

12. A semiconductor memory device as claimed in claim 3, wherein a first output buffer circuit included in said plurality of output buffer circuits forms a part of said data path switch circuit, such that said first output buffer circuit receives an input selectively from one of a first reading circuit and a second reading circuit of said plurality of reading circuits, and wherein a second output buffer circuit included in said plurality of output buffer circuits forms a part of said data path switch circuit, such that said second output buffer circuit receives an input selectively from another of said first reading circuit and second reading circuit of which output is supplied to said first output buffer circuit.

13. A semiconductor memory device as claimed in claim 1, wherein said data path switching circuit is provided in said data bus, said data path switching circuit cross connecting said plurality of data bus lines.

14. A semiconductor memory device as claimed in claim 1, wherein said switch control signal comprises an address signal.

15. A semiconductor memory device as claimed in claim 1, wherein said switch control signal comprises a signal derived from an address signal.

* * * * *